(12) United States Patent
Kawakubo et al.

(10) Patent No.: US 6,198,652 B1
(45) Date of Patent: Mar. 6, 2001

(54) NON-VOLATILE SEMICONDUCTOR INTEGRATED MEMORY DEVICE

(75) Inventors: Takashi Kawakubo, Yokohama; Kazuhide Abe, Kawasaki; Daisaburo Takashima, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/289,940

(22) Filed: Apr. 13, 1999

(30) Foreign Application Priority Data

Apr. 13, 1998 (JP) .................................................. 10-101490
Sep. 14, 1998 (JP) .................................................. 10-259972

(51) Int. Cl.⁷ .................................................. G11C 11/22
(52) U.S. Cl. .......................... 365/145; 365/149; 257/295
(58) Field of Search .......................... 365/145, 149, 365/65, 117; 257/295, 300

(56) References Cited

U.S. PATENT DOCUMENTS

| | | | |
|---|---|---|---|
| 5,523,964 | * 6/1996 | McMillan et al. | ................... 365/145 |
| 5,559,733 | * 9/1996 | McMillan et al. | ................... 365/145 |
| 5,689,456 | * 11/1997 | Kobayashi | ........................... 365/145 |
| 5,886,920 | * 3/1999 | Marshall et al. | ..................... 365/145 |
| 5,912,835 | * 6/1999 | Katoh | .................................. 365/145 |

\* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor integrated memory device comprises a plurality of memory cell blocks, which are formed in the form of a matrix and each of which comprises: a memory cell chain including a plurality of units, each comprising a ferroelectric memory capacitor and a control transistor connected in parallel thereto; a reference capacitor of a unit comprising a reference capacitor and a control transistor connected in parallel thereto; a read transistor having a gate electrode connected to a connection point between the memory cell chain and the reference cell; and a control transistor for adjusting potentials of storage node which is a connection point of the first electrode of the memory capacitor, the third electrode of the reference capacitor and the read transistor. With this construction, the semiconductor integrated memory device is able to be easily produced, to stably retain a ferroelectric polarization and to scale down.

17 Claims, 47 Drawing Sheets

SCALEABLE NAND FeRAM

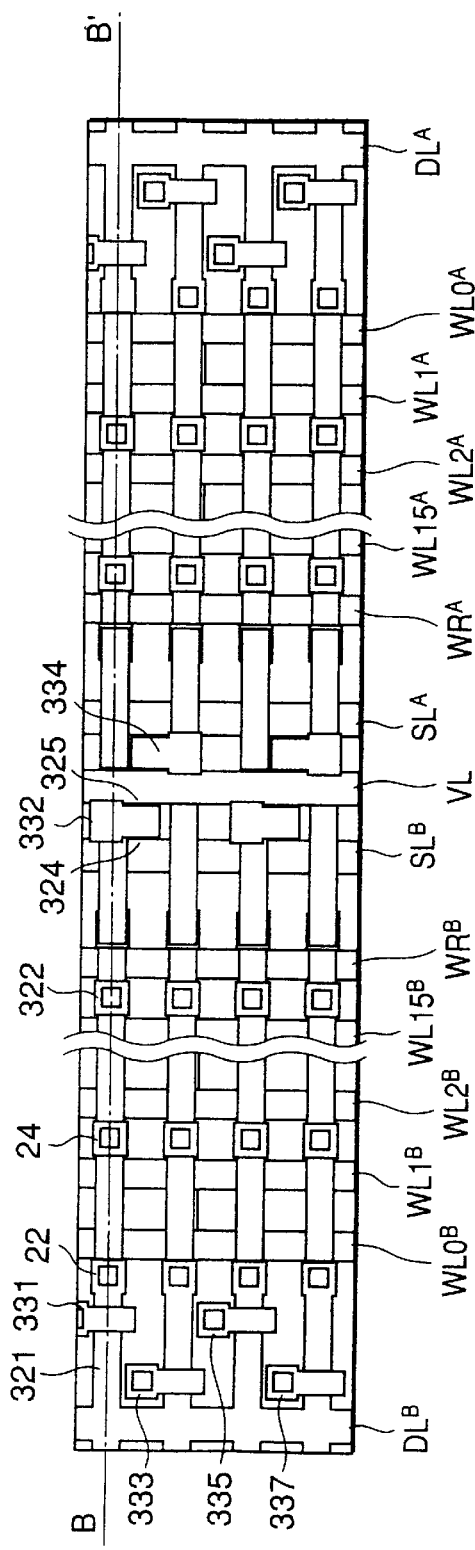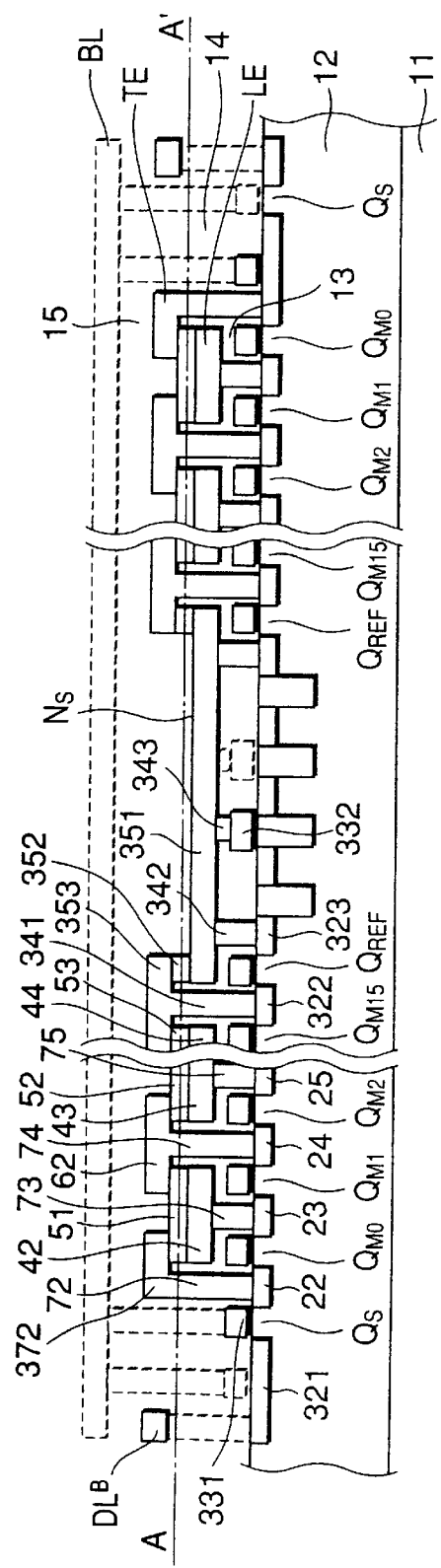
FIG. 27A
FIG. 27B

NON-VOLATILE SEMICONDUCTOR INTEGRATED MEMORY DEVICE

BACKGROUND OF THE INVENTION

The present invention relates generally to a semiconductor integrated memory device capable of storing therein a very large capacity data of gigabits or more. More specifically, the invention relates to a non-volatile semiconductor integrated memory device having a thin-film capacitor of a ferroelectric thin-film.

As it is required to increase the integrated density of a semiconductor integrated memory device to store a very large capacity data of gigabits or more, the memory cell size is still less, so that the capacities of conventional storage capacitors using oxide films are insufficient. Therefore, in recent years, memory devices using ferroelectric thin-films as storage capacitors (which will be hereinafter referred to as "ferroelectric memories") have been actively studied and developed, and a part of such memory devices have been put into practical use. The ferroelectric memory is non-volatile, and does not lose stored information even after a power source is turned off. In addition, if the thin-film of the ferroelectric memory is sufficiently thin, the spontaneous polarization thereof is quickly turned round, so that data can be written in and read out of the ferroelectric memory at a high speed which is substantially the same as that of a DRAM.

At present, the ferroelectric memories are classified broadly into two categories, first and second ferroelectric memories, which will be described below, on the basis of the use form of the ferroelectric thin-films.

The first ferroelectric memory uses a ferroelectric thin-film as a ferroelectric capacitor of a metal/ferroelectric/metal junction, and has a system for reading a charge when the polarization of the ferroelectric capacitor is turned round. The first ferroelectric memory has advantages in that it can be relatively easy to prepare the first ferroelectric memory since a ferroelectric capacitor is separately prepared, that the polarization of the first ferroelectric capacitor is easily retained since the potentials of both electrodes of the ferroelectric capacitor are equal to each other in a stand-by state, and that assuming that the minimum processed dimension is F, the area of one cell-to-one transistor (1T/1C) type cell similar to a DRAM is $8F^2$, and the area of a NAND type cell or a 1T/1C parallel-connected cell (Chain FRAM) is $4F^2$, so that the area of the memory cell can be decreased. Herein, the minimum processed dimension is 2F=L+S, assuming that the minimum line width and minimum space width of a pattern forming a semiconductor integrated memory device are L and S, respectively.

The second ferroelectric memory uses a ferroelectric thin-film as a ferroelectric gate transistor. This has a structure which uses a ferroelectric thin-film as a gate insulator film in place of a gate oxide film of a MOS-FET. The second ferroelectric memory is also called an "MFS (metal/ferroelectric/semiconductor)-FET". Since carriers sufficient to compensate the polarized charge of the ferroelectric thin-film are induced in the surface of the semiconductor, an inversion layer and an accumulation layer are formed in the polarized direction of the capacitor, so that the switching state of the transistor can be retained.

A particular excellent advantage of this device is that the polarized charge is not directly read out, and it can be amplified as a gain cell to be read out. Therefore, it is not required to retain storage using the absolute value of the polarized charge, and scaling can be achieved by a minimum dimension f if only the polarization density can be retained. Herein, the "minimum dimension f" means a so-called feature size, and it is generally given by L=S=f, or L=f, S=1.5f.

The aforementioned first ferroelectric memory using the ferroelectric thin-film as the ferroelectric capacitor has a disadvantage in that the amount of remnant polarization of the ferroelectric capacitor must be more than or equal to a certain absolute amount, so that scaling is difficult to be achieved by the minimum dimension f. The present reading using a ferroelectric capacitor is carried out by introducing the inverted charges of the capacitor into bit line capacities to carry out sense as the potential difference between bit lines. With scale down, the area of the capacitor and the amount of the inverted charge are decreased by $F^2$, whereas the bit line capacity is substantially difficult to decrease, so that there is a limit to scaling.

On the other hand, the aforementioned second ferroelectric memory using the MFS-FET has many disadvantages. First, it is difficult to deposit a ferroelectric thin-film directly on Si. Because it is not easy to deposit an oxide ferroelectric thin-film, such as PZT (lead zirconate titanate: $PbZr_xTi_{1-x}O_3$), SBT (strontium bismuth tantalate: $SrBi_2Ta_2O_9$) and BSTO (barium strontium titanate: $Ba_xSr_{1-x}TiO_3$), on Si, which is easy to oxidize, while maintaining the good crystallinity thereof. Also, although because there is a problem in that the majority of a voltage to be applied to the gate electrode of the MSF-FET is applied to a little $SiO_2$ layer, which is produced in the interface between a ferroelectric thin-film and Si when the ferroelectric thin-film is deposited on Si, to increase the operating voltage, since the dielectric constant of the $SiO_2$ layer is far less than that of the ferroelectric thin-film even if the $SiO_2$ layer is thin, about a few nanometers. Moreover, because the interface level existing in the Si/ferroelectric interface, or the impurity level of the heavy metal in the ferroelectric diffusing in Si, serves as a trap of a channel of the MFS-FET to decrease the mobility of carriers and to vary the threshold voltage of the MFS-FET in accordance with the interface level density and the impurity level density, unlike an ideal $Si/SiO_2$ interface. These problems are very important problems to be solved for high density integrated LSIs.

As a second disadvantage, there is a problem on a counter field applied to the ferroelectric thin-film. That is, the charge produced by the polarization of the ferroelectric is ideally equal to the charge induced on the Si surface, so that an accumulation layer and a depletion layer or an inversion layer are produced in a direction of polarization. At this time, the shifted part of the surface potential of Si is applied to the ferroelectric thin-film as a counter field. This counter field is applied in a direction in which the polarization is inverted, so that it is difficult to stably retain the polarization of the MFS-FET.

As a third disadvantage, there is a problem in that the memory cell size increases. When memory cells of MFS-FET are arranged in the form of a matrix to form a semiconductor integrated memory device, it is usually required to provide a write controlling transistor and a read controlling transistor in addition to an MFS-FET for retaining information therein. That is, in the case of the MFS-FET, a memory cell comprises three transistors (3T), and the area of the cell is greater than $18F^2$, so that the memory cell size is greater than that of the ferroelectric memory cell which uses a ferroelectric thin-film as a ferroelectric capacitor.

As described above, either of the ferroelectric capacitor of the first memory or the MFS-FET of the second memory has its merits and demerits, so that it is not possible to meet all of the demands that a high density integrated semiconductor is able to have small memory cells, be scaled, stably retain the polarization of the ferroelectric and be easily produced by a simple process.

SUMMARY OF THE INVENTION

It is therefore an object of the present invention to eliminate the aforementioned problems and to provide a semiconductor integrated memory device which has small memory cells and which uses a ferroelectric thin-film capable of stably retaining the polarization of the ferroelectric.

It is another object of the present invention to provide a semiconductor integrated memory device which can achieve scaling serving as a merit of an MFS-FET and which uses a ferroelectric thin-film capable of being more highly integrated.

It is a further object of the present invention to provide a semiconductor integrated memory device which can be easily produced by a simple process and which uses a ferroelectric thin-film.

In order to accomplish the aforementioned and other objects, according to a first aspect of the present invention, a semiconductor integrated memory device comprising a plurality of memory cells, which are arranged in the form of a matrix and each of which comprises: a memory capacitor having at least a first electrode, a second electrode facing the first electrode, and a ferroelectric thin-film sandwiched between the first and second electrodes; a reference capacitor having at least a third electrode connected to the first electrode of the memory capacitor, a fourth electrode facing the third electrode, and a dielectric thin-film sandwiched between the third and fourth electrodes; a read transistor having a gate electrode connected to the first electrode of the memory capacitor and third electrode of the reference capacitor; and a control transistor for adjusting potentials of storage node which is a connection point of the first electrode of the memory capacitor, the third electrode of the reference capacitor and the gate electrode of the read transistor. That is, according to the first aspect, the semiconductor integrated memory device comprises a plurality of memory cells, which are arranged in the form of a matrix and which has at least a memory capacitor, a reference capacitor, a read transistor and a control transistor.

Throughout the specification, all of nodes serving as connection points between the first electrode of the memory capacitor, the third electrode of the reference capacitor, and the gate electrode of the read transistor will be referred to as "storage nodes". When an external voltage $V_A$ is applied to both ends of the series circuit of the memory capacitor and the reference capacitor, the potential $V_G$ of the storage node is shown by the intersection between the polarization-voltage curves (P-V curves) of the memory capacitor and the reference capacitor. Since the memory capacitor having a ferroelectric thin-film has a ferroelectric hysteresis curve, it can be previously set to be a polarization state corresponding to a memory of "1" or "0" before a read operation. The P-V curve of the memory capacitor varies in accordance with the previously set polarization state, so that the $V_G$ shown by the intersection between the P-V curves can have different two values. If the ON/OFF control of the read transistor is carried out by the different $V_G$ values, a signal corresponding to a memory state of "1" or "0" can be outputted to a read signal line.

The control transistor is preferably connected to between the first and second electrodes of the memory capacitor. That is, if the control transistor is connected to the memory capacitor in parallel, the floating/short state of the storage node can be quickly switched between the write and stand-by states to increase the operating speed. During read, the memory capacitor is short-circuited by the control transistor, and a voltage is applied only to the reference capacitor to pre-charge the reference capacitor. Then, the control transistor is turned off, and a low reverse voltage is applied to between the first and second electrodes of the memory capacitor to allow a pre-charge combining read system for inverting the polarization state. Throughout the specification, the unit comprising the memory capacitor and the control capacitor connected to the memory capacitor in parallel will be referred to as a "memory cell".

The control transistor is preferably connected to between the third and fourth electrodes of the reference capacitor. If the reference capacitor is connected to the control transistor in parallel, the floating/short state of the storage node can be quickly changed between the write and stand-by states to increase the operating speed. During write, the third and fourth electrodes of the reference capacitor are short-circuited by the control transistor to apply a voltage only to the memory capacitor to allow a low write voltage. Throughout the specification, the unit comprising the reference capacitor and the control transistor connected to the reference capacitor in parallel will be referred to as a "reference cell".

Preferably, a first control transistor is connected to between the first and second electrodes of the memory capacitor, and a second control transistor is connected to between the third and fourth electrodes of the reference capacitor. During read, the first control transistor is turned on to short-circuit the memory capacitor, and the second control transistor is turned off to apply a voltage only to the reference capacitor to pre-charge the reference capacitor. On the other hand, during write, the second control transistor is turned on to short-circuit the third and fourth electrodes of the reference capacitor by the second control transistor, and the first control transistor is turned off to apply a voltage only to the memory capacitor to allow write at a low voltage. In addition, if the first and second control transistors are provided, the floating/short state of the storage node can be quickly changed between the write/read and stand-by states to increase the operating speed.

According to the first aspect of the present invention, it is possible to provide a high density integrated semiconductor memory device which is easily produced and scaleable and which has small memory cells. In particular, with respect to scale down, all of the memory capacitor, the reference capacitor, and the gate capacitors of the control transistor (first/second control transistors) and read transistor are proportionally reduced, so that it is possible to achieve a complete scaling similar to the MFS-FET.

According to a second aspect of the present invention, a semiconductor integrated memory device comprises a plurality of memory cell blocks, which are formed in the form of a matrix and each of which comprises: a memory cell column (a memory cell chain) having a plurality of memory cells connected in series, each memory cell comprising a memory capacitor, which has at least a first electrode, a second electrode facing the first electrode, and a ferroelectric thin-film sandwiched between the first and second electrodes, and a control transistor connected to between the first and second electrodes; a reference capacitor having at least a third electrode, which electrically connected to the first electrode of the memory capacitor arranged at one end of the memory cell column (the memory cell chain), a fourth electrode facing the third electrode, and a dielectric thin-film sandwiched between the third and fourth electrodes; and a read transistor having a gate electrode electrically connected to the first and third electrodes. The expression "electrically connected" means that the short-circuited memory capacitor and memory cell column (memory cell chain) may be provided in a circuit, in addition to the direct connection. In order to random-access the memory cell column (memory cell chain), the block selecting transistor may be connected to each of the memory cell columns.

Assuming that the memory cell column comprises n memory cells connected in series, if the area of one block including the block selecting transistor, the read transistor and the reference transistor is considered, the minimum size of the memory cell unit is $4F^2$, so that the dimension of one memory cell can be in the range of from about $(4+20/n)F^2$ through $(4+14/n)F^2$ to achieve high integration. Moreover, it is possible to provide a high density integrated semiconductor memory device which is easily produced and scaleable in accordance with the patterned dimension. In particular, with respect to scale down, all of the memory capacitor, the reference capacitor, the control transistor and the read transistor are proportionally reduced, so that it is possible to achieve a complete scaling similar to the MFS-FET. In order to select a specific memory capacitor in the memory cell column, the control transistor connected to another memory capacitor in parallel may be turned on, and only the control transistor connected to the specific memory capacitor in parallel is set to be turned off. In this case, if a memory capacitor far from the reference capacitor in the memory cell column is selected, the parasitic capacity of the control transistor of the memory cell arranged between the reference capacitor and the selected memory capacitor is added to the capacity of the reference capacitor, so that there are some cases where it has an influence on the read operation of the stored information. This problem can be solved by adjusting the capacity of the memory cell at each position so as to approach the sum of the capacity of the reference capacitor and the parasitic capacity of the control transistor. Specifically, the amount of remnant polarization of the memory capacitor of a memory cell far from the reference capacitor may be adjusted so as to gradually increase from the amount of remnant polarization of the memory capacitor of a memory cell near the reference capacity.

The control transistor connected to the memory capacitor in parallel will be referred to as a "first control transistor", and a second control transistor is preferably connected to between the third and fourth electrodes of the reference capacitor. If the reference cell having the second control transistor connected to the reference capacitor in parallel is referred, the floating/short state of the storage node can be quickly changed between the write and stand-by states to increase the operating speed. During write, the third and fourth electrodes of the reference capacitor are short-circuited by the second control transistor to apply a voltage only to the memory capacitor to allow a low write voltage.

Furthermore, in the first and second aspects of the present invention, the amount of charges, which include a polarization inverting component obtained when a voltage corresponding to a read voltage is applied to the reference capacitor, is preferably greater than or equal to one-fourth and less than or equal to four times as large as the amount of charges, which include a polarization inverting component obtained when a voltage corresponding to the read voltage is applied to the memory capacitor. In particular, if the effective capacity of the ferroelectric memory capacitor is substantially equal to that of the reference capacitor, the ferroelectric capacitor can be inverted at an operating voltage of 2VC assuming that the inverted voltage of the ferroelectric capacitor is VC. In addition, since a voltage difference of about VC can be produced at the storage node in accordance with the original polarization state of the ferroelectric capacitor, the read transistor can be switched directly by the potential of the storage node.

Moreover, in the first and second aspects of the present invention, the dielectric thin-film of the reference capacitor may be a paraelectric thin-film or a ferroelectric thin-film. If the reference capacitor is formed of a ferroelectric thin-film, the memory capacitor and the reference capacitor can be formed in the same process, so that there are great merits in that it is possible to simplify the process and to improve the producing yield.

According to the first and second aspects of the present invention, the semiconductor integrated memory device has the following advantages in comparison with existing DRAMs and FeRAMs.

(1) The minimum size of a memory cell unit is $4F^2$.
(2) The absolute value of the storage charge is not required, and scaling to reduce the area can be carried out.
(3) The device is stable since the ferroelectric capacitor can be retained at the equipotential during stand-by.
(4) The leak of the capacitor is not sensitive to the bonding leak of the transistor, and the cells can be easily isolated,
(5) Random access can be achieved.
(6) The operating speed is substantially equal to that of a DRAM.
(7) Only the cell at the cross point is read/written (R/W), electric power consumption is low.
(8) The device is not sensitive to noises since read is carried out in the bus level.
(9) The scaling rule can apply even to soft errors in the bit line mode, so that there is no problem in the soft errors.
(10) Since the read amplifier is provided in the block, it is not required to provide a sense amplifier for each bit line.

According to a third aspect of the present invention, a semiconductor integrated memory device comprises a plurality of memory cell blocks, which are formed in the form of a matrix and each of which comprises: a NAND type memory cell column comprising a plurality of selecting MOS transistors connected in series, and a plurality of memory capacitors of dielectric films, each of which is sandwiched between a storage electrode connected to a common main electrode of each of the selecting MOS transistors, and a plate electrode facing the storage electrode; a reference capacitor electrically connected to a main electrode of the selecting transistor arranged at one end of the memory cell column; and a read transistor having a gate electrode electrically connected to a connection part between the main electrode of the selecting MOS transistor and the main electrode of the reference capacitor.

According to the third aspect of the present invention, the NAND type memory cell column using the dielectric capacitor is connected to the reference capacitor in series, and the potential of the storage node serving as the connection point therebetween is applied to the gate electrode of the read transistor to read each of the memory cell blocks. That is, when an external voltage VA is applied to both ends of the series circuit of one memory capacitor, which is selected by the transistor in the NAND cell column, and the reference capacitor, the potential VG of the storage node is shown by the intersection between the polarization-voltage curves (P-V curves) of the memory capacitor and the reference capacitor.

Since the memory capacitors having the ferroelectric thin-film have a common hysteresis curve, the memory capacitors can be previously set to be in a polarization state corresponding to a memory of "1" or "0" before a read operation. The P-V curve of the memory capacitor varies in accordance with the previously set polarization state, so that the values of VG shown by the intersection between the P-V curves can be different two values. If the ON/OFF control of the read transistor is carried out by the different VG values, a signal corresponding to the memory state of "1" or "0" can be outputted to a read signal line.

On the other hand, in the case of the memory capacitor having the paraelectric thin-film, if the charge corresponding to the memory of "1" or "0" is stored in the memory capacitor to turn the selecting transistor off, the stored state can be retained in a refresh cycle. If the selecting transistor is turned on during read to connect the memory capacitor to the reference capacitor, the values of the storage node VG can be different two values in accordance with the amount of the previously stored charges of the memory capacitor. If the ON/OFF control of the read transistor is carried out by the different VG values, a signal corresponding to the stored state of "1" or "0" can be outputted to a read signal line.

As described above, the minimum area of the NAND type memory cell can be $4F^2$. In conventional circuits, the storage charge of the dielectric capacitor is read by the bit line capacity to be determined by a sense amplifier, so that a predetermined storage charge is required for the bit line capacity. Therefore, scale down was difficult. On the other hand, according to the third aspect of the present invention, the storage charge of the memory capacitor is read by the capacity of the reference capacitor to be determined by the read transistor in the block. Since all of the memory capacitor, the reference capacitor and the gate capacitor of the transistor can be proportionally reduced, the complete scaling can be carried out for area similar to the MFS-FET, so that it is possible to provide a high density integrated semiconductor memory device having a very large capacity data of gigabits.

Since it is sufficient to add one reference capacitor and one read transistor to a NAND type memory cell block comprising a plurality of memory cells, the area of a memory cell can be reduced to about $4F^2$.

According to the third aspect of the present invention, the semiconductor integrated memory device has the following advantages in comparison with existing DRAMs and FeRAMs.

(1) The minimum size of a memory cell unit is $4F^2$.
(2) The absolute value of the storage charge is not required, and scaling to reduce the area can be carried out.
(3) The device is stable since the ferroelectric capacitor can be retained at the equipotential during stand-by.
(4) If the ferroelectric capacitor is used as the memory capacitor, the memory retention is not sensitive to the leak of the capacitor and the bonding leak of the transistor, and cells can be easily isolated,
(5) The operating speed is substantially equal to that of a DRAM.
(6) The device is not sensitive to noises since the read to the bit line is carried out in the bus level.
(7) The scaling rule can apply even to soft errors, it is not sensitive.
(8) Since the read amplifier is provided in the block, it is not required to provide a sense amplifier for each bit line.
(9) Since one of the memory capacitors is connected to a common plate electrode, the structure of a cell and the process for producing the cell are simple.

There is a disadvantage in that the fatigue deterioration of the ferroelectric capacitor is caused since the destructive read-out is carried out. However, in recent years, an epitaxial grown BSTO ferroelectric capacitor has been developed, so that the problem on the fatigue deterioration has been solved.

BRIEF DESCRIPTION OF THE DRAWINGS

In the drawings:

FIG. 27A is a plan view of a modification of the third preferred embodiment of a semiconductor integrated memory device according to the present invention, and FIG. 27B is a sectional view thereof;

DESCRIPTION OF THE PREFERRED EMBODIMENTS

Before describing the details of the preferred embodiments of the present invention, referring to FIGS. 1 through 15, the basic operation of the present invention will be described in detail below.

Figure 1:
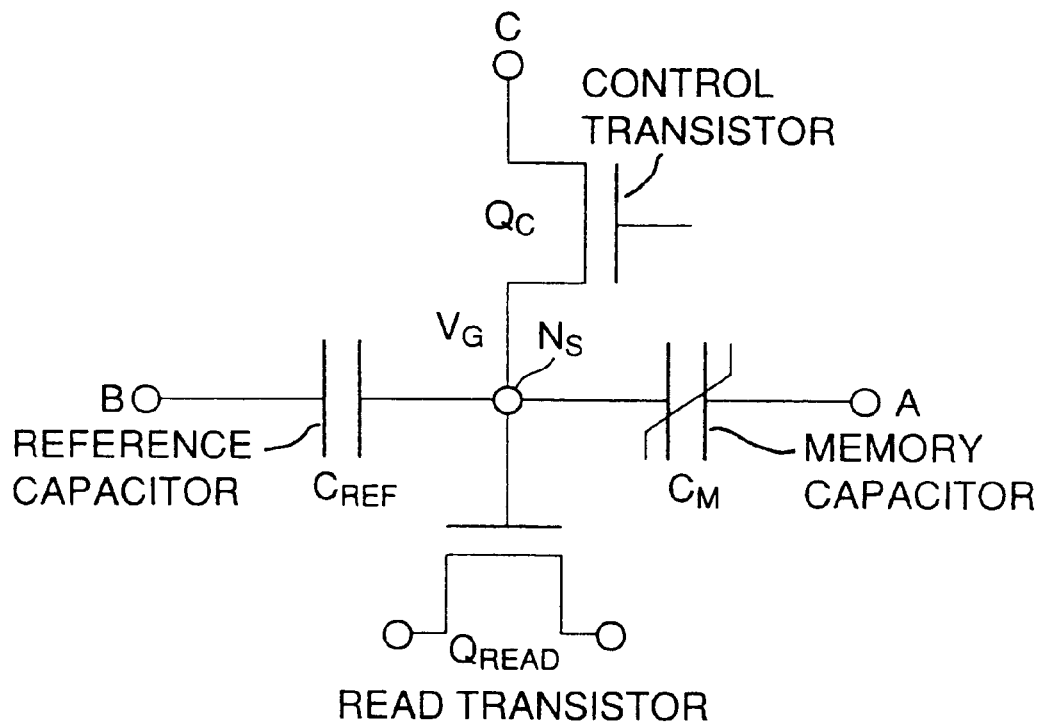
FIG. 1 is an equivalent circuit diagram of a memory cell for explaining the basic construction of the present invention.

FIG. 1 is an equivalent circuit diagram of a memory cell which comprises: a memory capacitor $C_M$, which has at least a first electrode, a second electrode facing the first electrode, and a ferroelectric thin-film sandwiched between the first and second electrodes; a reference capacitor $C_{REF}$, which has at least a third electrode connected to the first electrode of the memory capacitor $C_M$, a fourth electrode facing the third electrode, and a dielectric thin-film sandwiched between the third and fourth electrodes; a reading transistor $Q_{READ}$ which has a gate electrode connected to the first electrode of the memory capacitor $C_M$ and the third electrode of the reference capacitor $C_{REF}$; and a control transistor.

Figure 2A:
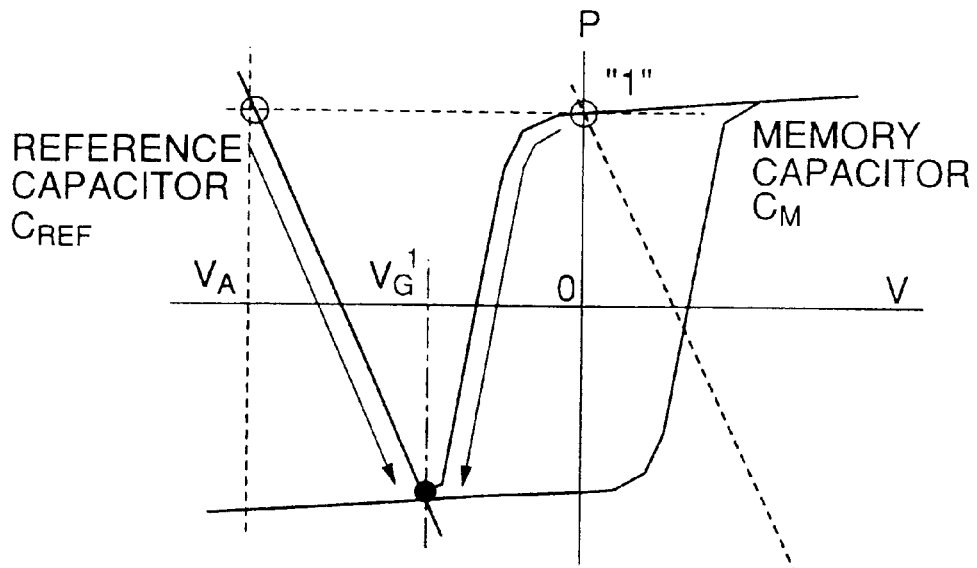
FIG. 2A is a schematic diagram for explaining the read operation of a semiconductor integrated memory device according to the present invention at a memory "1"
Figure 2B:
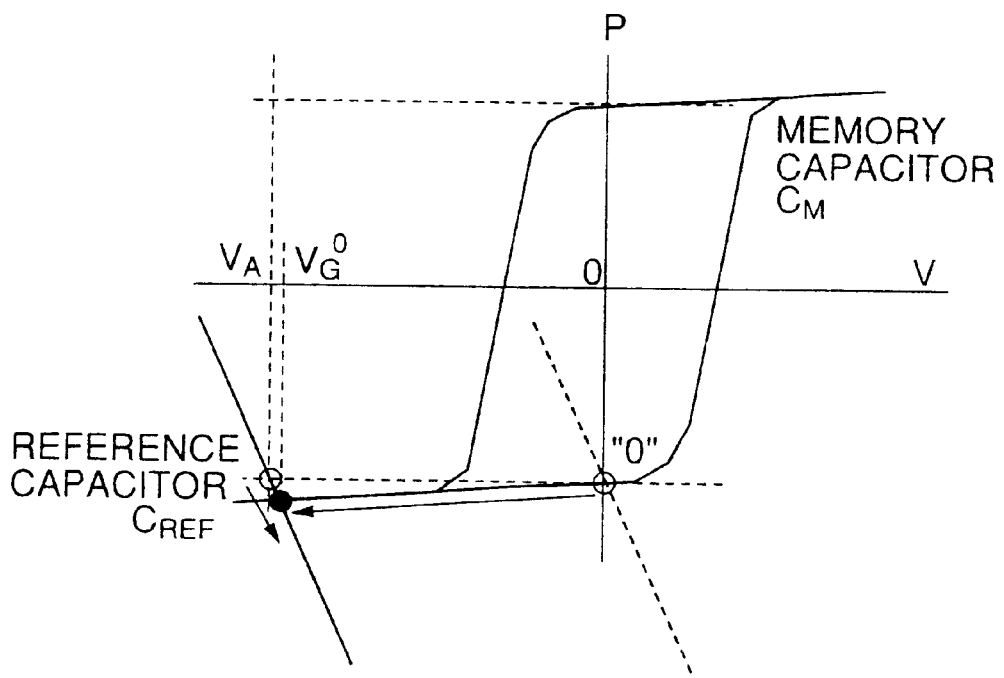
FIG. 2B is a schematic diagram for explaining the read operation of a semiconductor integrated memory device according to the present invention at a memory "0"

FIGS. 2A and 2B show performance charts of read operations of memories "1" and "0" when an external voltage is applied to between the A-B terminals of the cell shown in FIG. 1, wherein the memory capacitor $C_M$ is connected to the reference capacitor $C_{REF}$ using the ferroelectric thin-film in series. In the polarization-voltage curves (P-V curves) shown in FIGS. 2A and 2B, the axis of abscissas denotes voltage (V), and the axis of ordinates denotes dielectric polarization (P). It is assumed that the inverted voltage of the ferroelectric capacitor $C_M$ serving as the memory capacitor is $V_C$, the external applied voltage thereof is $V^A$, and the potential of a storage node $N_S$ serving as a node between both capacitors is $V_G$. The P-V curve of the ferroelectric capacitor $C_M$ has a ferroelectric hysteresis curve shown in FIGS. 2A and 2B. FIG. 2A shows the case where the ferroelectric capacitor $C_M$ is previously set to be in a polarization state corresponding to the memory of "1" before a read operation, and FIG. 2B shows the case where the ferroelectric capacitor $C_M$ is previously set to be in a polarization state corresponding to the memory of "0". The reference capacitor $C_{REF}$ using the paraelectric thin-film is expressed by a straight line having a gradient corresponding to a capacity.

When an external voltage $V^A$ is applied to between the BL-PL of the cell, the potential $V_G$ of the storage node $N_S$ is shown by the intersection of the P-V curve between the memory capacitor and the reference capacitor. As can be seen from FIGS. 2A and 2B, the potential $V^1_G$ of the storage node when a polarization state corresponding to the memory of "1" is previously set is different from the potential $V^0_G$ of the storage node when a polarization state corresponding to the memory of "0" is previously set, since the P-V curves are different from each other.

Since the voltage $V^A$ for inverting the memory capacitor $C_M$ decreases as the capacity of the reference capacitor $C_{REF}$ increases (i.e., the gradient shown in FIGS. 2A and 2B increases), it is desired that the capacity of the reference capacitor $C_{REF}$ is large. On the other hand, the difference $\Delta V_G = V^1_G - V^0_G$ between memory states of voltages read as $V_G$ when $V^A$ is applied increases as the capacity of the reference capacitor $C_{REF}$ decreases. At this point, it is desired that the capacity of the reference capacitor is small. Therefore, if both of the inverted voltage and the read voltage are considered, it is desired that the capacities of the memory capacitor $C_M$ and the reference capacitor $C_{REF}$ are substantially equal to each other, i.e., the inverted polarized charge obtained by applying an inverted voltage to the memory capacitor $C_M$ is substantially equal to the charge obtained by applying a voltage equal to the inverted voltage to the reference capacitor $C_{REF}$. The broader allowable range of the capacity rate is substantially in the range of from ¼ to four times.

When the capacity rate of the memory capacitor $C_M$ and the reference capacitor CREF is 1:1, $V^A$ is about two times as large as $V_G$, and the difference $\Delta V_G$ between memory states is substantially equal to $V_C$. Therefore, if a reference capacitor $C_M$ having an inverted voltage of 1 V is used, $V_A$ is about 2 V, so that a difference of about 1 V can be obtained as the $\Delta V_G$.

Then, the gate electrode of the read transistor $Q_{READ}$ is connected to the storage node $N_S$, and the memory state is determined on the basis of the difference $\Delta V_G$ in $V_G$. At this time, the gate capacity of the read transistor $Q_{READ}$ is connected to the memory capacitor $C_M$ and the reference capacitor $C_{REF}$ in parallel. However, if a usual ferroelectric capacitor having a remnant polarization of about 10 $\mu C/cm^2$ or more is used as the memory capacitor $C_M$, the gate capacity of the read transistor $Q_{READ}$ having the same area is less than ⅒, so that there is little change in potential of the storage node $N_S$. In addition, since about 1 V can be obtained as the difference $\Delta V_G$ in $V_G$ in the aforementioned example, it is greater than about 700 mV which is the threshold of a MOS transistor used as the read transistor $Q_{REF}$, so that it is possible to read data directly by controlling ON and OFF of the MOS transistor $Q_{REF}$ by the gate voltage.

When the rectangularity of the ferroelectric hysteresis curve of the memory capacitor $C_M$ is good, it is possible to rewrite data subsequently the read operation by reusing the charge read by the reference capacitor $C_{REF}$. That is, the polarization of the memory capacitor $C_M$ can be returned substantially to the state before the read operation by applying a suitable rewrite voltage $V_W$ in a reverse direction to the read voltage $V_R$ as shown in FIGS. 3A and 3B.

Figure 3A:
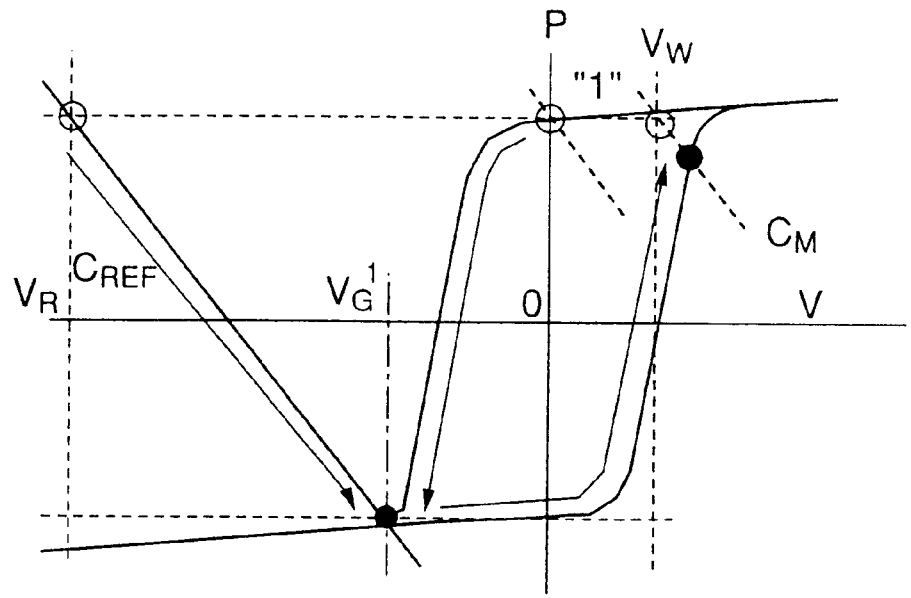
FIG. 3A a schematic diagram for explaining the read/write operation of a semiconductor integrated memory device according to the present invention at a memory "1"
Figure 3B:
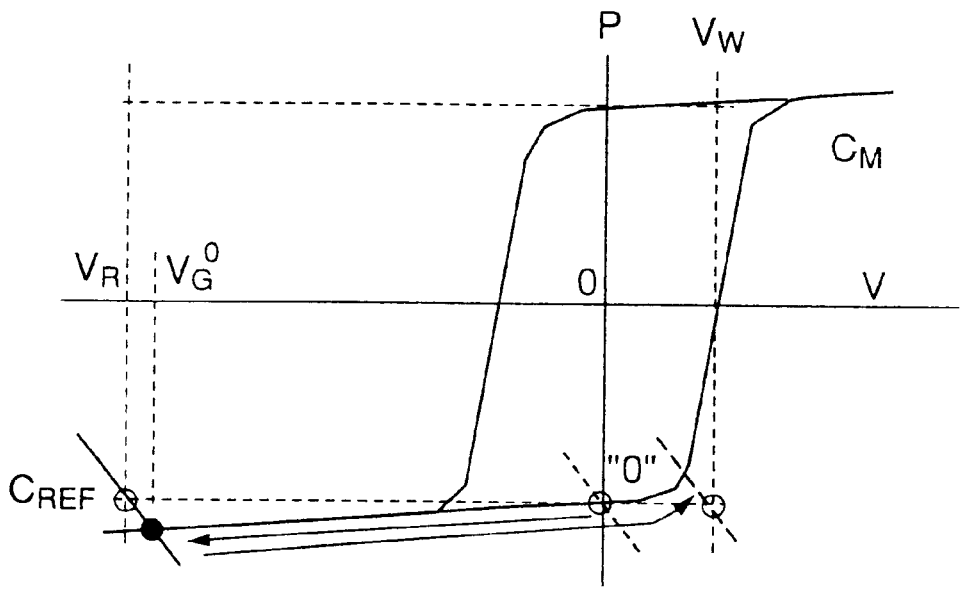
FIG. 3B is a schematic diagram for explaining the read/write operation of a semiconductor integrated memory device according to the present invention at a memory "0"
Figure 7A:
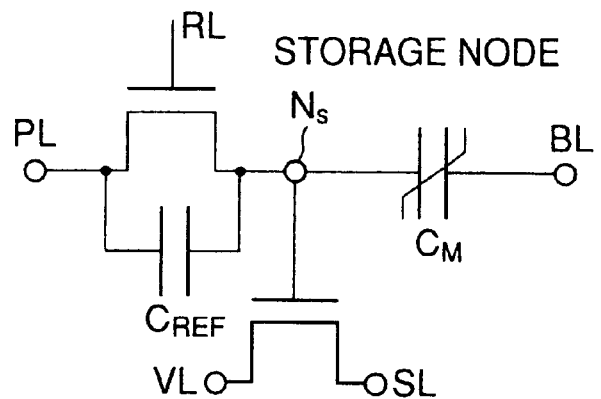
FIGS. 7A through 7C are equivalent circuit diagrams of memory cells, each of which explains the basic construction of the present invention.

FIG. 3A shows the case where the ferroelectric capacitor $C_M$ has been previously set to be in a polarization state corresponding to the memory of "1" before the read operation, and FIG. 3B shows the case where the ferroelectric capacitor $C_M$ has been previously set to be in a polarization state corresponding to the memory of "0" before the read operation. Furthermore, when the sequential rewrite shown in FIGS. 3A and 3B is not carried out, a control transistor is connected to the reference capacitor $C_{REF}$ in series as shown in FIG. 7A, and the control transistor is turned on to short-circuit the reference capacitor $C_{REF}$ to apply a voltage directly only to the memory capacitor $C_M$, so that write can be carried out.

Figure 4:
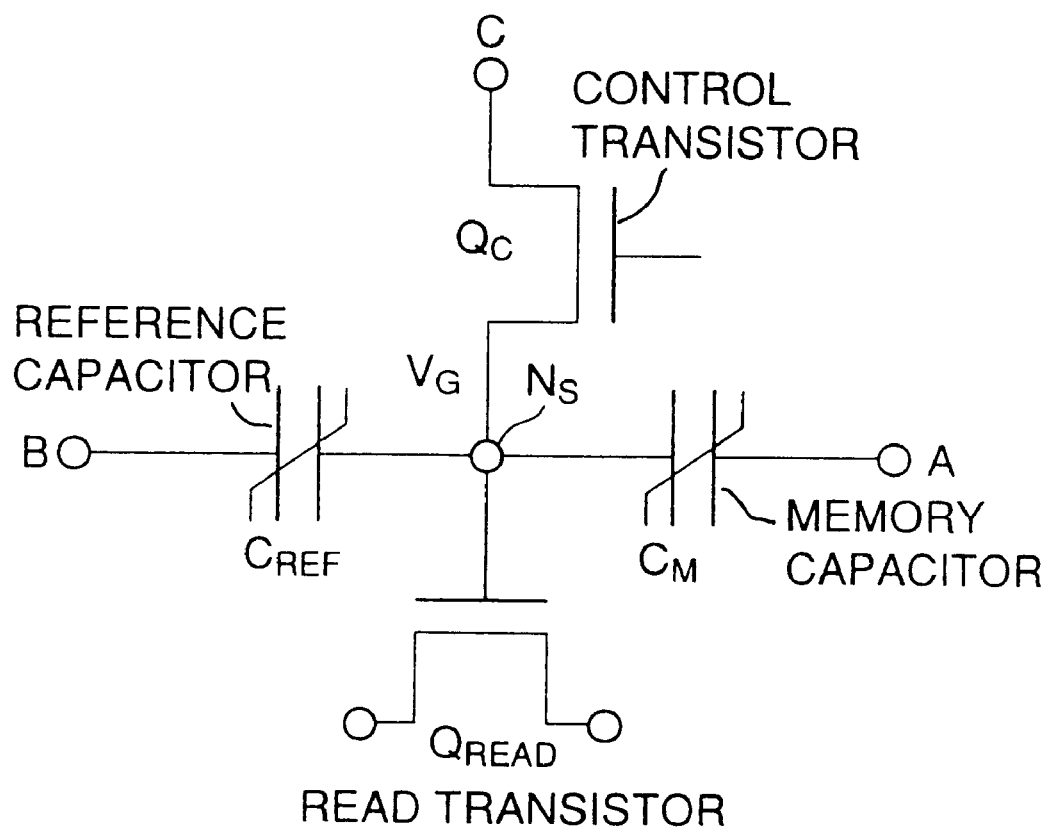
FIG. 4 is an equivalent circuit diagram of a memory cell according to the present invention when a reference capacitor $C_{REF}$ is a ferroelectric thin-film.

The dielectric thin-film of the reference capacitor should not be limited to the paraelectric thin-film shown in FIG. 1, it may be a ferroelectric thin-film as shown in FIG. 4.

First, a method for using a ferroelectric as a reference capacitor to apply a voltage directly to between A-B terminals in a circuit diagram of FIG. 4 to read stored data will be described below. When the ferroelectric is used as the reference capacitor, it is required to polarize the reference capacitor in one direction before read. In the circuit diagram of FIG. 4, the control transistor is turned on, and a negative voltage is applied to between B-C terminals to polarize the reference in one direction. Then, the control transistor is turned off, and a negative read voltage VA is applied to between the A-B terminals in series to the memory capacitor $C_M$ and the reference capacitor.

Figure 5A:
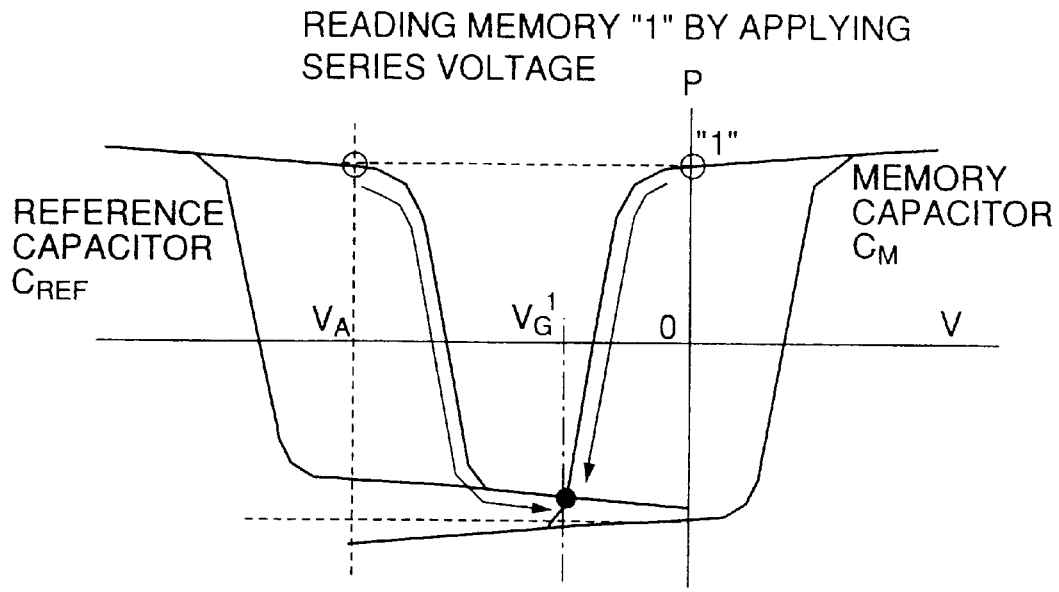
FIG. 5A is a schematic diagram for explaining the read operation at a memory "1" on the basis of the read operation when a voltage is impressed serially to the circuit of FIG. 4.
Figure 5B:
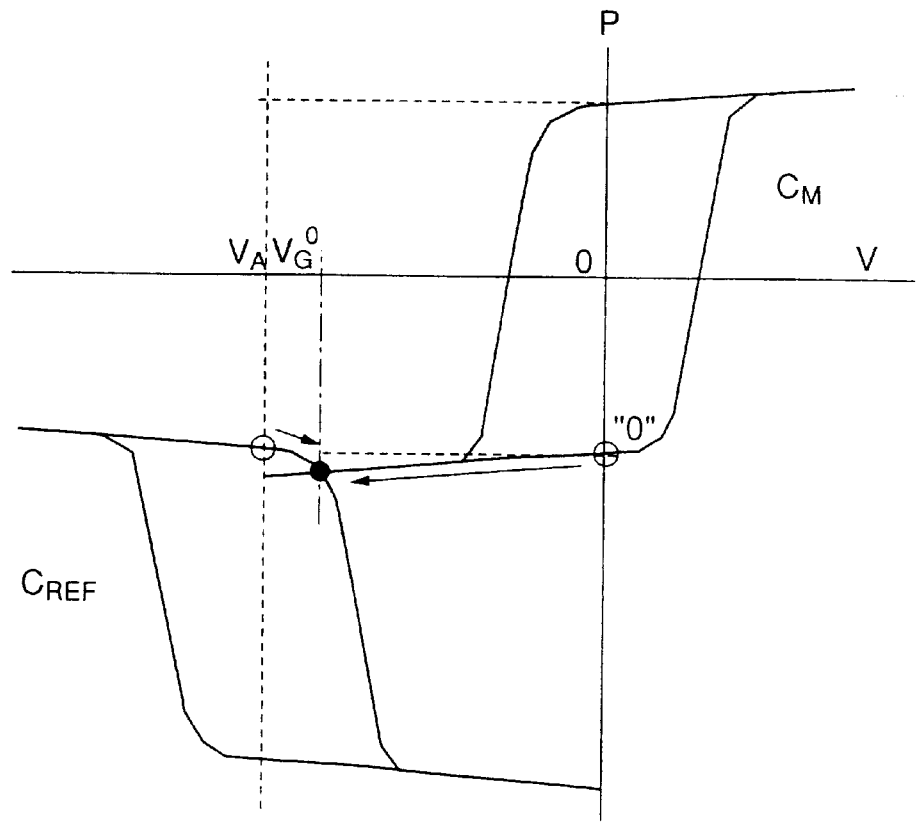
FIG. 5B is a schematic diagram for explaining the read operation at a memory "0" on the basis of the read operation when a voltage is impressed serially to the circuit of FIG. 4.

FIG. 5A shows a performance chart in a read operation when write is carried out in the memory capacitor $C_M$ in a state of "1" in the drawing. When a negative read voltage $V^A$ is applied to a terminal B, the voltage $V_G$ of the storage node is expressed by an intersection between the P-V curve of the memory capacitor and the P-V curve of the reference capacitor. At that time, the potential is $V_G^1$. FIG. 5B shows a performance chart in a read operation when the memory capacitor is polarized in a reverse direction, i.e., when write is carried out in a state of "0". From the same analysis, the potential $V_G^0$ of the storage node is determined. Thus, if the read voltage $V^A$ substantially corresponding to the sum of the inverted voltages of the memory capacitor and the reference capacitor is added, it is possible to obtain a sufficient difference $V_G^1 - V_G^0$ in voltage at the storage node in accordance with the memory state, similar to the case where the paraelectric thin-film is used as the reference capacitor.

Figure 6A:
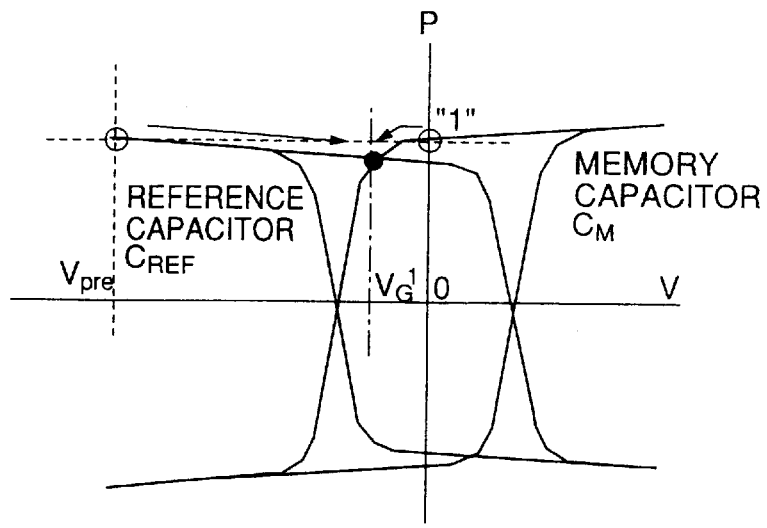
FIG. 6A is a schematic diagram showing the read operation at a memory "1" in a pre-charge mode of a reference ferroelectric capacitor.
Figure 6B:
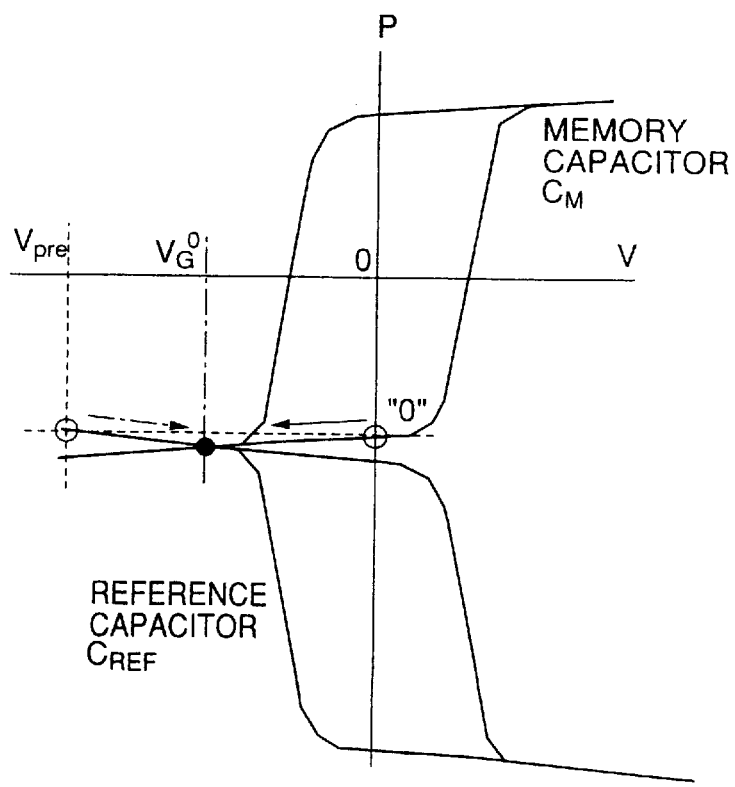
FIG. 6B is a schematic diagram showing the read operation at a memory "0" in a pre-charge mode of a reference ferroelectric capacitor.

The read in a pre-charge mode when a ferroelectric thin-film is used as the reference capacitor $C_{REF}$ will be described below. In the circuit diagram of FIG. 4, the control transistor is turned on, and a positive voltage VP is applied to the terminal B while maintaining the potentials of terminals A and C to be equal to each other, so that the reference capacitor is inverted and the pre-charge operation is carried out. Then, the control transistor is turned off, and the pre-charge voltage is 0 to return the potential of the terminal B to that equal to the potentials of the terminals A and B. FIGS. 6A and 6B show performance charts at that time. Since the dielectric constant of the ferroelectric capacitor after polarization inversion is small, the charge stored by pre-charge is small, so that it is possible to polarizationinvert the memory capacitor only by the pre-charged charge. However, since the P-V curves are different in accordance with the polarization direction of the memory capacitor, the potential difference $V_{G1}-V_{G0}$ at the storage node can be obtained in a similar manner. This read method also has an advantage in that it is possible to read data without inverting the ferroelectric capacitor while using the ferroelectric capacitor.

Furthermore, any one of thin-film capacitors of PZT, SBT (particularly $SrBi_2Ta_2O_9$ containing bismuth (Bi) as a main component) and Ba-rich epitaxial BSTO ferroelectric thin-films may be used as the memory capacitor $C_M$. Among these capacitors, the epitaxial BSTO capacitor is superior in view of stability and thickness. In addition, any one of paraelectric capacitors of silicon oxide ($SiO_2$), tantalum oxide ($Ta_2O_5$), Sr-rich BSTO, or the aforementioned ferroelectric capacitor may be used as the reference capacitor $C_{REF}$.

Figure 7B:
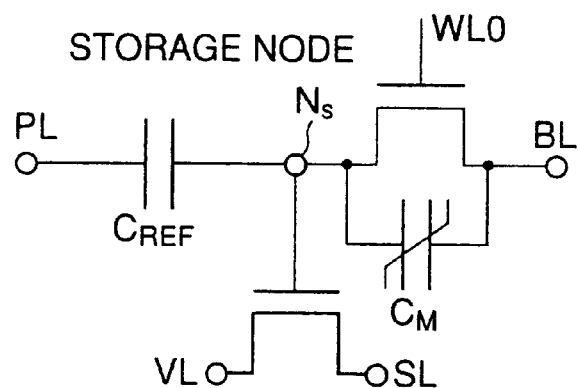
Figure 7C:
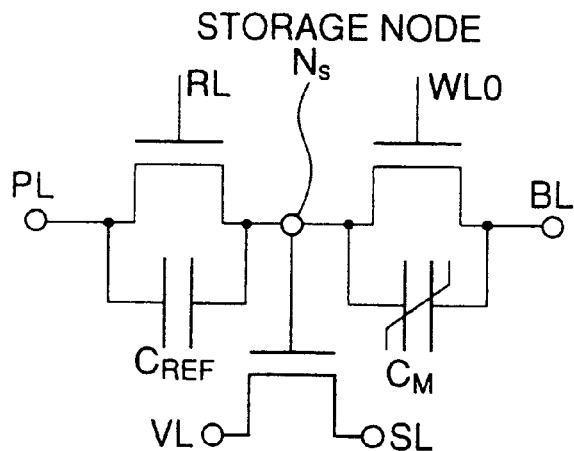

FIGS. 7A through 7C are circuit diagrams for explaining the basic construction of the present invention. In the circuit diagram of FIG. 7A, a control transistor is connected to the third and fourth electrodes of the reference capacitor $C_{REF}$. If the control transistor is thus connected to the reference capacitor $C_{REF}$ in parallel, the floating/short state of the storage node $N_S$ can be quickly changed between write and stand-by states to increase the operating speed. In addition, if the third and fourth electrodes of the reference capacitor $C_{REF}$ are short-circuited during the write state to apply a voltage only to the memory capacitor $C_M$, a low-voltage write can be carried out.

FIG. 7B shows the case where the control transistor is provided between the first and second electrodes of the memory capacity $C_M$ as described above. If the control transistor is thus connected to the memory capacitor $C_M$ in parallel, the floating/short state of the storage node can be quickly changed between write and stand-by states to increase the operating speed. In addition, during the write state, the memory capacitor $C_M$ is short-circuited to apply a voltage only to the reference capacitor $C_{REF}$ to pre-charge the reference capacitor $C_{REF}$, and then, the control transistor is turned off to apply a low reverse voltage to between the first and second electrodes of the memory capacitor $C_M$, so that a read system with pre-charge for inverting polarization state can be achieved.

In the circuit diagram of FIG. 7C, a first control transistor is provided between the first and second electrodes of the memory capacitor $C_M$, and a second control transistor is provided between the third and fourth electrodes of the reference capacitor $C_{REF}$. During stand-by, the first control transistor is first turned on to short-circuit the memory capacitor $C_M$, and the second control transistor is turned off to apply a voltage only to the reference capacitor $C_{REF}$ to be pre-charged. On the other hand, during write, the second control transistor is turned on, and the third and fourth electrodes of the reference capacitor C are short-circuited by the second control transistor. Then, the first control transistor is turned off to apply a voltage only to the memory capacitor $C_M$ to allow a low voltage write. In addition, if the first and second control transistors are thus provided, the floating/short state of the storage node $N_S$ can be quickly changed between write and stand-by states to increase the operating speed.

Figure 8A:
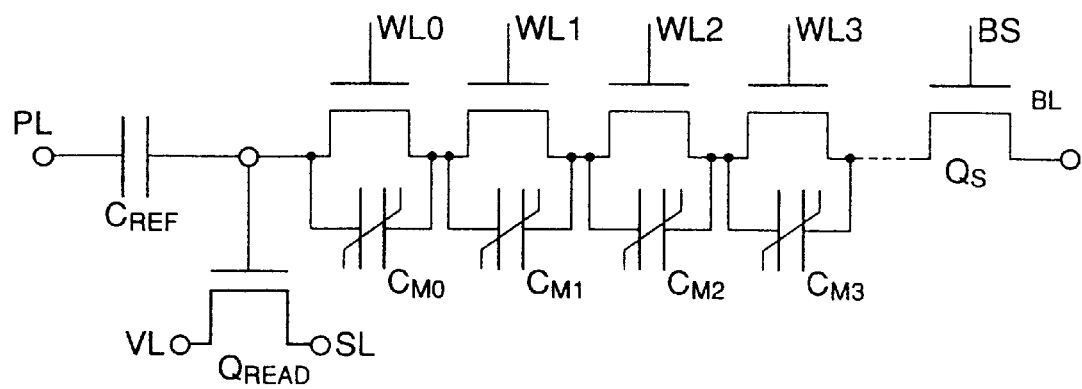
FIGS. 8A and 8B are circuit diagrams, each of which shows the detail of a semiconductor integrated memory device according to the present invention, which is more highly integrated.
Figure 8B:
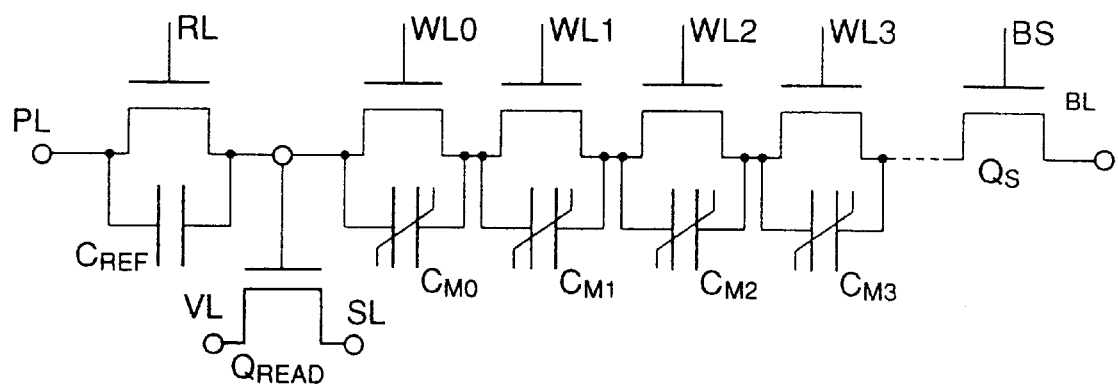

FIGS. 8A and 8B are circuit diagrams, each of which shows the detail of a semiconductor integrated memory device according to the present invention, which is more highly integrated. The memory device shown in FIG. 8A is a memory block comprising: a plurality of memory capacitors $C_{M0}$, $C_{M1}$, $C_{M2}$, $C_{M3}$, . . . , which has at least a first electrode, a second electrode facing the first electrode, and a ferroelectric thin-film sandwiched between the first and second electrodes; a memory cell column (a memory cell chain), which comprises a plurality of memory cells of control transistors connected in series between the first and second electrodes of each of the memory transistors $C_{M0}$, $C_{M1}$, $C_{M2}$, $C_{M3}$, . . . ; a reference capacitor $C_{REF}$, which has at least a third electrode electrically connected to the first electrode of the memory capacitor $C_{M0}$ positioned at one end of the memory cell column (the memory cell chain), a fourth electrode facing the third electrode, and a dielectric thin-film sandwiched between the third and fourth electrodes; and a read transistor $Q_{READ}$ having a gate electrode electrically connected to the first and third electrodes.

A plurality of memory blocks, each of which is the aforementioned memory block, are arranged in the form of a matrix to form a semiconductor integrated memory system according to the present invention. If the memory cell column has n memory cells connected in series, a selection transistor (a block selecting transistor) $Q_S$ is connected to the second electrode of the memory capacitor $C_{Mn-1}$ positioned at the other end of the memory cell column (the memory cell chain). Considering the area of one block which includes the n memory cells, the block selecting transistor $Q_S$, the read transistor $Q_{READ}$, the reference capacitor $C_{REF}$ and so forth, the memory cell unit has a minimum size of $4F^2$. Therefore, the dimension of one memory cell can be in the range of from about $(4+20/n)F^2$ to about $(4+14/n)F^2$, so that a high integration can be achieved. In order to select a specific memory capacitor $C_M$ in the memory cell column, the word lines WL of control transistors (nMOSFET) connected to other memory capacitors in parallel are turned to be high levels to be turned on, and only the word lines WLy of control transistors (nMOSFET) connected to specific target memory capacitors in parallel are turned to low levels to be turned off.

FIG. 8B shows the case where first control transistors are connected to memory capacitors $C_{M0}$, $C_{M1}$, $C_{M2}$, $C_{M3}$, . . . in parallel, and a second control transistor is connected to between the third and fourth electrodes of a reference capacitor $C_{REF}$. If the reference capacitor $C_{REF}$ is thus connected to the second control transistor in parallel, the floating/short state of the storage node $N_S$ can be quickly changed between write and stand-by states to increase the operating speed. In addition, during write, the third and fourth electrodes of the reference capacitor CREF are short-circuited by the second control transistor to apply a voltage only to a specific memory capacitor $C_{My}$ to allow write at a low voltage.

Figure 9A:
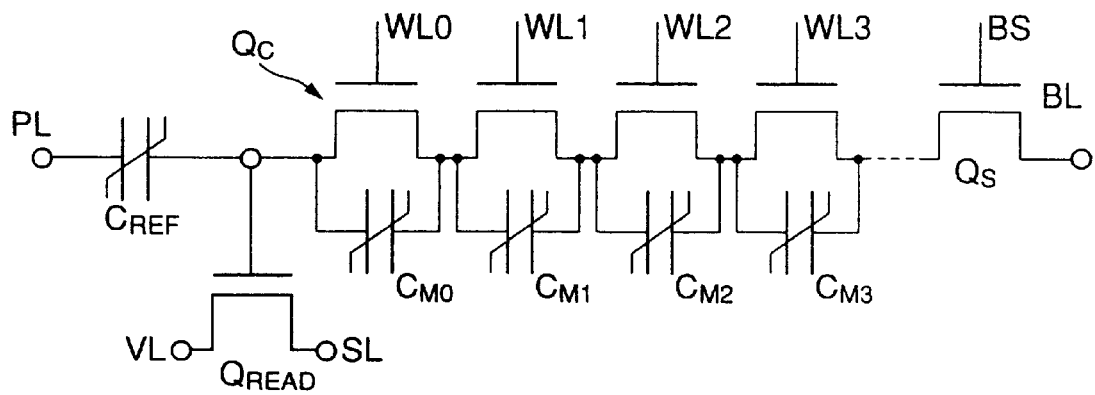
FIGS. 9A and 9B are circuit diagrams, each of which shows the detail of a semiconductor integrated memory device according to the present invention, which is suitable for the high integration when a reference capacitor $C_{REF}$ is formed of a ferroelectric thin-film.
Figure 9B:
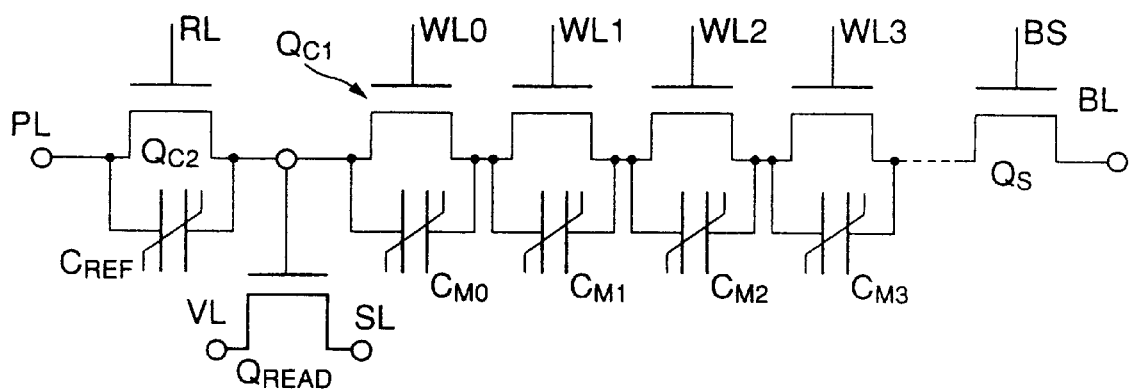

FIGS. 9A and 9B are circuit diagrams where each of the reference capacitors $C_{REF}$ of FIGS. 8A and 8B is formed of a ferroelectric thin-film. That is, FIG. 9B shows the case where a reference cell comprises a reference capacitor $C_{REF}$ and a second control transistor connected in parallel thereto, and FIG. 9A shows the case where no second control transistor is connected to a reference capacitor $C_{REF}$ in parallel. If the reference capacitor $C_{REF}$ is formed of a ferroelectric thin-film, the memory capacitors $C_{M0}$, $C_{M1}$, $C_{M2}$, $C_{M3}$, . . . and the reference capacitor $C_{REF}$ can be simultaneously formed in the same process, so that there are advantages in that it is possible to simplify the process and improve the producing yield.

Figure 10:
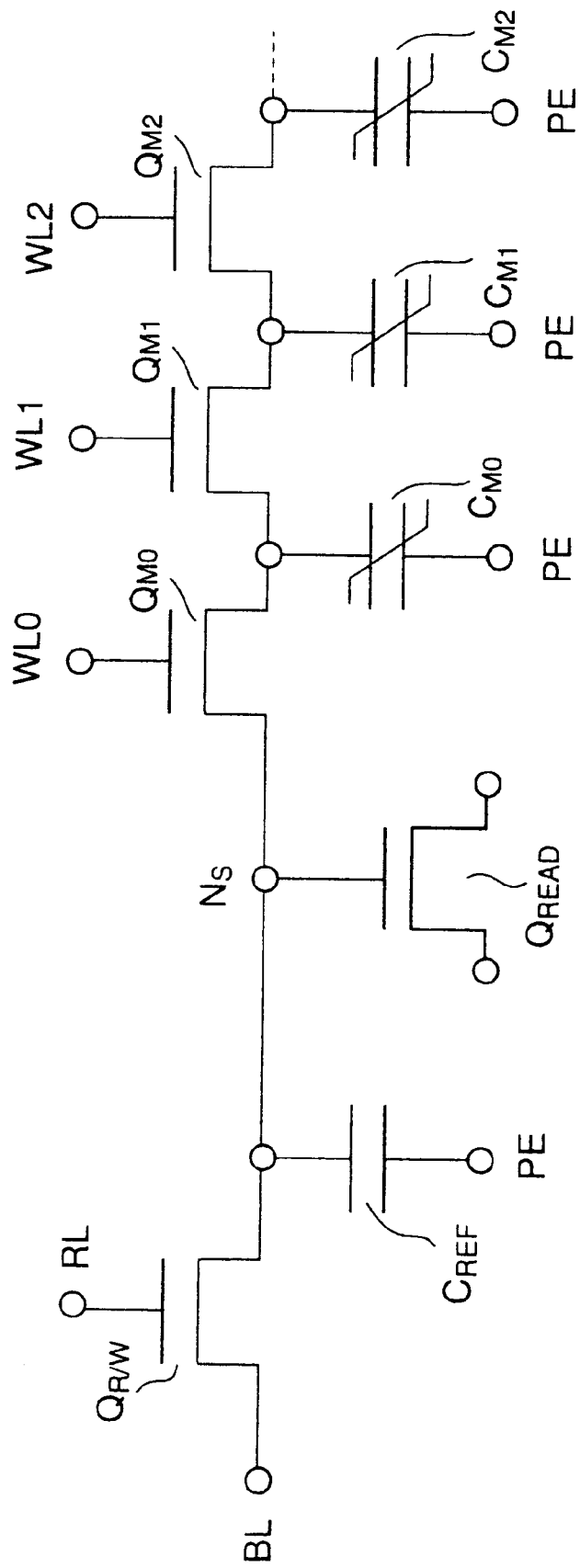
FIG. 10 is an equivalent circuit diagram of a memory cell for explaining the basic construction of a scaleable NAND-FRAM according to the present invention.

FIG. 10 is a circuit diagram for highly integrating the semiconductor memory device of the present invention, which shows an example that a ferroelectric capacitor is used as a memory capacitor. That is, a memory block has: NAND type memory cells, which comprises a plurality of selecting MOS transistors $Q_{M0}$ through $Q_{MN}$ (only $Q_{M0}$ through $Q_{M2}$ are shown in the drawing) connected in series, and a plurality of memory capacitors $C_{M0}$ through $C_{MN}$ (similarly only $C_{M0}$ through $C_{M2}$ are shown in the drawing), each of which is formed of a ferroelectric thin-film sandwiched between a memory electrode and a plate electrode facing the memory electrode, which are connected to the common main electrode of each of the selecting transistors; reference capacitors $C_{REF}$ electrically connected to the main electrode of the selecting transistor $Q_{M0}$ positioned at one end of the memory cell column; and a read transistor $Q_{READ}$ having a gate electrode electrically connected to a straight node $N_S$ serving as a node between the main electrode of the selecting capacitor and the reference capacitor.

Furthermore, in this preferred embodiment, the other electrode facing the electrode connected to the storage node of the reference capacitor is connected to a plate electrode PE, and the storage node $N_S$ is connected to a bit line BL via an R/W control transistor $Q_{R/W}$.

Now, the read operation of the first capacitor $C_{M0}$ of the memory cell column will be described. The transistor $Q_{R/W}$ is turned on, and the transistors $Q_{M0}$ and $Q_{M1}$ are turned off, so that a pre-charge voltage $V_P$ is applied to the reference capacitor $C_{REF}$ by the bit line BL to pre-charge the reference capacitor $C_{REF}$. Then, the transistor $Q_{R/W}$ is turned off, and the transistor $W_{M0}$ is turned on, so that a read operation is carried out.

After the memory contents of the first capacitor $C_{M0}$ of the NAND type memory cell column are read, the memory contents of the capacitors $C_{M1}, C_{M2}, \ldots C_{Mk}, \ldots, C_{MN}$ can be sequentially read by repeating the same sequence. That is, when the memory contents of the capacitor $C_{Mk}$ is read, all of the transistors $Q_{R/W}$ and $Q_{M0}$ through $Q_{Mk-1}$ are turned on, and the transistor $Q_{Mk}$ is turned off, so that pre-charge voltages $V_P$ are applied to the reference capacitor $C_{REF}$ and the memory capacitors $C_{M0}$ through $M_{k-1}$ to pre-charge the capacitors. Then, the transistor $Q_{R/W}$ is turned off, and the transistor $Q_{M0}$ is turned off, so that a read operation is carried out.

At this time, when the memory contents of the capacitor $C_{Mk}$ are read as characteristics of the NAND type cell matrix, there is a problem in that the capacities of the paraelectric components of the capacitors $C_{M0}$ through $C_{Mk-1}$ in the read order are added as parasitic capacities. When the parasitic capacities are too great, the read operation is obstructed, so that it is required to reduce the parasitic capacities in order to utilize a NAND cell column having a plurality of memory cells. That is, the rectangularity of the ferroelectric capacitor for memory should be effectively increased to reduce paraelectric components.

On the other hand, write is carried out commonly in the memories having the NAND type memory cell matrix in the order from the capacitor nearest the bit line. When write is carried out in the capacitor $C_{Mk}$, all of the transistors $Q_{R/W}$ and $Q_{M0}$ through $Q_{Mk}$ are turned on, and the transistor $Q_{Mk+1}$ is turned off, so that a write voltage VA is applied to the plate electrode from the bit line BL to apply a voltage higher than or equal to a counter voltage to the ferroelectric capacitor for memory to write data.

According to the present invention, various additional circuit constructions may be provided in addition to the basic circuit construction comprising the memory cell matrix, the reference capacitor and the read transistor. FIGS. 15A through 15D show some examples of such additional circuit constructions.

Figure 15A:
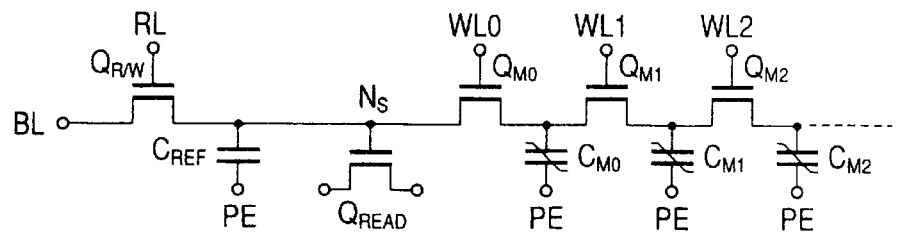
FIGS. 15A through 15D are equivalent circuit diagrams of memory cells for explaining some circuit constructions according to the present invention.

In a circuit of FIG. 15A, (1) an electrode facing an electrode connected to the storage node $N_S$ of the reference capacitor $C_{REF}$ is connected to a plate electrode PE, and an R/W control transistor $Q_{R/W}$ is provided between the storage node $N_S$ and a bit line BL.

In this circuit, although only a read operation based on pre-charge can be carried out, a write voltage can be applied directly to a memory capacitor in a write operation.

Figure 15B:
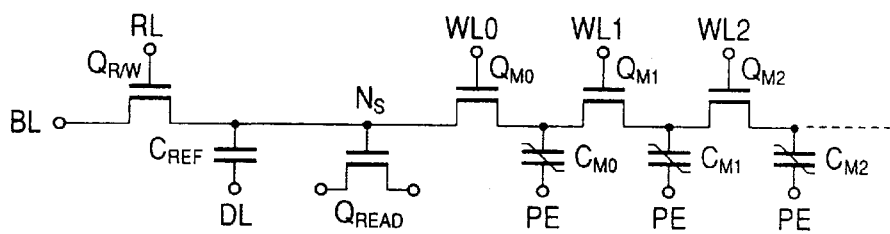

In a circuit of FIG. 15B, (2) an electrode facing an electrode connected to a storage node $N_S$ of a reference capacitor $C_{REF}$ is connected to a second drive line DL (which may also be called a complementary bit line BL), and an R/W control transistor $Q_{R/W}$ is provided between the storage node $N_S$ and a bit line BL.

In this circuit, a potential complementary to the potential of a plate electrode can be applied to between BL and DL during a pre-charge operation, so that it is possible to decrease the operating voltage and to accelerate the operation by a large voltage pre-charge. In addition, in a write operation, a write voltage can be applied directly to a memory capacitor.

Figure 15C:
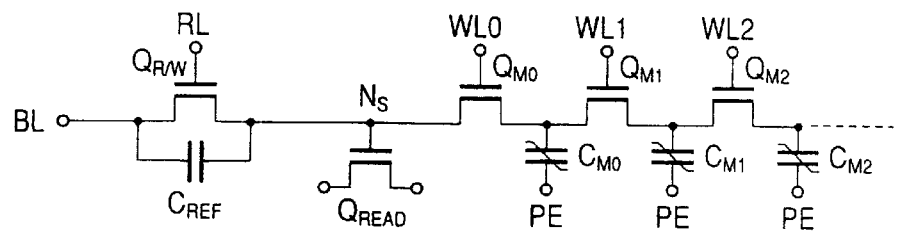

In a circuit of FIG. 15C, (3) an electrode facing an electrode connected to a storage node $N_S$ of a reference capacitor $C_{REF}$ is connected to a bit line BL, and an R/W control transistor $Q_{R/W}$ is provided between the storage node $N_S$ and the bit line BL in parallel to the reference capacitor $C_{REF}$.

In this circuit, although only a read operation based on pre-charge can be carried out, a write voltage can be applied directly to a memory capacitor in a write operation.

Figure 15D:
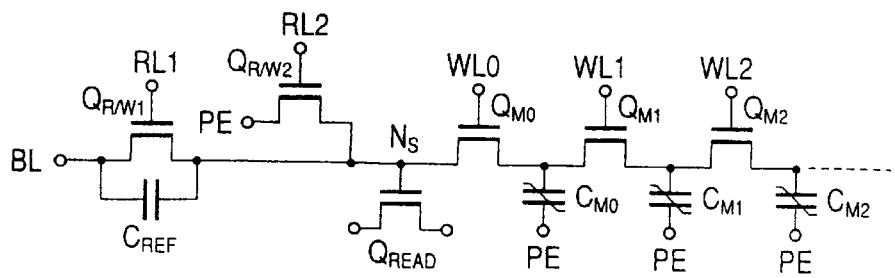

In a circuit of FIG. 15D, (4) an electrode facing an electrode connected to a storage node $N_S$ of a reference capacitor $C_{REF}$ is connected to a bit line BL, a first R/W control transistor $Q_{R/W1}$ is provided between the storage node $N_S$ and the bit line BL in parallel to the reference capacitor $C_{REF}$, and a second R/W control transistor $Q_{R/W2}$ is provided between the storage node $N_S$ and a plate electrode PE.

In this circuit, a read operation can be carried out with pre-charge, and a write voltage can be applied directly to a memory capacitor.

Thus, it is possible to cope with various read and write modes by adding some elements to the basic construction.

Furthermore, in the circuit of FIG. 15D, a ferroelectric capacitor may be used as the reference capacitor $C_{REF}$ in place of the paraelectric capacitor. In this case, the read operation of the first capacitor $C_{M0}$ of the memory cell matrix will be described an example. The transistor $Q_{R/W1}$ is turned off, and the transistor $Q_{R/W2}$ is turned on. Then, a pre-charge voltage VP higher than or equal to a counter voltage of the reference ferroelectric capacitor is applied to between the plate electrode PE and the bit line BL to polarize the reference capacitor in one direction. Then, the potential of the bit line BL is returned to the same potential as that of the plate electrode PE to turn the transistor $Q_{M0}$ on, and a read voltage $V^A$ in an opposite direction to the pre-charge voltage is applied to the potential of the plate electrode by the bit line BL in series to the reference capacitor $C_{REF}$ and the memory capacitor $C_{M0}$, to carry out a read operation. At this time, it should be understood that the performance charge of the storage node $N_S$ is basically similar to that of the reference capacitor using the paraelectric. It can be seen that it is possible to previously obtain different voltages $V_G^1$ or $V_G^0$ of the storage node $N_S$ in accordance with the polarization state corresponding to the memory of "1" or "0" of the memory capacitor. The memory state is determined by the read transistor $Q_{READ}$, the gate electrode of which is connected to the storage node $N_S$.

In a write operation, the transistor $Q_{R/W1}$ is turned on, and the transistor $Q_{R/W2}$ is turned on. In addition, the transistor $Q_{M0}$ is turned on, and a write voltage $V^A$ is applied directly to the memory capacitor $C_{M0}$ by the bit line BL to carry out a write operation.

Figure 11A:
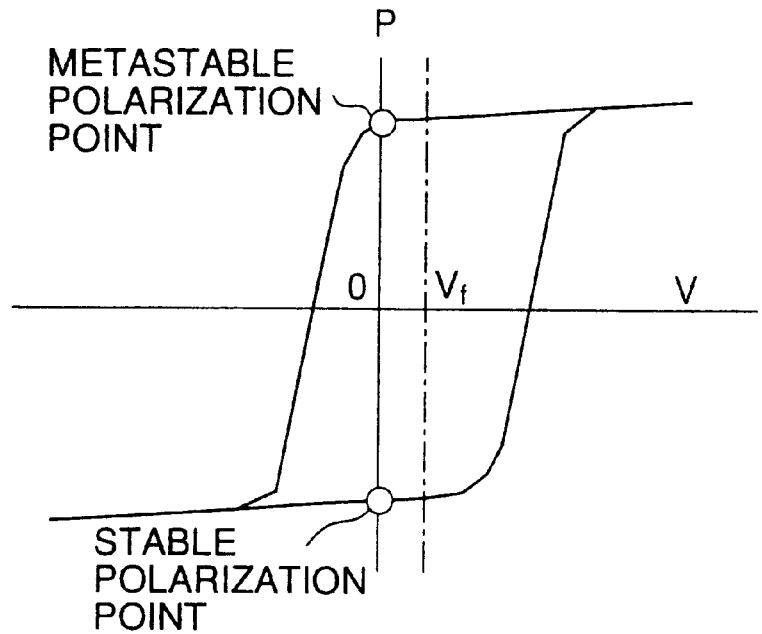
FIGS. 11A and 11B schematic diagrams, each of which explains the polarization state of a ferroelectric capacitor having an asymmetric ferroelectric hysteresis.
Figure 11B:
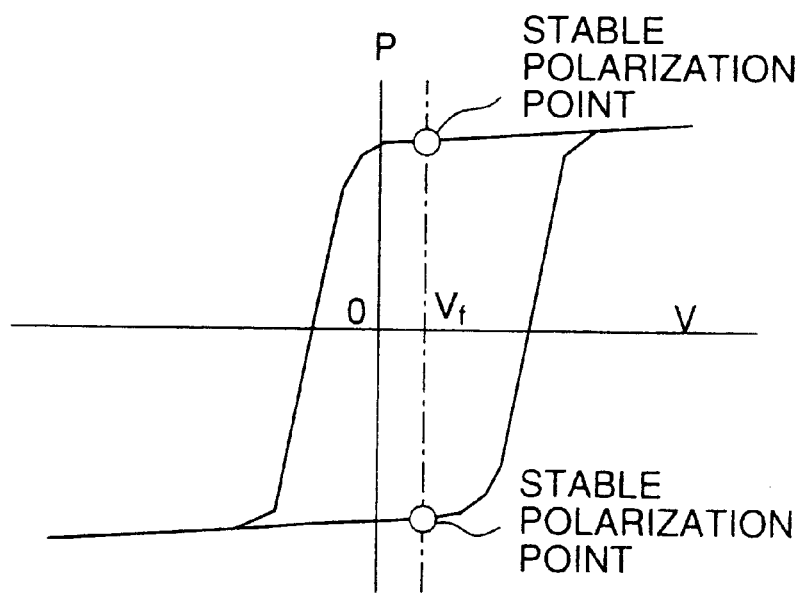

The case where an asymmetric ferroelectric capacitor having a center of ferroelectric hysteresis shifted from 0 V is used as a memory capacitor as shown in FIGS. 11A and 11B will be described below. Such an asymmetric ferroelectric capacitor is often observed when an epitaxial ferroelectric film is used (e.g., K. Abe, S. Komatsu, N. Yanase, K. Sano and T. Kawakubo, "Asymmetric Ferroelectricity and Anomalous Current Conduction in Heteroepitaxial $BaTiO_3$ Thin Films", Japan Journal of Applied Physics, Vol. 36, Part 1, No. 9B, pp. 5846–53 (1997)).

In an asymmetric capacitor, one polarization state is stable and the other polarization state is metastable as shown in FIG. 11A. Therefore, the asymmetric capacitor can not be used as a non-volatile memory. However, if a voltage $V_f$ corresponding to the offset of the center of the hysteresis is applied as shown in FIG. 11B, the polarization can be stably retained in two directions. Therefore, the circuit of the present invention can be used as a static random access memory (SRAM) for statically retain memory.

That is, during stand-by only for retaining memory, all of the transistors $Q_{M0}$ through $Q_{MN}$ are turned on to always apply a voltage $V_f$ corresponding to the offset of the center of the hysteresis to the capacitors $C_{M0}$ through $C_{MN}$ via the bit line and so forth to stably retain the memory. On the other hand, during read/write, all of the transistors $Q_{M0}$ through $Q_{MN}$ are turned off once, so that the read/write operation can be carried out in the same sequence as that when the above described usual ferroelectric is used. Furthermore, it is effective on the operation of the circuit that the read voltage is a negative voltage in the case of a ferroelectric capacitor having a positively shifted central voltage, and the read voltage is a positive voltage in the case of a ferroelectric capacitor having a negatively shifted central voltage.

Figure 12:
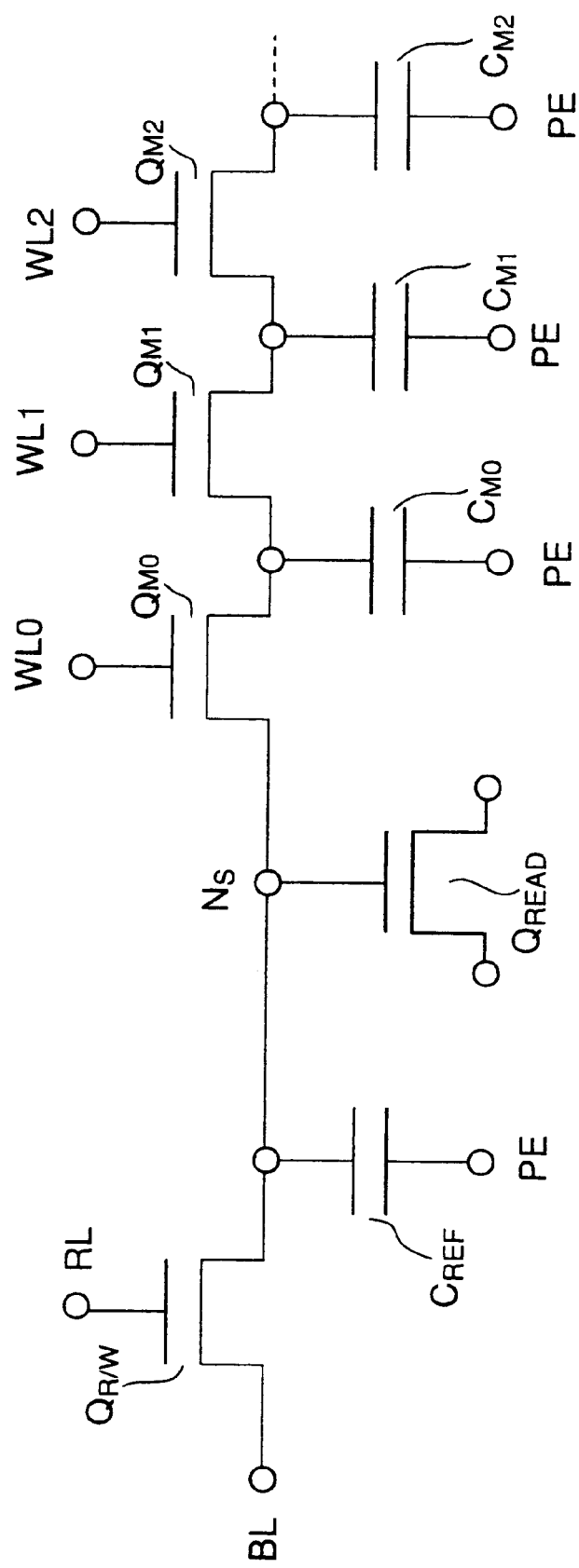
FIG. 12 is an equivalent circuit diagram of the basic construction of a memory cell when a paraelectric capacitor is used.
Figure 13A:
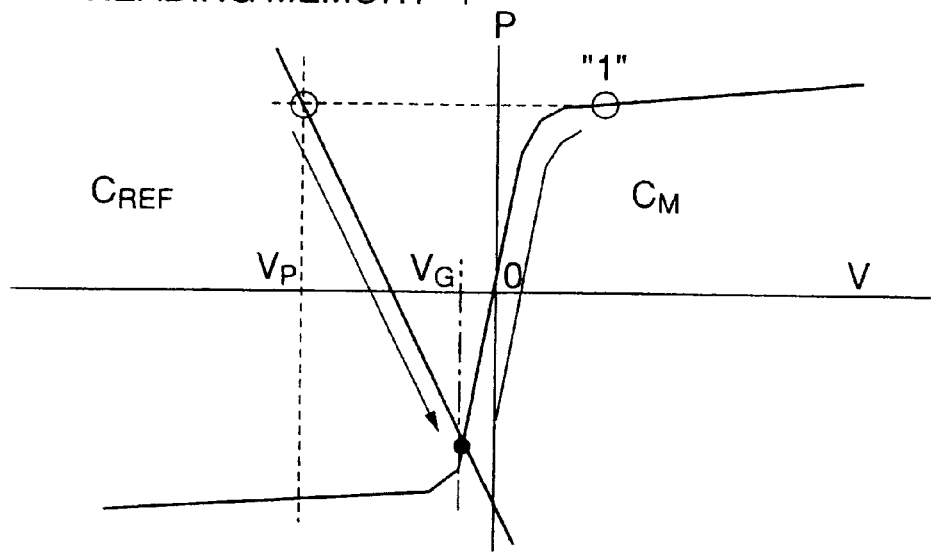
FIGS. 13A and 13B are schematic diagrams, each of which explains the read operation when a paraelectric capacitor is used.
Figure 13B:
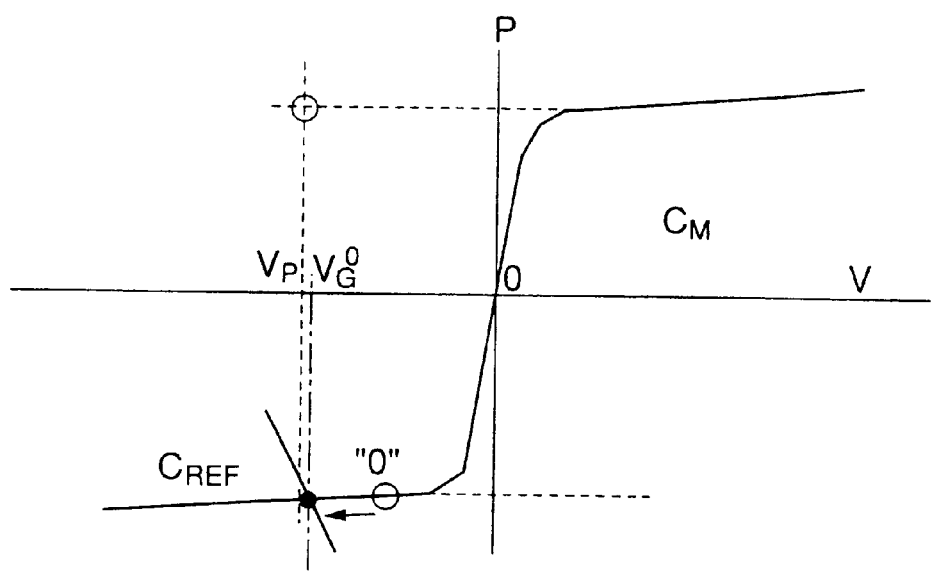

The case where a paraelectric capacitor is used as a memory capacitor will be described below. FIG. 12 shows an example of a circuit wherein a paraelectric capacitor having a non-linear storage capacity is used as a memory capacitor in place of the ferroelectric capacitor in the circuit of FIG. 15A. In the circuit of FIG. 12, the read operation of the first capacitor $C_{M0}$ of the memory cell column will be described as an example. The transistor $Q_{R/W}$ is turned on, and the transistor $Q_{M0}$ is turned off, so that a pre-charge voltage $V_P$ is applied to the reference capacitor $C_{REF}$ via the bit line BL to pre-charge the reference capacitor $C_{REF}$. Then, the potential of the bit line BL is returned to the same potential as that of the plate electrode PE, the transistor $Q_{R/W}$ is turned off, and the transistor $Q_{M0}$ is turned on, so that a read operation is carried out. FIGS. 13A and 13B show the performance charts of the storage node $N_S$ at that time. It can be understood that the operation of the paraelectric capacitor serving as the memory capacitor is basically similar to that the memory capacitor using ferroelectric. It can be seen that it is possible to previously different voltage $V_G^1$ or $V_G^0$ of the storage node $N_S$ in accordance with the polarization state corresponding to the memory of "0" or "1" of the memory capacitor. The memory state is determined by the read transistor $Q_{READ}$, the gate electrode of which is connected to the storage node $N_S$.

After the memory contents of the first capacitor $C_{M0}$ of the NAND type memory cell matrix are read, the memory contents of the capacitors $C_{M1}$, $C_{M2}$, ..., $C_{Mk}$, ..., $C_{MN}$ can be sequentially read by repeating the same sequence. That is, when the memory contents of the capacitor $C_{Mk}$ are read, all of the transistors $Q_{R/W}$ and $Q_{M0}$ through $Q_{Mk-1}$ are turned on, and the transistor $Q_{Mk}$ is turned off, so that a pre-charge voltage $V_P$ is applied to the reference capacitor $C_{REF}$ via the bit line BL to pre-charge the capacitor. Then, the transistor $Q_{R/W}$ is turned off, and the transistor $Q_{M0}$ is turned off, so that a read operation is carried out.

However, in the NAND type cell column using the paraelectric capacitor, there is a problem in that when the memory contents of the capacitor $C_{Mk}$ are read, the capacities of the capacitors $C_{M0}$ through $C_{Mk-1}$ before the read capacitor are added as parasitic capacities. When the parasitic capacities are too great, the read operation is obstructed, so that it is required to reduce the parasitic capacities in order to utilize a NAND cell column having a plurality of memory cells.

Since the dielectric constant of a usual capacitor using a silicon oxide film or a silicon nitride film is always constant regardless of a bias voltage, the storage capacity when each of the memory capacitors of the NAND type cell column is used as a memory cell is the same as the parasitic capacity when it acts as a parasitic capacitor upstream of the memory cell. Therefore, when the capacities of all of the memory capacitors and the reference capacitors are set to be the same, the total capacity of the reference capacitors and the parasitic capacitors during read increases in proportion to the position of the read memory capacitor. That is, the total capacity of capacitors on the read side when a number k capacitor is read is k times as large as the capacity of the reference capacitor, and the read voltage decreases substantially in inverse proportion to the increase of the total capacity, so that the read transistor is difficult to operate.

Figure 14:
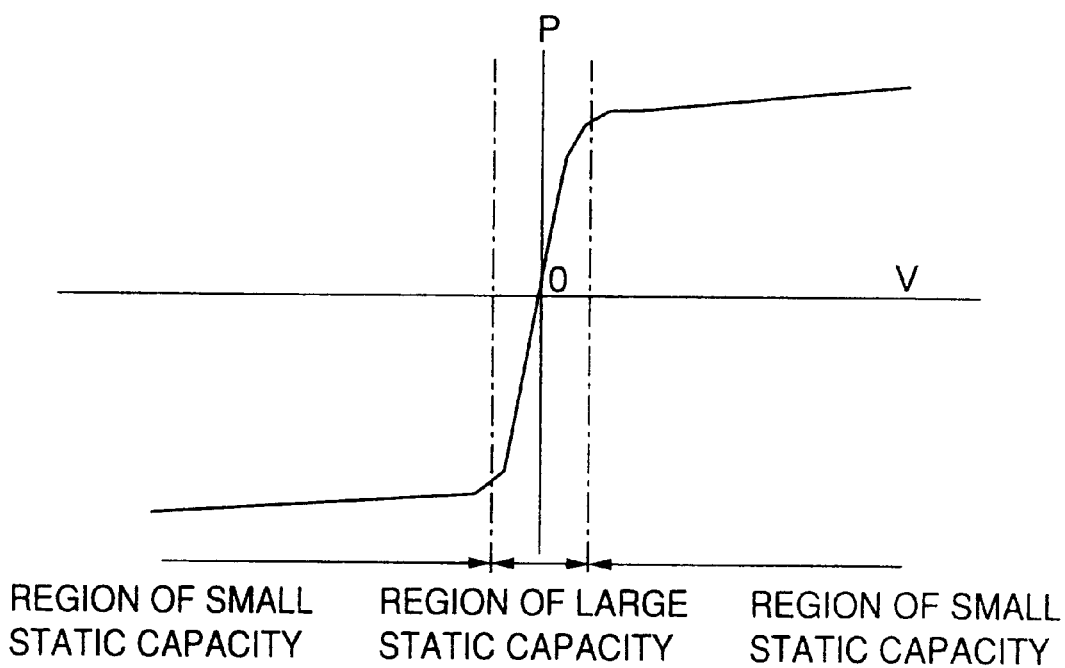
FIG. 14 is a schematic diagram for explaining the polarization state of a paraelectric capacitor having a non-linear capacity characteristic.

A method of reducing this problem is that a dielectric film having a non-linear capacity is used. Although the dielectric constants of silicon oxide film and silicon nitride film are constant since silicon oxide film and silicon nitride film have electronic polarizability, an ionic polarizable dielectric, such as perovskite oxide ferroelectric, has a dependency on a bias voltage, so that it is possible to form a capacitor having a non-linear capacity characteristic. FIG. 14 shows the characteristic of a paraelectric capacitor having a great non-linearity measured by an epitaxial BSTO paraelectric film. When a bias voltage of ± a few volts is applied to the paraelectric capacitor, the electrostatic capacity thereof decreases rapidly to be less than 1/a few. Therefore, a region having a great capacity of 0 V can be effectively used when a charge is stored, and a bias voltage can be pre-charged and a region having a small capacity can be used when a parasitic capacitor is used. If such a capacitor having a non-linear capacity is used, a NAND type memory cell matrix including many paraelectric capacitor memory cells can be utilized. Furthermore, the peak value of electrostatic capacity is preferably greater than or equal to twice as large as the minimum value of electrostatic capacity within the range of operating voltage.

The write operation is the same as that of the ferroelectric capacitor. The transistors $Q_{R/W}$ and $Q_{M0}$ through $Q_{Mk}$ are turned on, and a write voltage VA is applied directly to the memory capacitor $C_{Mk}$ via the bit line BL to carry out a write operation. Furthermore, as described above, the dielectric film of the reference capacitor may be a paraelectric or a ferroelectric. Even if the dielectric film is a ferroelectric film, if it is previously polarized in one direction by pre-charge before the write operation, it is possible to carry out the read operation in a similar manner to that of the paraelectric film. If the reference capacitor is ferroelectric capacitor when the memory capacitor is a ferroelectric capacitor, and if the reference capacitor is a paraelectric capacitor when the memory capacitor is a paraelectric capacitor, the memory capacitor and the reference capacitor can be formed in the same process, so that there are great merits in that it is possible to simplify the process and to improve the producing yield.

In addition, as described above, if a memory far from the reference capacitor is selected from the NAND type memory cell matrix, there is a case where the paraelectric component of a memory capacitor existing between the reference capacitor and the selected memory capacitor is added to the capacity of the reference capacitor in accordance with the read mode or to the capacity of the selected memory capacitor to have an influence on the read operation of memory. This problem can be solved by adjusting the capacity of the memory capacitor at each position so as to approach to the sum of the capacity of the reference capacitor and the parasitic capacity of the memory capacity comprising the paraelectric component in accordance with the read mode. Specifically, the amount of remnant polarization of a memory capacitor far from the reference capacitor is gradually increased or decreased in accordance with the read mode from the amount of remnant polarization of a memory capacitor near the reference capacitor.

Furthermore, the ferroelectric capacitor for memory may be a thin-film capacitor of any one of PZT (lead zirconate titanate), SBT (strontium bismuth tantalate) and epitaxial BSTO (barium strontium titanate) ferroelectric films. In particular, the epitaxial BSTO capacitor is superior in view of stability and thickness.

In addition, the memory capacitor may be any one of paraelectric capacitors of silicon oxide, tantalum oxide and BSTO, or the aforementioned ferroelectric capacitor.

The basic concept of the present invention would be understood from the foregoing. Referring to the accompanying drawings, the first through twelfth preferred embodiments of the present invention will be described below. In the drawings, the same or similar reference numbers are used for the same or similar portions. However, it should be noted that the drawings are schematic drawings, so that the relationship between thickness and plane dimension, the ratio of thickness of each layer and so forth be different from actual those. Therefore, the thickness and dimension should be specifically determined in view of the descriptions which will be described below. In addition, it should be noted that the drawings include different relationships in dimension and ratios.

(First Preferred Embodiment)

Figure 16:
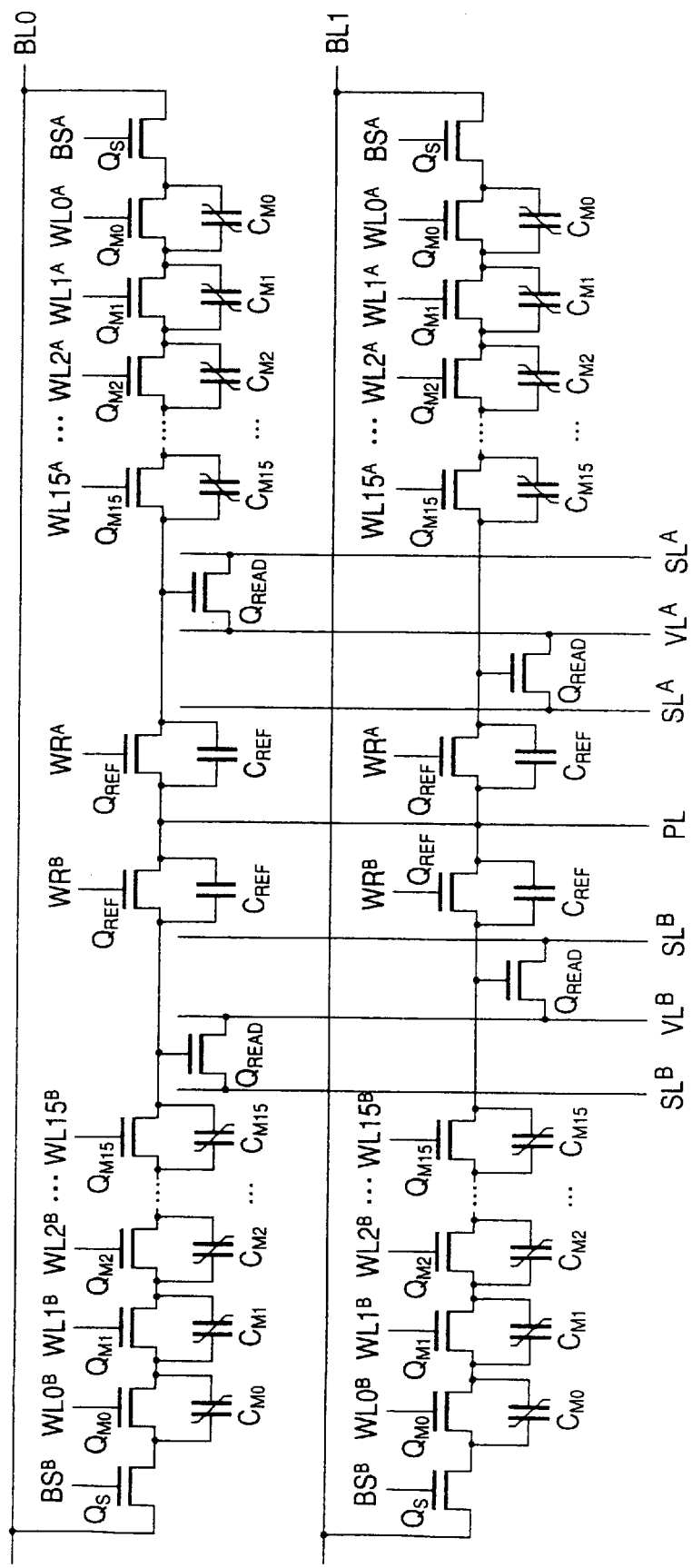
FIG. 16 is a circuit diagram of a principal part of the first preferred embodiment of a semiconductor integrated memory device according to the present invention.

FIG. 16 is a circuit diagram of a principal part of the first preferred embodiment of a semiconductor integrated memory device according to the present invention. As shown in FIG. 16, the first preferred embodiment of a semiconductor integrated memory device according to the present invention has, as a basic unit, a memory block including: a memory cell column (a memory cell chain) which comprises a plurality of memory capacitors $C_{M0}$, $C_{M1}$, $C_{M2}$, ..., $C_{M15}$ connected in series, and control transistors, each of which is connected to a corresponding one of the memory capacitors $C_{M0}$, $C_{M1}$, $C_{M2}$, ..., $C_{M15}$; a reference capacitor $C_{REF}$ connected to the memory capacitor $C_{M15}$ arranged at one end of the memory cell chain; a read transistor $Q_{READ}$ having a gate electrode connected to a connection point (a connection node) between the memory capacitor $C_{M15}$ and the reference capacitor $C_{REF}$; and a selection transistor (a block selecting transistor) $Q_S$ connected to the memory capacitor $C_{M0}$ arranged at the other end of the memory cell chain. Each of the memory capacitors $C_{M0}$, $C_{M1}$, $C_{M2}$, ..., $C_{M15}$ has at least a first electrode, a second electrode facing the first electrode, and a ferroelectric thin-film sandwiched between the first and second electrodes. The reference capacitor $C_{REF}$ has at least a third electrode electrically connected to the first electrode of the memory capacitor $C_{M15}$, a fourth electrode facing the third electrode, and a dielectric thin-film sandwiched between the third and fourth electrodes. Furthermore, although the order of arrangement of the memory capacitors $C_{M0}$, $C_{M1}$, $C_{M2}$, ..., $C_{M15}$ is the reverse of those in FIGS. 8A and 8B, it should be noted that that is a mere problem on the order. The first preferred embodiment of a semiconductor integrated memory device according to the present invention has a plurality of memory cell blocks which are arranged in the form of a matrix and each of which is the same as the aforementioned memory block. FIG. 16 shows only four blocks in total, as two blocks [A] and two blocks [B]. The block selecting transistor $Q_S$ of the upper-stage column of the block [A] is connected to a bit line BL0, and the block selecting transistor $Q_S$ of the lower-stage column of the block [A] is connected to a bit line BL1. The block selecting transistor $Q_S$ of the upper-stage column of the block [B] is connected to the bit line BL0, and the block selecting transistor $Q_S$ of the lower-stage column of the block [B] is connected to the bit line BL1.

The gate electrodes of the control transistors connected to the respective memory capacitors $C_{M0}$, $C_{M1}$, $C_{M2}$, ..., $C_{M15}$ of the block [A] in parallel are connected to word lines $WL0^A$, $WL1^A$, $WL2^A$, ..., $WL15^A$, respectively. Similarly, the gate electrodes of the control transistors connected to the respective memory capacitors $C_{M0}$, $C_{M1}$, $C_{M2}$, ..., $C_{M15}$ of the block [B] in parallel are connected to word lines $WL0^B$, $WL1^B$, $WL2^B$, ..., $WL15^B$, respectively. Each of the gate electrodes of the block selecting transistors $Q_S$ of the block [A] is connected to a word line $BS^A$ of the block selecting transistor, and each of the gate electrodes of the block selecting transistors $Q_S$ of the block [B] is connected to a word line $BS^B$ of the block selecting transistor. The reference capacitor CREF of the block [A] is connected to a control transistor $Q_{REF}$, the gate electrode of which is connected to a word line $WR^A$ of a reference capacitor and control transistor. The reference capacitor $C_{REF}$ of the block [B] is connected to a word line $WR^B$ of a reference capacitor control transistor.

One main electrode of the read transistor $Q_{READ}$ of each of the memory blocks is connected to read power source lines $VL^A$ and $VL^B$, and the other main electrode is connected to read output lines $SL^A$ and $SL^B$. In this embodiment, there are provided two pairs of the read output lines $SL^A$ and $SL^B$ which are alternatively connected with the read transistor $Q_{READ}$. Moreover, the connection point between the reference capacitor control transistor of the block [A] and the reference capacitor control transistor of the block [B] is connected to a plate line PL. In FIG. 16, while the control transistors connected to the respective memory capacitors $C_{M0}$, $C_{M1}$, $C_{M2}$, $C_{M3}$, ..., $C_{M15}$ in parallel, the read transistors $Q_{READ}$, the block selecting transistors $Q_S$, and the reference capacitor control transistors are shown as nMOSFETs, these transistors may be formed of a pMOSFET.

Figure 17:
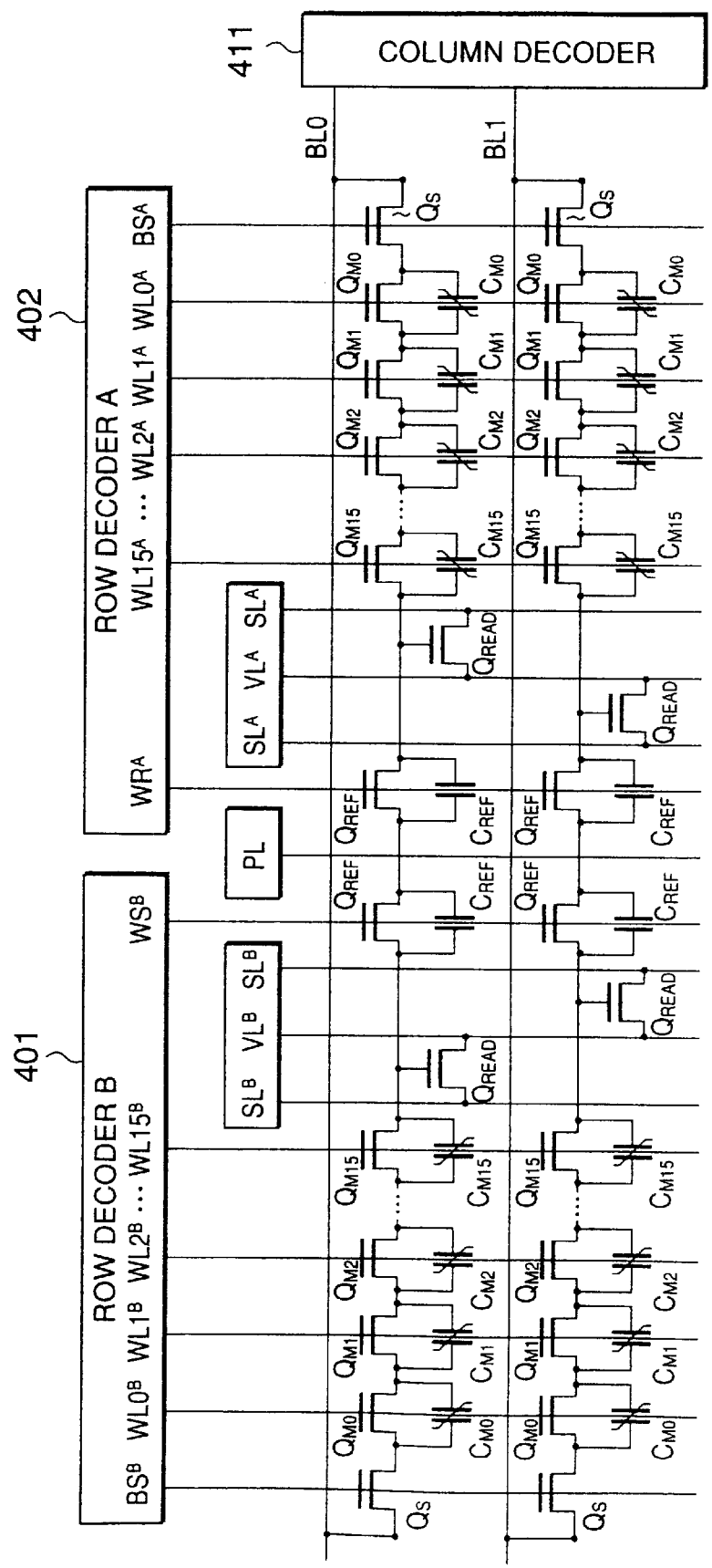
FIG. 17 is a circuit diagram of a principal part of the first preferred embodiment of a semiconductor integrated memory device according to the present invention, which includes peripheral circuits.

FIG. 17 shows a connection diagram to peripheral circuits. Each of the word lines $WL0^A$, $WL1^A$, $WL2^A$, ..., $WL15^A$ of the block [A] is connected to a row decoder A402, and each of the word lines $WL0^B$, $WL1^B$, $WL2^B$, ..., $WL15^B$ of the block [B] is connected to a row decoder B401. Each of the bit lines BL0, BL1, ... is connected to a column decoder 411.

In FIGS. 16 and 17, in order to select a desired memory cell designated by the intersection between BLx (x=0, 1) and WLy$^A$ (y=0, 1, 2, . . . , 15) in the block [A], the word line BS$^A$ is set to be "1" (high level) to cause the block selecting transistor Q$_S$ to be turned on, and only WLy$^A$ is set to be "0" (low level) to cause the control transistor connected to the memory capacitor C$_{My}$ to be turned off. In addition, other WL$^A$ are set to be "1", and a potential is applied to BLx for the plate line PL having a constant potential (e.g., ½ VC). Thus, the desired memory cell can be selected. During read, the word line WR$^A$ of the reference capacitor control transistor is turned off, and during write, the word line WR$^A$ is turned on. Similarly, in order to select a desired memory cell designated by the intersection between BLx (x=0, 1) and WLy$^B$ (y=0, 1, 2, . . . , 15) in the block [B], the word line BS$^B$ is set to be "1" to cause the block selecting transistor Q$_S$ to be turned on, and only WLy$^B$ is set to be "0" to cause the control transistor connected to the memory capacitor C$_{My}$ to be turned off. In addition, other WL$^B$ are turned to be "1", and a potential is applied to BLx for the plate line PL having a constant potential (e.g., (½) V$_G$). Thus, the desired memory cell can be selected. During read, the word line WR$^B$ of the reference capacitor control transistor is set to be "0", and during write, the word line WR$^B$ is set to be "1".

Figure 18:
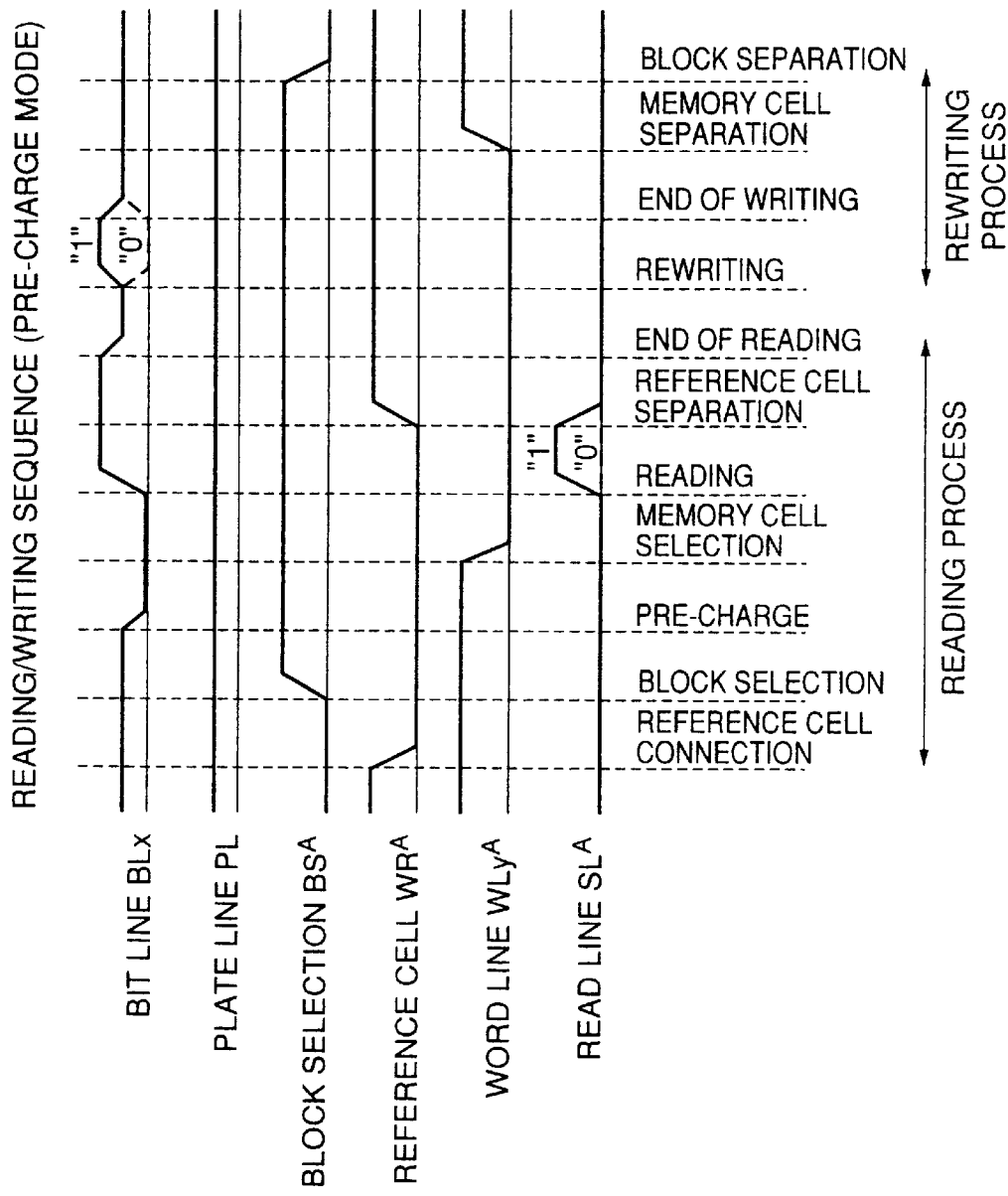
FIG. 18 is a timing chart showing a read/write sequence in the first preferred embodiment of a semiconductor integrated memory device according to the present invention.

FIG. 18 shows a read/write sequence when "a pre-charge read system" is adopted. That is, in the pre-charge read system, a reverse voltage is applied to the reference capacitor C$_{REF}$ before selecting WLy$^A$ and WLy$^B$, and a positive voltage is applied thereto after selecting WLy$^A$ and WLy$^B$, so that a voltage substantially about twice is applied to the memory capacitor C$_{My}$ to be inverted.

Figures 19A, 19B:
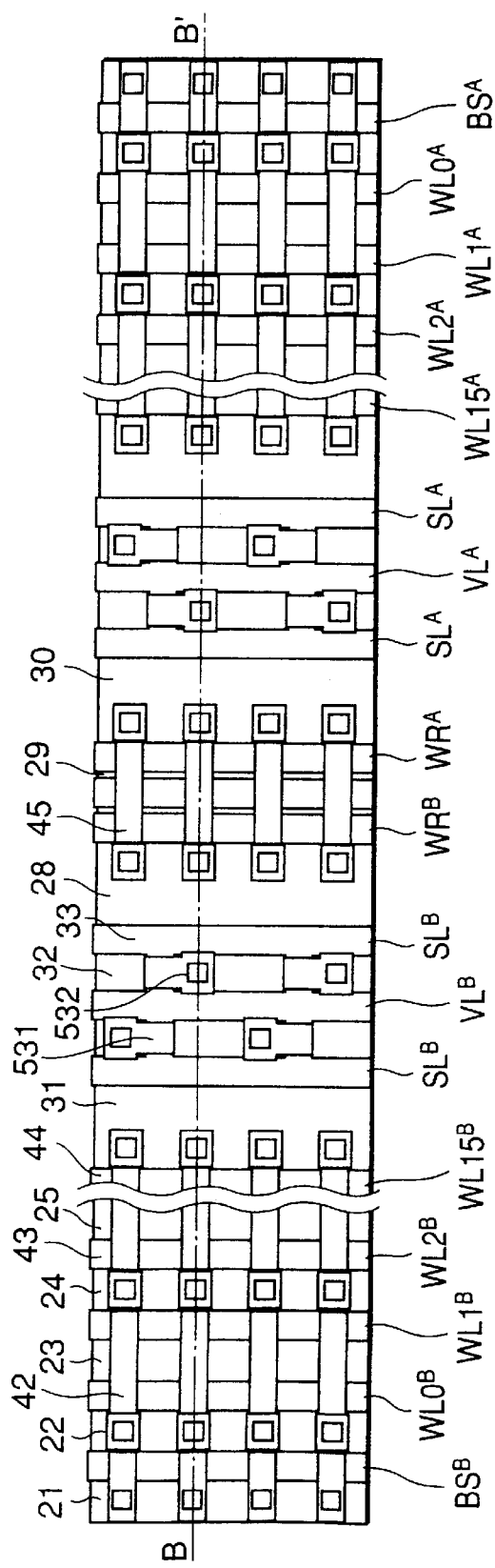
FIG. 19A is a plan view of a block [B] of the first preferred embodiment of a semiconductor integrated memory device according to the present invention.
FIG. 19B is a sectional view thereof.

FIG. 19A is a plan view showing memory blocks, which shows only an underlayer lower than a level of A–A' in the sectional view of FIG. 19B, for simple explanation. In FIG. 19A, the block selecting transistor Q$_S$ of the block [B] is formed by n$^+$ source/drain regions 21 and 22 and a word line BS$^B$ serving as a polycrystalline silicon gate electrode. The "n+ source/drain region" means a source or drain region of MOSFET. Since the usual source and drain regions of MOSFET are formed so as to be symmetrical with respect to the gate electrode, there is a mere problem on name as to which is called a source or drain region of MOSFET. The n$^+$ source/drain region 21 functions as a "bit line connecting part". Similarly, the control transistor connected to the memory capacitor C$_{M0}$ of the block [B] in parallel is formed by the n$^+$ source/drain regions 22 and 23 and the word line WL0$^B$ serving as a polycrystalline silicon gate electrode. Moreover, the control transistor connected to the memory capacitor C$_{M1}$ in parallel is formed by the n$^+$ source/drain regions 23 and 24 and the word line WL1$^B$, and the control transistor connected to the memory capacitor C$_{M2}$ in parallel is formed by the n$^+$ source/drain regions 24 and 25 and the word line WL2$^B$. Similarly, the control transistor connected to the memory capacitor C$_{M15}$ in parallel is formed by the n$^+$ source/drain regions 26 (not shown) and 27 and the word line WL15$^B$. The n$^+$ source/drain regions 23, 25, . . . , 26 are connected to bottom electrodes 42, 43, . . . , 44, which serve as the first or second electrode of each of the memory capacitors C$_{M0}$, C$_{M1}$, C$_{M2}$, . . . , C$_{M15}$. In addition, the read transistor Q$_{READ}$ is formed by the n$^+$ source/drain regions 31 and 32 and the polycrystalline silicon gate 531 or regions 32 and 33 and gate 532. The n$^+$ source/drain region 31 is formed along the row direction and served as the read output line SL$^B$, and the n$^+$ source/drain region 32 is formed along the row direction and served as the read power source line VL$^B$. The reference capacitor control transistor is formed by the n$^+$ source/drain regions 28 and 29 and the word line WR$^B$. The n$^+$ source/drain region 29 functions as a "plate line connectingpart", and is connected to the plate line PL. The plate line PL is also served as the bottom electrode 45 which functions as the fourth electrode of the reference capacitor C$_{REF}$. Even though the block [B] is mainly described, the block [A] is constituted in the same manner of the block [B].

As shown in FIG. 19A, one block [A] or block [B] sandwiched between the bit line connecting part and the plate line connecting part includes the block selecting transistor Q$_S$, the n memory capacitors C$_{M0}$, C$_{M1}$, C$_{M2}$, C$_{M3}$, . . . , C$_{M15}$, the n control transistors connected in parallel thereto, the read transistor Q$_{READ}$, the reference capacitor C$_{REF}$, and the reference capacitor control transistor. Since the dimension of the memory cell is 4F$^2$ and the dimension of a region other than the memory cell including the contact part per block is 28F$^2$, the dimension of one memory cell is (4+28/n)F$^2$. Since the ferroelectric capacitor has a remnant polarization of 20 $\mu$C/cm$^2$ in the first preferred embodiment, it is stably operated even if 16 memory cells are connected in series. Therefore, the dimension of one memory cell was 5.8 F$^2$.

FIG. 19B is a sectional view taken along line B–B' in the plan view of FIG. 19A. As shown in FIG. 19B, in the first preferred embodiment of a semiconductor integrated memory device according to the present invention, a p-well 12 is formed on a semiconductor substrate 11, and n$^+$ source/drain regions 21, 22, 23, . . . , 30 are formed on the surface of the p-well. Word lines BS$^B$, WL0$^B$, WL1$^B$, WL2$^B$, . . . , WL15$^B$, WR$^B$ and WR$^A$ serving as polycrystalline silicon gate electrodes are formed on a gate oxide film on the surface of the p-well 12. Furthermore, in the sectional view of FIG. 19B, a cross section of a wiring part of the polycrystalline silicon gate electrode 532 is also exposed. Although the polycrystalline silicon gate electrode shown in FIG. 19B is a single layer, a two-layer structure of a polycrystalline silicon gate layer and a W gate layer may be substituted for the single layer of the polycrystalline silicon gate layer. In addition to the W gate layer, a metal having a high melting point, such as Ti, Mo and Co, or a silicide of a metal having a high melting point, such as WSi$_2$, TiSi$_2$, MoSi$_2$ and CoSi$_2$, may be used.

The block selecting transistor Q$_S$ is formed by n$^+$ source/drain regions 21 and 22 and a word line BS$^B$. The control transistor connected to the memory capacitor C$_{M0}$ in parallel is formed by the n$^+$ source/drain regions 22 and 23 and the word line WL0$^B$. Moreover, the control transistor connected to the memory capacitor C$_{M1}$ in parallel is formed by the n$^+$ source/drain regions 23 and 24 and the word line WL1$^B$, and the control transistor connected to the memory capacitor C$_{M2}$ in parallel is formed by the n$^+$ source/drain regions 24 and 25 and the word line WL2$^B$. Similarly, the control transistor connected to the memory capacitor C$_{M15}$ in parallel is formed by the n$^+$ source/drain regions 26 (not shown) and 27 and the word line WL15$^B$. The reference capacitor control transistor is formed by the n$^+$ source/drain regions 28 and 29 and the word line WR$^B$. A first interlayer insulator film 13 of an oxide film (SiO$_2$ film), a PSG film, a BPSG film or a nitride film (Si$_3$N$_4$ film) is formed on the word lines BS$^B$, WL0$^B$, WL1$^B$, WL2$^B$, . . . , WL15$^B$, WR$^B$ and WR$^A$. On the first interlayer insulator film 13, the bottom electrodes 42, 43, . . . , 44 serving as the first or second electrode of each of the capacitors C$_{M0}$, C$_{M1}$, C$_{M2}$, C$_{M3}$, . . . , C$_{M15}$ are formed. Moreover, on the first interlayer insulator film 13, the bottom electrode 45 serving as the fourth electrode of the reference capacitor C$_{REF}$, which also serve as the plate line PL, is formed. The bottom electrodes 42, 43, . . . , and 45 are connected to the n+ source/drain regions 23, 25, ..., 29 by means of contact plugs 73, 75, and 80 which are formed so as to bury contact holes formed in the first interlayer insulator film 13. These contact plugs may be formed of a polycrystalline silicon containing impurities (a doped polycrystalline silicon), a metal of a high melting point, or a silicide of a metal of a high melting point. The bottom electrode 42 functions as the first electrode of the memory capacitor $C_{M0}$ and as the second electrode of the memory capacitor $C_{M0}$. The bottom electrode 43 functions as the first electrode of the memory capacitor $C_{M2}$ and as the second electrode of the memory capacitor $C_{M3}$. The bottom electrode 44 functions as the first electrode of the memory capacitor $C_{M14}$ and as the second electrode of the memory capacitor $C_{M15}$. Each of the bottom electrodes 42, 43, ..., 44, 45 may have a two-layer structure of a bottom barrier metal layer of (Ti, Al) N having a thickness of 10 nm, and a bottom electrode of $SrRuO_3$ having a thickness of 20 nm. On the bottom electrodes 42, 43, ..., 44, ferroelectric thin-films 51, 52, ..., 53 of Ba-rich BSTO thin-films having a thickness of, e.g., 25 nm, may be formed to be patterned. On the bottom electrode 45 of the reference capacitor $C_{REF}$, a paraelectric thin-film 54 of an Sr-rich BSTO thin-film having a thickness of 25 nm may be formed. Furthermore, as the paraelectric thin-film 54 for the reference capacitor $C_{REF}$, silicon oxide ($SiO_2$) or tantalum oxide ($Ta_2O_5$) may be used, or a ferroelectric thin-film may be used. A second interlayer insulator film 14 of an oxide film ($SiO_2$ film), a PSG film, a BPSG film or a nitride film ($Si_3N_4$ film) is formed on the first interlayer insulator film 13, on which the ferroelectric thin-films 51, 52, ..., 53 and the paraelectric thin-film 54 are not formed. On the second interlayer insulator film 14, top electrodes 61, 62, ..., and 63 are formed. The top electrode 61 functions as the second electrode of the memory capacitor $C_{M0}$. The top electrode 62 functions as the first electrode of the memory capacitor $C_{M1}$ and as the second electrode of the memory capacitor $C_{M2}$. The top electrode 63 functions as the first electrode of the memory capacitor $C_{M15}$ and as the third electrode of the reference capacitor $C_{REF}$. Each of the top electrodes 61, 62, ..., 63, 64 may have a two-layer structure of a top electrode of $SrRuO_3$ film having a thickness of 20 nm and a top barrier metal layer of (Ti, Al) N having a thickness of 10 nm formed thereon. The top electrodes 61, 62, ..., and 63 are connected to the n+ source/drain regions 22, 24, ..., 27 and 28 by means of contact plugs 72, 74, 77 and 79 which are formed so as to bury contact holes passing through the first interlayer insulator film 13 and the second interlayer insulator film 14. These contact plugs 72, 74, 63, 79 and 81 may be formed of a doped polycrystalline silicon, a metal of a high melting point, a silicide of a metal of a high melting point or the like. Moreover, the top electrode 63 is connected to a wiring part 532 of a polycrystalline silicon gate electrode of the read transistor $Q_{READ}$ via a contact plug 78 which passes through the first interlayer insulator film 13 and the second interlayer insulator film 14. In order to provide the contact plug 78, the interconnect part 532 of the polycrystalline silicon gate electrode is patterned thickly by a polycrystalline silicon gate electrode of a device part. On the top electrodes 61, 62, ..., and 63, a third interlayer insulator film 15 of an oxide film ($SiO_2$ film), a PSG film, a BPSG film or a nitride film ($Si_3N_4$ film) is formed. On the third interlayer insulator film 15, a bit line 16 is formed. The bit line 16 is connected to the n+ source/drain region 21 via a bit line contact plug 71 which passes through the first through third interlayer insulator films 13, 14 and 15. The bit line contact plug 71 may be formed of a doped polycrystalline silicon, a metal of a high melting point, a silicide of a metal of a high melting point. Moreover, on the bit line 16, a passivation film, such as an oxide film ($SiO_2$ film), a PSG film, a BPSG film, a nitride film ($Si_3N_4$ film) or a polyimide film, is preferably formed. Even though the block [B] is mainly described, the block [A] is constituted in the same manner of the block [B].

With this circuit construction, the operation of a very high density integrated non-volatile memory could be confirmed.

(Second Preferred Embodiment)

Figure 20:
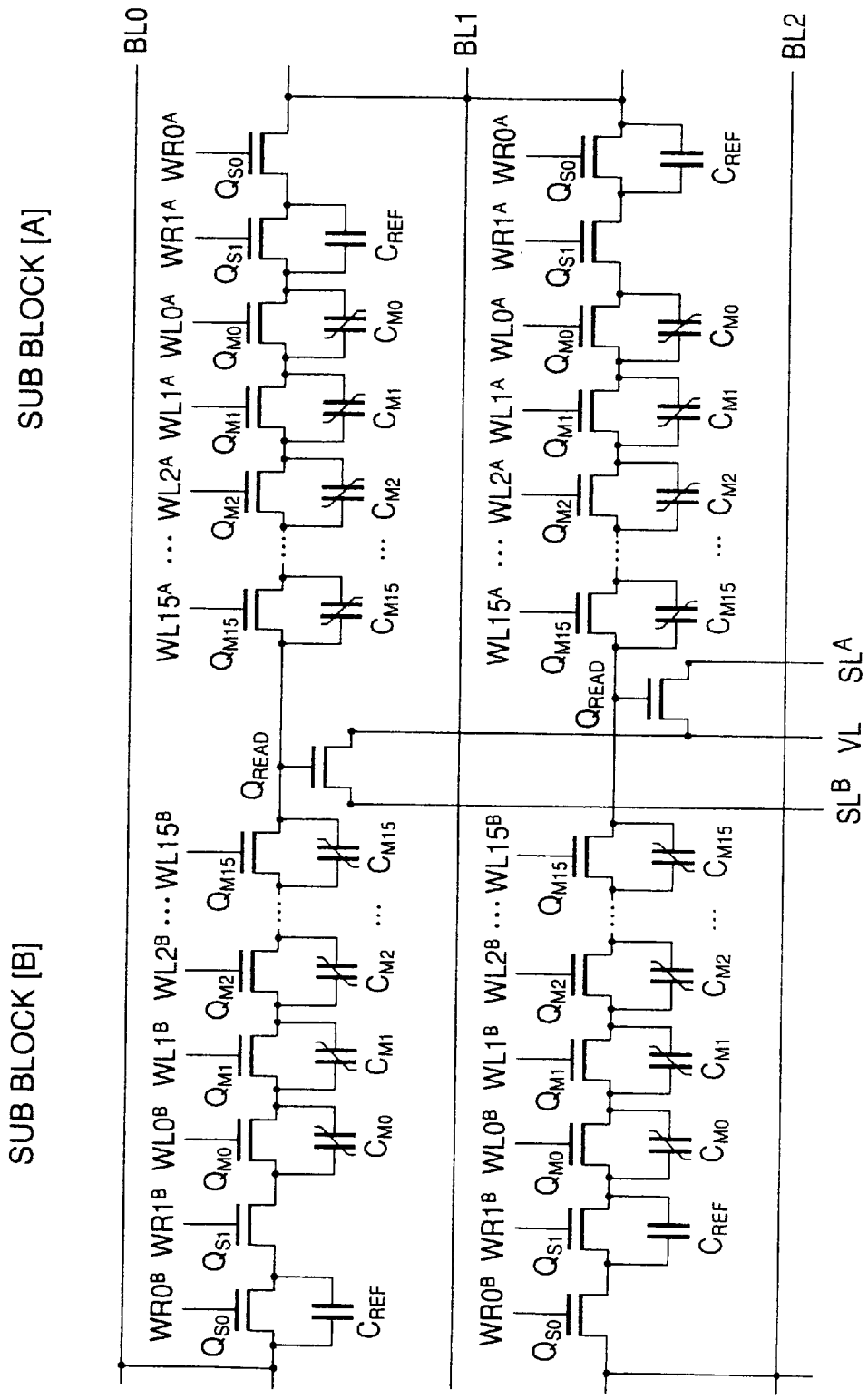
FIG. 20 is a circuit diagram showing a principal part of the second preferred embodiment of a semiconductor integrated memory device according to the present invention.
Figure 21:
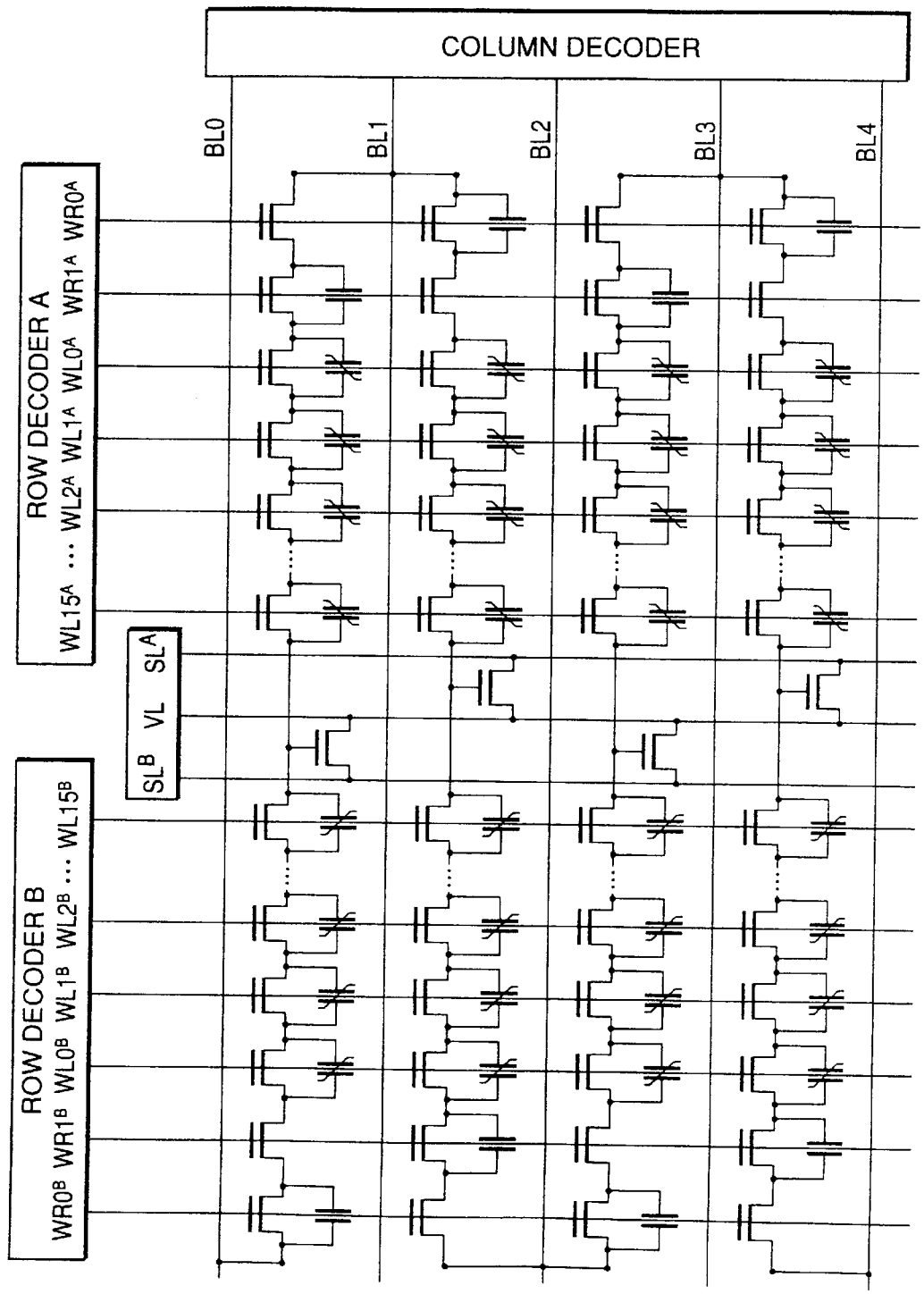
FIG. 21 is a circuit diagram showing the detail of the principal part of the second preferred embodiment of a semiconductor integrated memory device according to the present invention.

FIG. 20 is a circuit diagram of a principal part of the second preferred embodiment of a semiconductor integrated memory device according to the present invention, and FIG. 21 is a circuit diagram of the principal part which includes peripheral circuits similar to FIG 17. In this second preferred embodiment, the plate line in the first preferred embodiment is not used, and an operating voltage is applied to between the adjacent bit lines. As shown in FIG. 20, the second preferred embodiment of a semiconductor integrated memory device according to the present invention has, as a basic unit, a sub-block including: a memory cell column (a memory cell chain) which comprises a plurality of memory capacitors $C_{M0}$, $C_{M1}$, $C_{M2}$, ..., $C_{M15}$ connected in series, and control transistors, each of which is connected to a corresponding one of the memory capacitors $C_{M0}$, $C_{M1}$, $C_{M2}$, ..., $C_{M15}$; "a series circuit of a reference cell and a selection transistor (a block selecting transistor) $Q_S$", which is connected to one end of the memory cell chain; and a read transistor $Q_{READ}$ having a gate electrode connected to the other end of the memory cell chain. As described above, the "reference cell" comprises a parallel circuit of a reference capacitor $C_{REF}$ and a reference capacitor control transistor. Each of the memory capacitors $C_{M0}$, $C_{M1}$, $C_{M2}$, ..., $C_{M15}$ has at least a first electrode, a second electrode facing the first electrode, and a ferroelectric thin-film sandwiched between the first and second electrodes. The reference capacitor $C_{REF}$ has at least a third electrode, a fourth electrode facing the third electrode, and a dielectric thin-film sandwiched between the third and fourth electrodes. The "series circuit of the reference cell and the selection transistor (the block selecting transistor) $Q_S$" may be any one of two cases where the third electrode of the reference capacitor $C_{REF}$ is connected to the first electrode of the memory capacitor $C_{M0}$ and where the block selecting transistor $Q_S$ is connected to the first electrode of the memory capacitor $C_{M0}$.

The second preferred embodiment of a semiconductor integrated memory device according to the present invention has a plurality of memory cell blocks, which are arranged in the form of a matrix and each of which is the same as the aforementioned memory block, and is divided into two sub-blocks, a sub-block [A] on the right side and a sub-block [B] on the left side, with respect to one read transistor $Q_{READ}$. FIG. 20 shows only four sub-blocks in total, two sub-blocks [A] and tow sub-blocks [B]. In the sub-blocks [A] of the first stage column and the sub-blocks [B] of the second stage column in FIG. 20, the third electrode of the reference capacitor $C_{REF}$ is connected to the first electrode of the memory capacitor $C_{M0}$. On the other hand, in the sub-blocks [A] of the second stage column and the sub-blocks [B] of the first stage column, the block selecting transistor $Q_S$ is connected to the first electrode of the memory capacitor $C_{M0}$. The fourth electrode of the reference capacitor $C_{REF}$ of the sub-block [B] of the first stage column is connected to the bit line BL0. The fourth electrode of the reference capacitor $C_{REF}$ of the sub-block [A] of the second stage column, and the block selecting transistor $Q_S$ of the sub-block [A] of the first stage column are connected to the bit line BL1. Moreover, the fourth electrodes of the reference capacitors $C_{REF}$ of the sub-block [B] of the second stage column is connected to the bit line BL2.

The gate electrodes of the block selecting transistors $Q_S$ of the first stage column of the sub-block [A], and the gate electrodes of the reference capacitor control transistor of the second stage column of the sub-block [A] are connected to word lines $WR0^A$, respectively. In addition, the gate electrodes of the reference capacitor control transistor of the first stage column of the sub-block [A], and the block selecting transistors $Q_S$ of the second stage column of the sub-block [A] are connected to word lines $WR1^A$, respectively. On the other hand, the gate electrodes of the reference capacitor control transistor of the first stage column of the sub-block [B], and the gate electrodes of the block selecting transistors $Q_S$ of the second stage column of the sub-block [B] are connected to word lines $WR0^B$, respectively. In addition, the gate electrodes of the block selecting transistors $Q_S$ of the first stage column of the sub-block [B], and the gate electrodes of the reference capacitor control transistor of the second stage column of the sub-block [B] are connected to word lines $WR1^B$, respectively.

The gate electrodes of the control transistors connected to the respective memory capacitors $C_{M0}, C_{M1}, C_{M2}, \ldots, C_{M15}$ of the sub-block [A] in parallel are connected to word lines $WL0^A, WL1^A, WL2^A, \ldots, WL15^A$, respectively. Similarly, the gate electrodes of the control transistors connected to the respective memory capacitors $C_{M0}, C_{M1}, C_{M2}, \ldots, C_{M15}$ of the sub-block [B] in parallel are connected to word lines $WL0^B, WL1^B, WL2^B, \ldots, WL15^B$, respectively. One of main electrodes of the read transistor $Q_{READ}$ arranged between the sub-blocks [A] and [B] is connected to a read power source line VL, and the other main electrode is connected to a read output line SL. This embodiment provides two pairs of read output lines, in which each of read output lines is alternatively connected to each column. In FIG. 20, while the control transistors connected to the respective memory capacitors $C_{M0}, C_{M1}, C_{M2}, \ldots, C_{M15}$ in parallel, the read transistors $Q_{READ}$, the block selecting transistors $Q_S$, and the reference capacitor control transistors are shown as nMOSFETs, these transistors may be formed of a pMOSFET.

Figure 22:
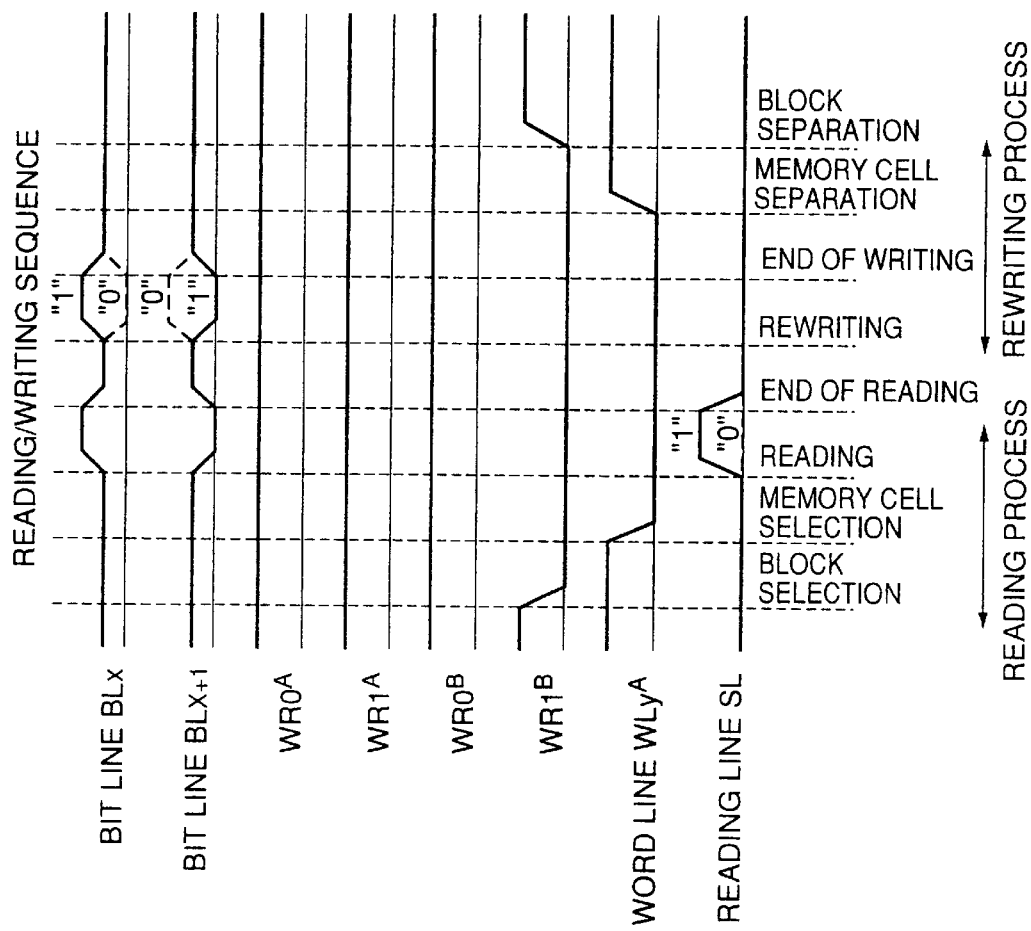
FIG. 22 is a timing chart showing a read/write sequence in the second preferred embodiment of a semiconductor integrated memory device according to the present invention.

FIG. 22 shows a read/write sequence in the second preferred embodiment of a semiconductor integrated memory device according to the present invention. In the second preferred embodiment of a semiconductor integrated memory device according to the present invention, an operating voltage is applied to between the adjacent bit numbers BLx and BLx+1 in the circuit of FIGS. 20 and 21. Therefore, the block selecting transistor QS and the reference capacitor control transistor are alternately driven by a single word line for each column.

As an example, considering the case where the memory capacitor $C_{M1}$ of the second stage column positioned at the intersection between the bit line and word line $WL1^A$ of the sub-block is selected. The word lines $WR0^A$ and $WR1^A$ of the sub-block [A] are set to be "1", and the reference capacitor control transistor and the block selecting transistor $Q_S$ of the sub-block [A] of the second stage column are turned on. Simultaneously, the word line $WR0^B$ of the sub-block [B] is set to be "1", and the block selecting transistor $Q_S$ of the sub-block [B] of the second stage column is turned on. At this time, only the word line $WR1^B$ of the sub-block [B] is set to be "0". That is, only the reference capacitor control transistor of the sub-block [B] of the second stage column is turned off, and this reference capacitor $C_{REF}$ is selected. This state corresponds to the case where the block selecting transistor $Q_S$ is turned on in the equivalent circuit of FIG. 8. Then, only $WL1^A$ is set to be "0", and other $WL^A$ are set to be "1" to select the memory capacitor $C_{M1}$ of the second stage column. This state corresponds to the case where the control transistor connected to the memory capacitor $C_M$ in parallel is turned off in the equivalent circuit of any one of FIGS. 1 and 7A through 7C. That is, there is provided an equivalent circuit, which comprises: a memory capacitor $C_M$ having at least a first electrode, a second electrode, and a ferroelectric thin-film sandwiched between the first and second electrodes; a reference capacitor $C_{REF}$ having at least a third electrode connected to the first electrode of the memory capacitor $C_M$, a fourth electrode facing the third electrode, and a dielectric thin-film sandwiched between the third and fourth electrodes; and a read transistor $Q_{READ}$ having a gate electrode connected to the first electrode of the memory capacitor $C_M$ and the third electrode of the reference capacitor $C_{REF}$. In this state, a read/write voltage may be applied to between the bit lines BL1 and BL2. That is, if the bit line BL1 is set to be "1" and the bit line BL2 is set to be "0", a voltage of "1" can be applied to between the memory capacitor $C_{M1}$ and the reference capacitor $C_{REF}$.

At this time, a voltage is also applied to between the bit lines BL0–BL1 and between bit lines BL2–BL3. However, since the word line $WR1^B$ is set to be "0", the block selecting transistors $Q_S$ of the sub-blocks [B] of the first and third stage column are in OFF state, so that no voltage is applied to the memory capacitors $C_{M1}$ of the first and third stage columns. That is, since the block selecting transistors $Q_S$ of the upper and lower columns with respect to a target column are OFF, the voltage applied to the bit line is not applied to the blocks of the adjacent columns.

In addition, when the memory cell of the sub-block [B] is selected, the reference capacitor of the sub-block [A] is selected, and it is possible to achieve the case where the control transistor connected to the memory capacitor $C_M$ in parallel is OFF in the equivalent circuit of any one of FIGS. 1 and 7A through 7C.

In the second preferred embodiment of a semiconductor integrated memory device according to the present invention, since the voltage can be applied to between the adjacent two bit lines, there is an advantage in that a voltage of $\pm V_C$ can be substantially applied to a cell. In addition, the write operation is also carried out via the reference capacitor $C_{REF}$. Other operations are substantially the same as those in the first preferred embodiment of a semiconductor integrated memory device according to the present invention.

Figure 23A:
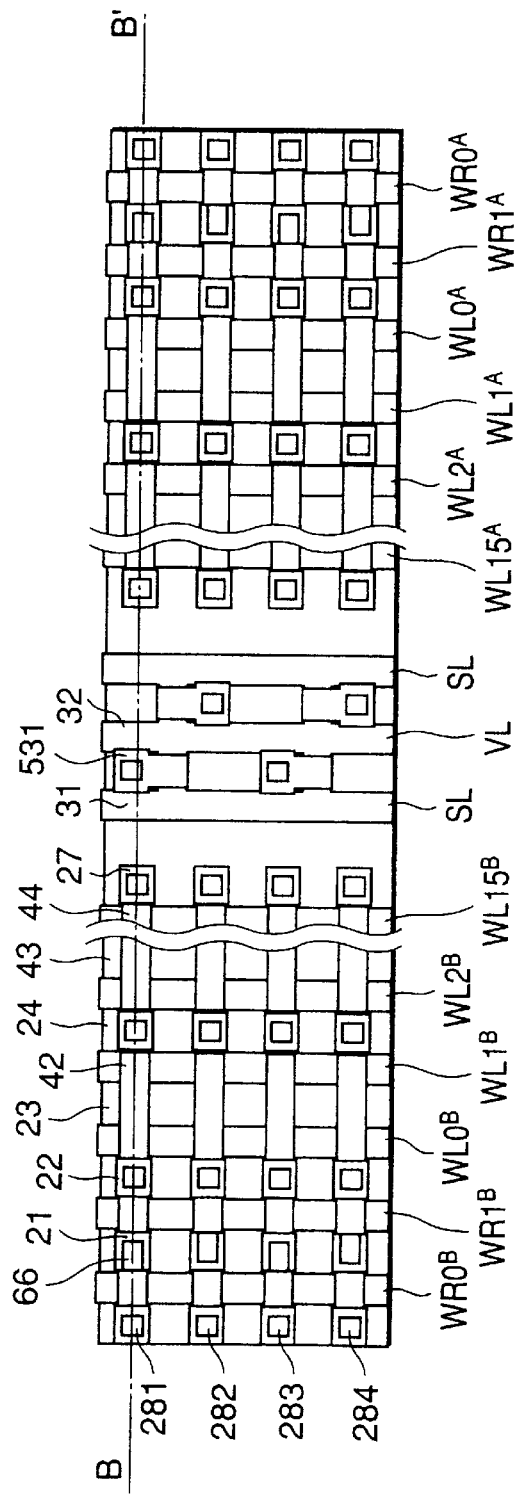
FIG. 23A is a plan view of a modification of the second preferred embodiment of a semiconductor integrated memory device according to the present invention.
Figure 23B:
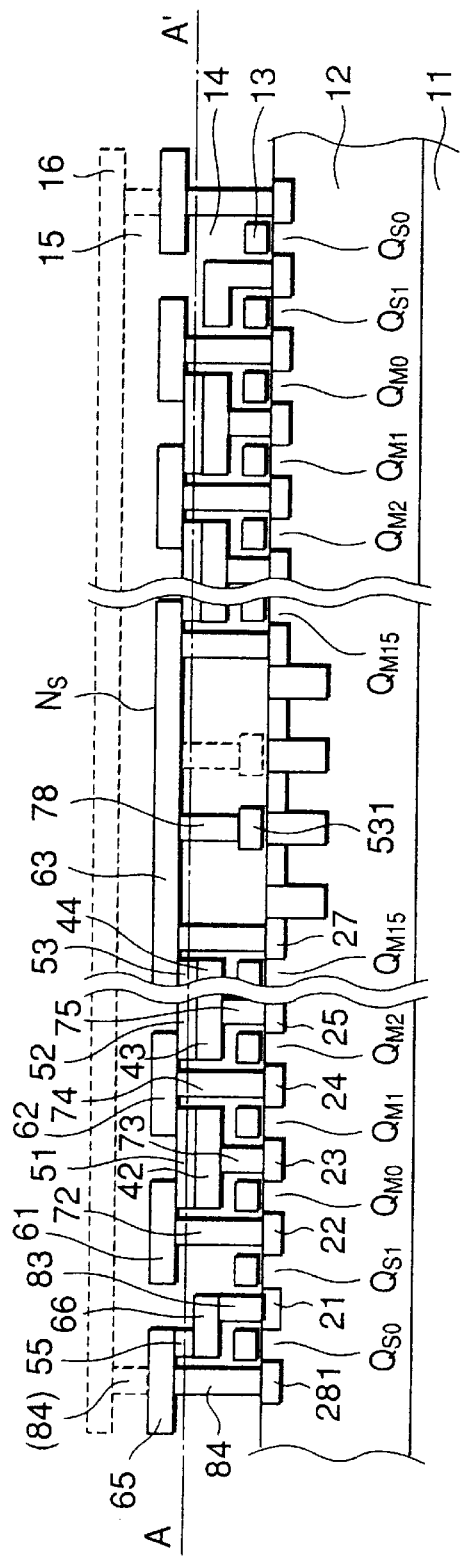
FIG. 23B is a sectional view thereof.

FIG. 23A is a plan view showing memory blocks A–A' plane in FIG. 23B, which shows only an underlayer lower than the level of, for simple explanation. In FIG. 23A, the reference capacitor control transistor of the sub-block [B] is formed by n source/drain regions 281 and 21 and a word line $WR0^B$. The n+ source/drain region 281 also functions as a connection part to a bit line BL0. The n+ source/drain region 21 is connected to a bottom electrode 66 serving as a fourth electrode of the reference capacitor $C_{REF}$. The block selecting transistor $Q_{CT}$ is formed by the n+ source/drain regions 21 and 22 and a word line $WR1^B$ serving as a polycrystalline silicon gate electrode. Similarly, the control transistor connected to the memory capacitor $C_{M0}$ in parallel is formed by the n+ source/drain regions 22 and 23 and the word line $WR0^B$ serving as a polycrystalline silicon gate electrode. Moreover, the control transistor connected to the memory capacitor $C_{M1}$ in parallel is formed by the n+ source/drain regions 23 and 24 and the word line $WL1^B$, the control transistor connected to the memory capacitor $C_{M15}$ in parallel is formed by the n$^+$ source/drain regions 26 (not shown) and 27 and the word line WL15$^B$. The n$^+$ source/drain regions 23, 25, are connected to bottom electrodes 42, 43, . . . , 44, each of which serves as the first or second electrode of each of the memory capacitors $C_{M0}$, $C_{M1}$, $C_{M2}$, $C_{M3}$, . . . , $C_{M15}$. In addition, the read transistor $Q_{READ}$ is formed by the n$^+$ source/drain regions 31 and 32 and the polycrystalline silicon gate 531. The n$^+$ source/drain regions 31, 32 are formed in parallel with the word line and the read power source line VL. The n$^+$ source/drain region 282 of the block selecting transistor $Q_{S0}$ of the second stage column and the n$^+$ source/drain region 283 of the reference capacitor control transistor of the third stage column are connected to each other by means of a connection electrode (not shown). Even though the block [B] is mainly described, the block [A] is constituted in the same manner of the block [B].

As shown in FIG. 23A, the sub-block [A] or the sub-block [B] of each column includes the block selecting transistor $Q_S$, the n memory capacitors $C_{M0}$, $C_{M1}$, $C_{M2}$, $C_{M3}$, . . . , $C_{M15}$, the n control transistors connected in parallel thereto, the read transistor $Q_{READ}$, the reference capacitor $C_{REF}$, and the reference capacitor control transistor. Since the dimension of one memory cell is 4F$^2$ and the dimension of a region other than the memory cell including the contact part per sub-block is 16F$^2$, the dimension of one memory cell is (4+16/n)F$^2$. In the second preferred embodiment of a semiconductor integrated memory device according to the present invention, the ferroelectric capacitor has a remnant polarization of 20 $\mu$C/cm$^2$, so that it is stably operated even if 16 memory cells are connected in series. Therefore, the dimension of one memory cell was 5.0 F$^2$.

FIG. 23B is a sectional view taken along line B–B' in the plan view of FIG. 23A. As shown in FIG. 23B, in the second preferred embodiment of a semiconductor integrated memory device according to the present invention, a p-well 12 is formed on a semiconductor substrate 11, and n$^+$ source/drain regions 281, 21, 22, 23, . . . , 27 are formed on the surface of the p-well 12. Word lines WR0$^B$, WR1$^B$, WL0$^B$, WL1$^B$, WL2$^B$, . . . , WL15$^B$ serving as polycrystalline silicon gate electrodes are formed on a gate oxide film on the surface of the p-well 12. Furthermore, in the sectional view of FIG. 20, the cross section of the wiring part of the polycrystalline silicon gate electrode 531 forming the read transistor $Q_{READ}$ is also exposed. In place of the polycrystalline silicon gate electrode, a metal having a high melting point, such as W, Ti, Mo and Co, or a silicide of a metal having a high melting point, such as WSi$_2$, TiSi$_{21}$ MoSi$_2$ and CoSi$_2$, may be used.

The reference capacitor control transistor of the sub-block [B] is formed by the n$^+$ source/drain regions 281 and 21 and the word line WR0$^B$. In addition, the block selecting transistor $Q_{S1}$ is formed by the n$^+$ source/drain regions 21 and 22 and the word line WR1$^B$. The control transistor connected to the memory capacitor $C_{M0}$ in parallel is formed by the n$^+$ source/drain regions 22 and 23 and the word line WL0$^B$. Moreover, the control transistor connected to the memory capacitor $C_{M1}$ in parallel is formed by the n$^+$ source/drain regions 23 and 24 and the word line WL1$^B$, and the control transistor connected to the memory capacitor $C_{M2}$ in parallel is formed by the n$^+$ source/drain regions 24 and 25 and the word line WL2$^B$. Similarly, the control transistor connected to the memory capacitor $C_{M15}$ in parallel is formed by the n$^+$ source/drain regions 26 (not shown) and 27 and the word line WL15$^B$. In addition, the read transistor $Q_{READ}$ is formed by the n$^+$ source/drain regions 31 and 32, which are not exposed to the cross section taken along line B–B', and the polycrystalline silicon gate electrode 531. A first interlayer insulator film 13 of an oxide film (SiO$_2$ film), a PSG film, a BPSG film or a nitride film (Si$_3$N$_4$ film) is formed on the word lines WR0$^B$, WR1$^B$, WL0$^B$, WL1$^B$, WL2$^B$, . . . , WL15$^B$ and the polycrystalline silicon gate electrode 531. On the first interlayer insulator film 13, the bottom electrode 66 serving as the fourth electrode of the reference capacitor $C_{REF}$, and the bottom electrodes 42, 43, . . . , 44, each of which serves as the first or second electrode of each of the memory capacitors $C_{M0}$, $C_{M1}$, $C_{M2}$, $C_{M3}$, . . . , $C_{M15}$ are formed. The bottom electrodes 66, 42, 43, . . . , 44 are connected to the n+source/drain regions 21, 23 and 25 by means of contact plugs 83, 73 and 75 which are formed so as to bury contact holes formed in the first interlayer insulator film 13. These contact plugs may be formed of a doped polycrystalline silicon, a metal having a high melting point, or a silicide of a metal having a high melting point. The bottom electrode 66 functions as the third electrode of the reference capacitor $C_{REF}$, and also the bottom electrode 42 functions as the second electrode of the memory capacitor $C_{M0}$ and the first electrode of the memory capacitor $C_{M1}$. The bottom electrode 43 functions as the second electrode of the memory capacitor $C_{M2}$ and as the first electrode of the memory capacitor $C_{M3}$. The bottom electrode 44 functions as the second electrode of the memory capacitor $C_{M14}$ and as the first electrode of the memory capacitor $C_{M15}$. On the bottom electrodes 42, 43, . . . , 44, ferroelectric thin-films 51, 52, . . . , 53 of Ba-rich BSTO thin-films or the like may be formed to be patterned. On the bottom electrode 66 of the reference capacitor $C_{REF}$, a paraelectric thin-film 55 may be formed. Furthermore, the paraelectric thin-film 55 of the reference capacitor $C_{REF}$ may be formed. Furthermore, a paraelectric thin-film for the reference capacitor $C_{REF}$ may be used. A second interlayer insulator film 14 of an oxide film (SiO$_2$ film) or the like is formed on the first interlayer insulator film 13, on which the paraelectric thin-film 55 and the ferroelectric thin-films 51, 52, . . . , 53 are not formed. On the second interlayer insulator film 14, top electrodes 65, 61, 62, . . . , 63 are formed. The top electrode 65 functions as the fourth electrode of the reference capacitor $C_{REF}$. The top electrode 61 functions as the first electrode of the memory capacitor $C_{M0}$. The top electrode 62 functions as the second electrode of the memory capacitor $C_{M1}$ and as the first electrode of the memory capacitor $C_{M2}$. The top electrode 63 functions as the second electrode of the memory capacitor $C_{M15}$. The top electrodes 65, 61, 62, . . . , 63 are connected to the n$^+$ source/drain regions 281, 22, 24, . . . , 27 by means of contact plugs 82, 72, 74 and 77 which are formed so as to bury contact holes passing through the first interlayer insulator film 13 and the second interlayer insulator film 14. These contact plugs 82, 72, 74 and 77 may be formed of a doped polycrystalline silicon, a metal having a high melting point, a silicide of a metal having a high melting point or the like. Moreover, the top electrode 63 is connected to a wiring part 531 of a polycrystalline silicon gate electrode of the read transistor $Q_{READ}$ via a contact plug 78 which passes through the first interlayer insulator film 13 and the second interlayer insulator film 14. On the top electrodes 65, 61, 62, . . . , 63, a third interlayer insulator film of an oxide film (SiO$_2$ film) or the like is formed. On the third interlayer insulator film 15, a bit line 16 is formed. The bit line 16 is connected to the top electrode 65 via a bit line contact plug 84 which passes through the third interlayer insulator films 15. The bit line contact plug 84 may be formed of a doped polycrystalline silicon, a metal having a high melting point, or a silicide of a metal having a high melting point. Moreover, on the bit line 16, a passivation film, such as an oxide film (SiO₂ film), a PSG film, a BPSG film, a nitride film (Si₃N₄ film) or a polyimide film, is preferably formed, although this is not shown.

With the circuit construction shown in FIG. 23B, which is a sectional view corresponding to the plan view of FIG. 23A, the operation of a very high density integrated non-volatile memory could be confirmed.

(Third Preferred Embodiment)

Figure 24:
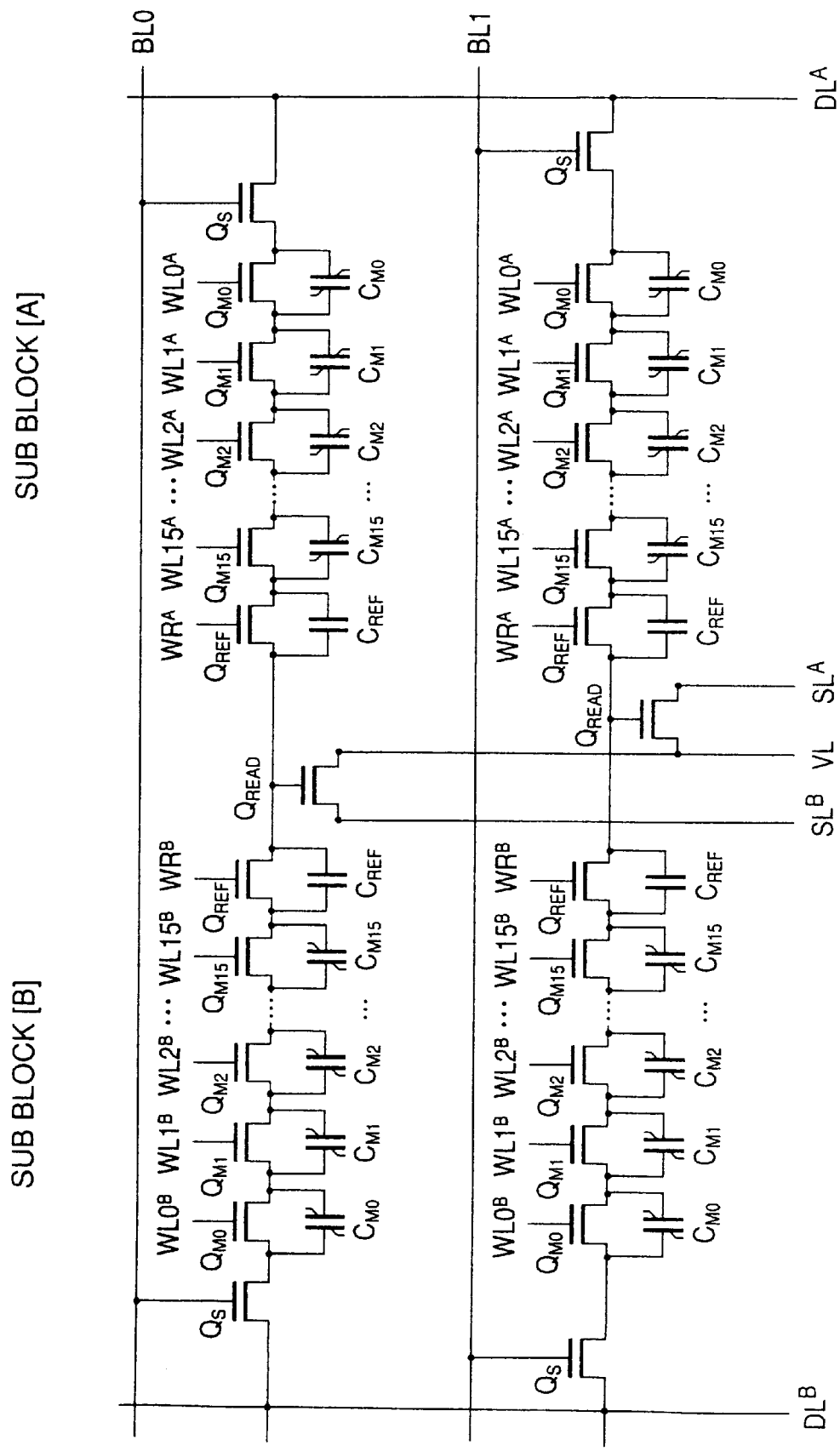
FIG. 24 is a circuit diagram showing a principal part of the third preferred embodiment of a semiconductor integrated memory device according to the present invention.
Figure 25:
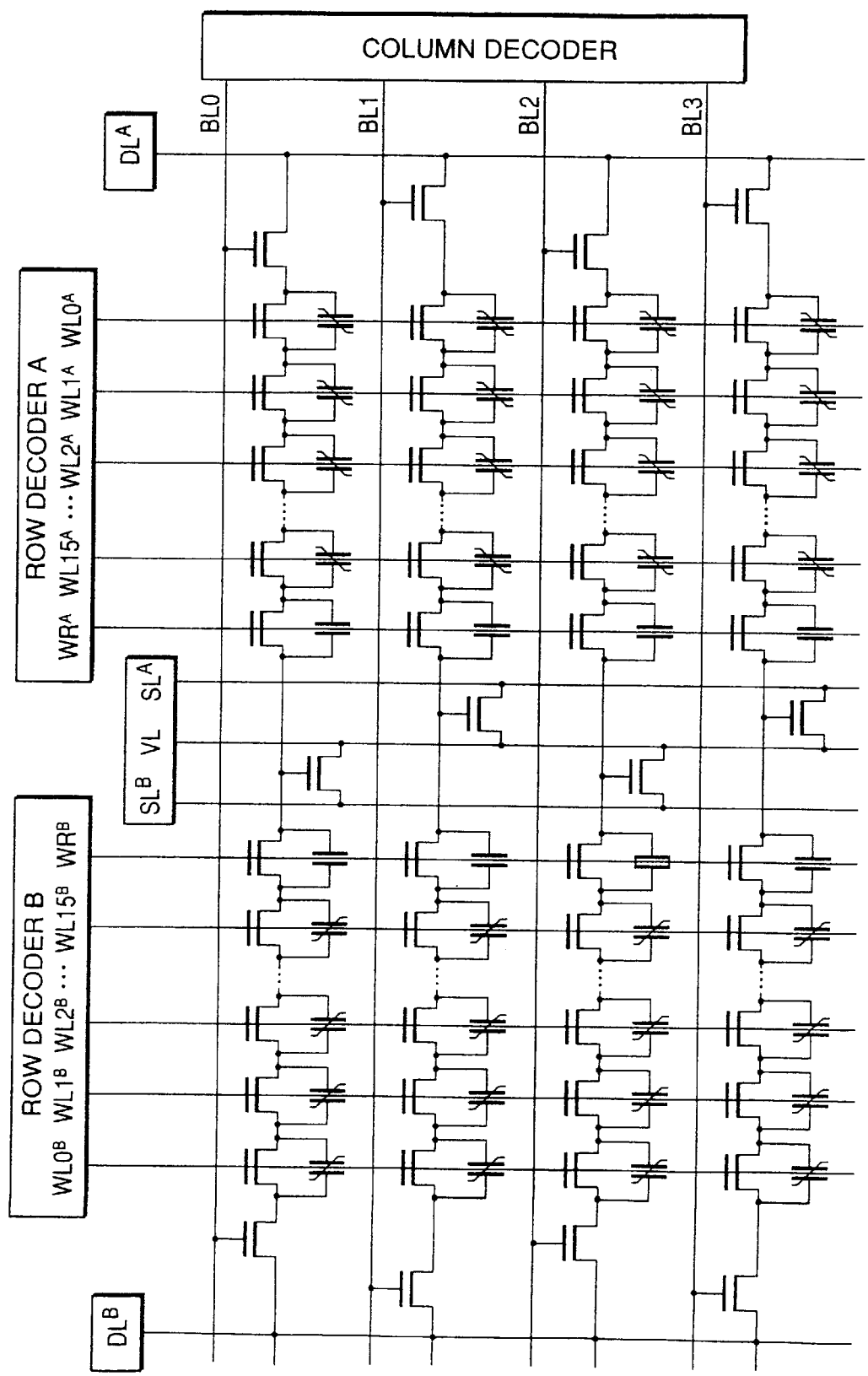
FIG. 25 is a circuit diagram showing the detail of the principal part of the third preferred embodiment of a semiconductor integrated memory device according to the present invention.

FIG. 24 is a circuit diagram of a principal part of the third preferred embodiment of a semiconductor integrated memory device according to the present invention, and FIG. 25 is a detailed circuit diagram of the principal part of the semiconductor integrated memory device, which includes peripheral circuits. In the third preferred embodiment of a semiconductor integrated memory device according to the present invention, one block sandwiched between a pair of drive lines ($DL^A$ and $DL^B$) is divided into two sub-blocks with respect to one read transistor.

As shown in FIG. 24, the third preferred embodiment of a semiconductor integrated memory device according to the present invention has, as a basic unit, a memory cell block comprising: a memory cell column (a memory cell chain), which comprises a plurality of memory capacitors $C_{M0}$, $C_{M1}$, $C_{M2}$, $C_{M3}$, ..., $C_{M15}$ connected in series, and control transistors, each of which is connected to a corresponding one of the memory capacitors $C_{M0}$, $C_{M1}$, $C_{M2}$, $C_{M3}$, ..., $C_{M15}$ in parallel; a reference cell connected to the memory capacitor $C_{M15}$ arranged at one end of the memory cell chain; a read transistor $Q_{READ}$ having a gate electrode connected to the reference cell; and (a block selecting transistor) $Q_S$ connected to the memory capacitor $C_{M0}$ arranged at other end of the memory cell chain. The "reference cell" comprises a parallel circuit of a reference capacitor $C_{REF}$ and a reference capacitor control transistor. Each of the memory capacitors $C_{M0}$, $C_{M1}$, $C_{M2}$, $C_{M3}$, ..., $C_{M15}$ has at least a first electrode, a second electrode facing the first electrode, and a ferroelectric thin-film sandwiched between the first and second electrodes. The reference capacitor $C_{REF}$ has at least a third electrode electrically connected to the first electrode of the memory capacitor $C_{M15}$, a fourth electrode facing the third electrode, and a dielectric thin-film sandwiched between the third and fourth electrodes. The second preferred embodiment of a semiconductor integrated memory device according to the present invention has a plurality of memory cell blocks, which are arranged in the form of a matrix and each of which is the same as the aforementioned memory block. FIG. 24 shows only eight sub-blocks in total, four sub-blocks [A] and four sub-blocks [B]. The block selecting transistor $Q_S$ of the sub-block [A] of the second stage column and the block selecting transistor $Q_S$ of the sub-block [B] of the first stage column is connected to a bit line BL0. Similarly, the fourth electrode of the block selecting transistor $Q_S$ of the sub-block [A] of the second stage column, and the block selecting transistor $Q_S$ of the sub-block [B] of the second stage column are connected to a bit line BL1. Moreover, two block selecting transistors $Q_S$ of each of the third and fourth stage columns are connected to bit lines BL2 and BL3, respectively. One main electrode, which is not connected to the memory cell of the block selecting transistor $Q_S$ of the sub-block [A], is connected to a drive line $DL^A$, and the other main electrode, which is not connected to the memory cell of the block selecting transistor $Q_S$ of the sub-block [B], is connected to a drive line $DL^B$.

The gate electrodes of the control transistors connected to the respective memory capacitors $C_{M0}$, $C_{M1}$, $C_{M2}$, $C_{M3}$, ..., $C_{M15}$ of the sub-block [A] in parallel are connected to word lines $WL0^A$, $WL1^A$, $WL2^A$, ..., $WL15^A$, respectively. Similarly, the gate electrodes of the control transistors connected to the respective memory capacitors $C_{M0}$, $C_{M1}$, $C_{M2}$, $C_{M3}$, ..., $C_{M15}$ of the sub-block [B] in parallel are connected to word lines $WL0^B$, $WL1^B$, $WL2^B$, ..., $WL15^B$, respectively. The gate electrode of the reference capacitor control transistor of the sub-block [A] is connected to a word line $WR^A$, and the gate electrode of the reference capacitor control transistor of the sub-block [B] is connected to a word line $WR^B$. One of main electrodes of read transistors $Q_{BREAD}$ of the first and third stage columns is connected to a read power source line VL, and the other main electrode is connected to a read output line $SL^A$. On the other hand, one of main electrodes of read transistors $Q_{READ}$ of the second and fourth stage columns is connected to the read power source line VL, and the other main electrode is connected to a read output line $SL^B$. In FIG. 24, while the control transistors connected to the respective memory capacitors $C_{M0}$, $C_{M1}$, $C_{M2}$, $C_{M3}$, ..., $C_{M15}$ in parallel, the read transistors $Q_{AREAD}$, $Q_{BREAD}$, the block selecting transistors $Q_S$, and the reference capacitor control transistors are shown as nMOSFETs, these transistors may be formed of a pMOSFET.

Figure 26:
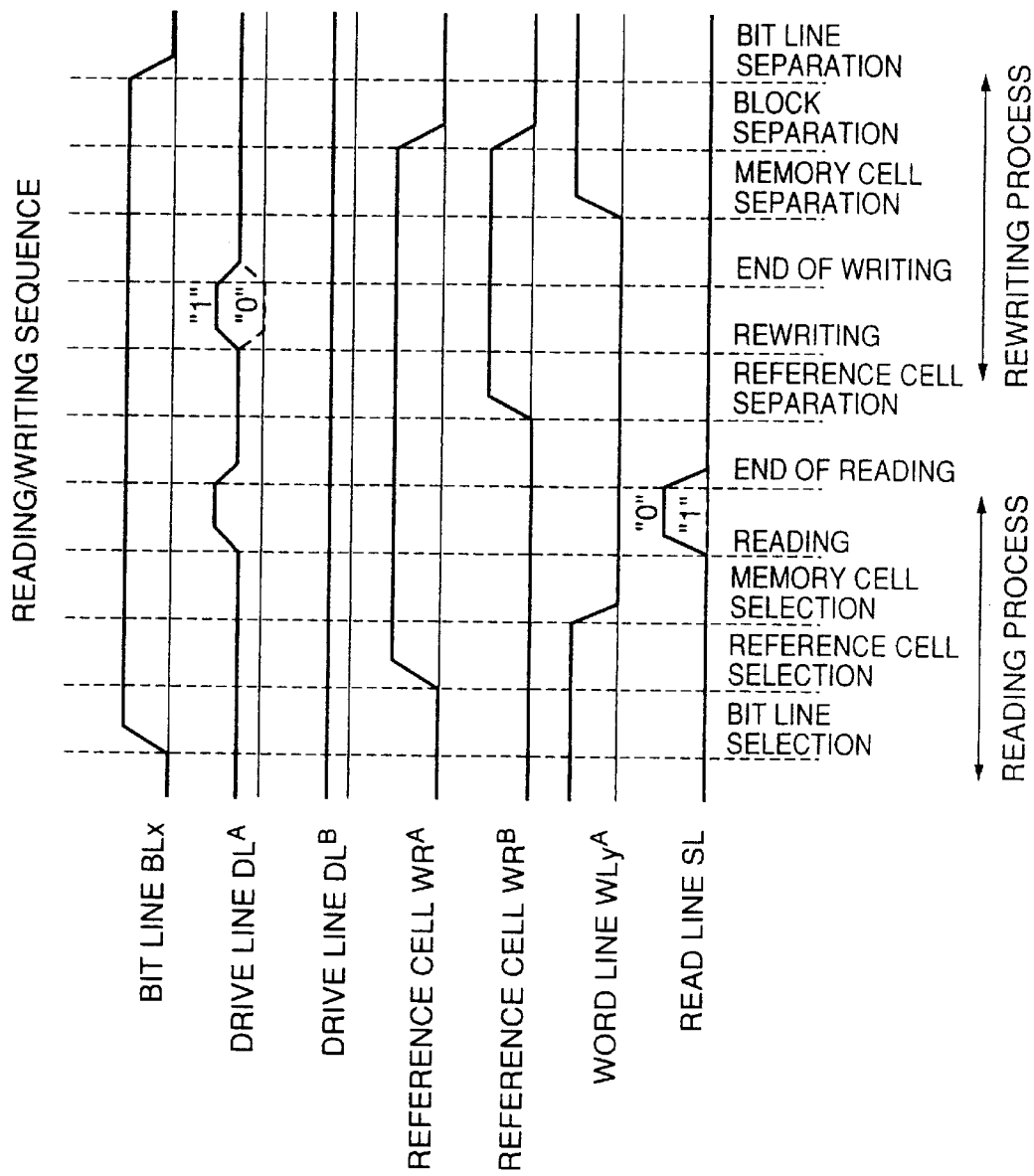
FIG. 26 is a timing chart showing a read/write sequence in the third preferred embodiment of a semiconductor integrated memory device according to the present invention.

FIG. 26 shows a read/write sequence in the third preferred embodiment of a semiconductor integrated memory device according to the present invention. In the third preferred embodiment of a semiconductor integrated memory device according to the present invention, bit numbers BLx serve to select blocks along a specific column, and a read/write voltage is applied via adjacent two drive lines $DL^A$ and $DL^B$. Furthermore, although a voltage is also applied to the adjacent block on the opposite side, there is no problem if the word line $WR^A$ or the word line $WR^B$ is set to be "0" and the reference capacitor control transistor in that block is turned off.

In addition, when the memory cell of the sub-block [A] is selected, the reference capacitor of the sub-block [B] is selected, and when the memory cell of the sub-block [B] is selected, the reference capacitor of the sub-block [A] is selected.

In the third preferred embodiment, since a voltage can be applied to between two drive lines $DL^A$ and $DL^B$, there is an advantage in that a voltage of $\pm V_C$ can be substantially applied to a cell. Other advantages are substantially the same as those in the first preferred embodiment.

For example, in the circuit construction of FIG. 24, in order to select the memory capacitor $C_{M1}$ of the second stage column designated by the intersection between BL1 and $WL1^A$ in the sub-block [A], both of the block selecting transistors $Q_S$ of the sub-blocks [A] and [B] are turned on. Then, the word line $WR^A$ is set to be "1" to select the reference capacitor $C_{REF}$ of the sub-block [A]. Then, only $WL1^A$ of the sub-block [A] is set to be "0", and only other $WL^A$ are set to be "1", so that the memory cell $C_{M1}$ of the second stage column can be selected. Then, if a voltage is applied to between two drive lines $DL^A$ and $DL^B$ while the memory cell $C_{M1}$ is selected, it is possible to read a signal to the read output line $SL^A$.

FIG. 27A is a plan view showing memory blocks, which shows only an underlayer lower than A–A' plane in FIG. 27B, for simple explanation. In FIG. 27A, the block selecting transistor $Q_S$ is formed by n⁺ source/drain regions 321 and 22 and a polycrystalline silicon gate electrode 331. The n⁺ source/drain region 321 functions as a connection part to a drive line. Moreover, the control transistor connected to the memory capacitor $C_{M0}$ of the sub-block [B] in parallel is formed by n⁺ source/drain regions 22 and 23 and a word line WL0$^B$ serving as a polycrystalline silicon gate electrode. Moreover, the control transistor connected to the memory capacitor C$_{M1}$ in parallel is formed by the n$^+$ source/drain regions 23 and 24 and the word line WL1$^B$, and the control transistor connected to the memory capacitor C$_{M2}$ in parallel is formed by the n$^+$ source/drain regions 24 and 25 and the word line WL2$^B$. Similarly, the control transistor connected to the memory capacitor C$_{M15}$ in parallel is formed by the n$^+$ source/drain regions 26 (not shown) and 322 and the word line WL15$^B$. The n$^+$ source/drain regions 23, 25, . . . , are connected to bottom electrodes 42, 43, . . . , 44, each of which serves as the first or second electrode of each of the memory capacitors C$_{M0}$, C$_{M1}$, C$_{M2}$, C$_{M3}$, . . . , C$_{M15}$. In addition, the reference capacitor control transistor is formed by the n$^+$ source/drain regions 322 and 323 and the word line WR$^B$. In addition, a read transistor Q$_{READ}$ is formed by n$^+$ source/drain regions 324 and 325 and a polycrystalline silicon gate 332. The no source/drain region 325 is connected to a read power source line VL. The polycrystalline silicon gate electrode 334 corresponds to the read capacitor control transistor Q$_{READ}$ of the second stage column. In addition, the polycrystalline silicon gate electrode 333 corresponds to the block selecting transistor Q$_S$ of the second stage column, and the polycrystalline silicon gate electrode 335 corresponds to the block selecting transistor of the third stage column. Moreover, the polycrystalline silicon gate electrode 337 corresponds to the block selecting transistor Q$_S$ of the fourth stage column. Furthermore, the sub-block [A] is the same.

As shown in FIG. 27A, one sub-block [B] includes the block selecting transistor Q$_S$, the n memory capacitors C$_{M0}$, C$_{M1}$, C$_{M2}$, C$_{M3}$, . . . , C$_{M15}$, the n control transistors connected in parallel thereto, the read transistor Q$_{BREAD}$, the reference capacitor C$_{REF}$, and the reference capacitor control transistor. Since the dimension of one memory cell is 4F$^2$ and the dimension of a region other than the memory cell including the contact part per block is 22F$^2$, the dimension of one memory cell is (4+22/n)F$^2$. In the third preferred embodiment, the ferroelectric capacitor has a remnant polarization of 20 $\mu$C/cm$^2$, so that it is stably operated even if 16 memory cells are connected in series. Therefore, the dimension of one memory cell was 5.4 F$^2$.

FIG. 27B is a sectional view taken along line B–B' in the plan view of the sub-block [B] of FIG. 27A. As shown in FIG. 27B, in the third preferred embodiment of a semiconductor integrated memory device according to the present invention, a p-well 12 is formed on a semiconductor substrate 11, and n$^+$ source/drain regions 321, 21, 22, 23, . . . , 322, 323 are formed on the surface of the p-well 12. On the gate oxide film on the surface of the p-well 12, a polycrystalline silicon gate electrode 331, word lines WL0$^B$, WL1$^B$, WL2$^B$, . . . , WL15$^B$, and a polycrystalline silicon gate electrode 332 are formed. In addition, a drive line DLB connected to the n$^+$ source/drain region 321 extends in a direction perpendicular to the plane of the drawing.

The block selecting transistor Q$_S$ is formed by the n$^+$ source/drain regions 321 and 22 and the polycrystalline gate electrode 331. The control transistor connected to the memory capacitor C$_{M0}$ in parallel is formed by the n$^+$ source/drain regions 22 and 23 and the word line WL0$^B$. Moreover, the control transistor connected to the memory capacitor C$_{M1}$ in parallel is formed by the n$^+$ source/drain regions 23 and 24 and the word line WL1$^B$, and the control transistor connected to the memory capacitor C$_{M1}$ in parallel is formed by the n$^+$ source/drain regions 24 and 25 and the word line WL2$^B$. Similarly, the control transistor connected to the memory capacitor C$_{M15}$ in parallel is formed by the n$^+$ source/drain regions 26 (not shown) and 27 and the word line WL15$^B$. In addition, the read capacitor control transistor is formed by the n$^+$ source/drain regions 322 and 323 and the word line WR$^B$. In addition, the read transistor Q$_{BREAD}$ is formed by the n$^+$ source/drain regions 324 and 325 (see FIG. 27A), which are not exposed to the cross section taken along line B–B' and which are not shown, and the polycrystalline silicon gate electrode 332. A first interlayer insulator film 13 of an oxide film (SiO$_2$ film) or the like is formed on the polycrystalline silicon gate electrode 331, the word lines WL0$^B$, WL1$^B$, WL2$^B$, . . . , WL15$^B$, WR$^B$, and the polycrystalline silicon gate electrode 332. On the first interlayer insulator film 13, the bottom electrodes 42, 43, . . . , 44, each of which serves as the first or second electrode of each of the memory capacitors C$_{M0}$, C$_{M1}$, C$_{M2}$, C$_{M3}$, . . . , C$_{M15}$, and the bottom electrode 351 serving as the fourth electrode of the reference capacitor C$_{REF}$ are formed. The bottom electrodes 42, 43, . . . , 44, 351 are connected to the n$^+$ source/drain regions 23, 25, . . . , 323 by means of contact plugs 73, 75, 342, which are formed so as to bury contact holes formed in the first interlayer insulator film 13. Moreover, the bottom electrode 351 is connected to the polycrystalline silicon gate electrode 332 of the read transistor Q$_{BREAD}$ by means of a contact plug 343 passing through the first interlayer insulator film 13. These contact plugs may be formed of a doped polycrystalline silicon, a metal having a high melting point, or a silicide of a metal having a high melting point. The bottom electrode 42 functions as the first electrode of the memory capacitor C$_{M0}$ and as the second electrode of the memory capacitor C$_{M1}$. The bottom electrode 43 functions as the first electrode of the memory capacitor C$_{M14}$ and as the second electrode of the memory capacitor C$_{13}$. The bottom electrode 44 functions as the first electrode of the memory capacitor C$_{M14}$ and as the second electrode of the memory capacitor C$_{M15}$. On the bottom electrodes 42, 43, . . . , 44, ferroelectric thin-films 51, 52, . . . , 53 may be formed to be patterned. On the bottom electrode 351 of the reference capacitor C$_{REF}$, a paraelectric thin-film 352 may be formed. Furthermore, in place of the paraelectric thin-film 352 of the reference capacitor C$_{REF}$, a ferroelectric thin-film may be used. A second interlayer insulator film 14 of an oxide film (SiO$_2$ film) or the like is formed on the first interlayer insulator film 13, on which the ferroelectric thin-films 51, 52, . . . , 53 and the paraelectric thin-film 352 are not formed. The top electrodes 372, 62, . . . , 353 are formed on the second interlayer insulator film 14. The top electrode 372 functions as the second electrode of the memory capacitor C$_{M0}$. The top electrode 62 functions as the first electrode of the memory capacitor C$_{M1}$ and as the second electrode of the memory capacitor C$_{M2}$. The top electrode 353 functions as the first electrode of the memory capacitor C$_{M15}$ and ad the third electrode of the reference capacitor C$_{REF}$. The top electrodes 372, 62, . . . , 353 are connected to the n$^+$ source/drain regions 22, 24, . . . , 322 by means of contact plugs 72, 74 and 341 which are formed so as to bury contact holes passing through the first interlayer insulator film 13 and the second interlayer insulator film 14. These contact plugs 72, 74 and 341 may be formed of a doped polycrystalline silicon, a metal having a high melting point, a silicide of a metal having a high melting point or the like. Moreover, a third interlayer insulator film 15 of an oxide film (SiO$_2$ film) or the like is formed on the top electrodes 372, 62, . . . , 353, the read output line SL$^B$ and the read output line SL$^A$. A bit line 16 is formed on the third interlayer insulator film 15. Furthermore, a passivation film, such as an oxide film (SiO$_2$ film), a PSG film, a BPSG film, a nitride film (Si$_3$N$_4$ film) or a polyimide film, is preferably formed, although this is not shown. Even though the block [B] is mainly described, the block [A] is constituted in the same manner of the block [B].

With the circuit construction, the operation of a very high density integrated non-volatile memory could be confirmed.

(Fourth Preferred Embodiment)

Figure 28:
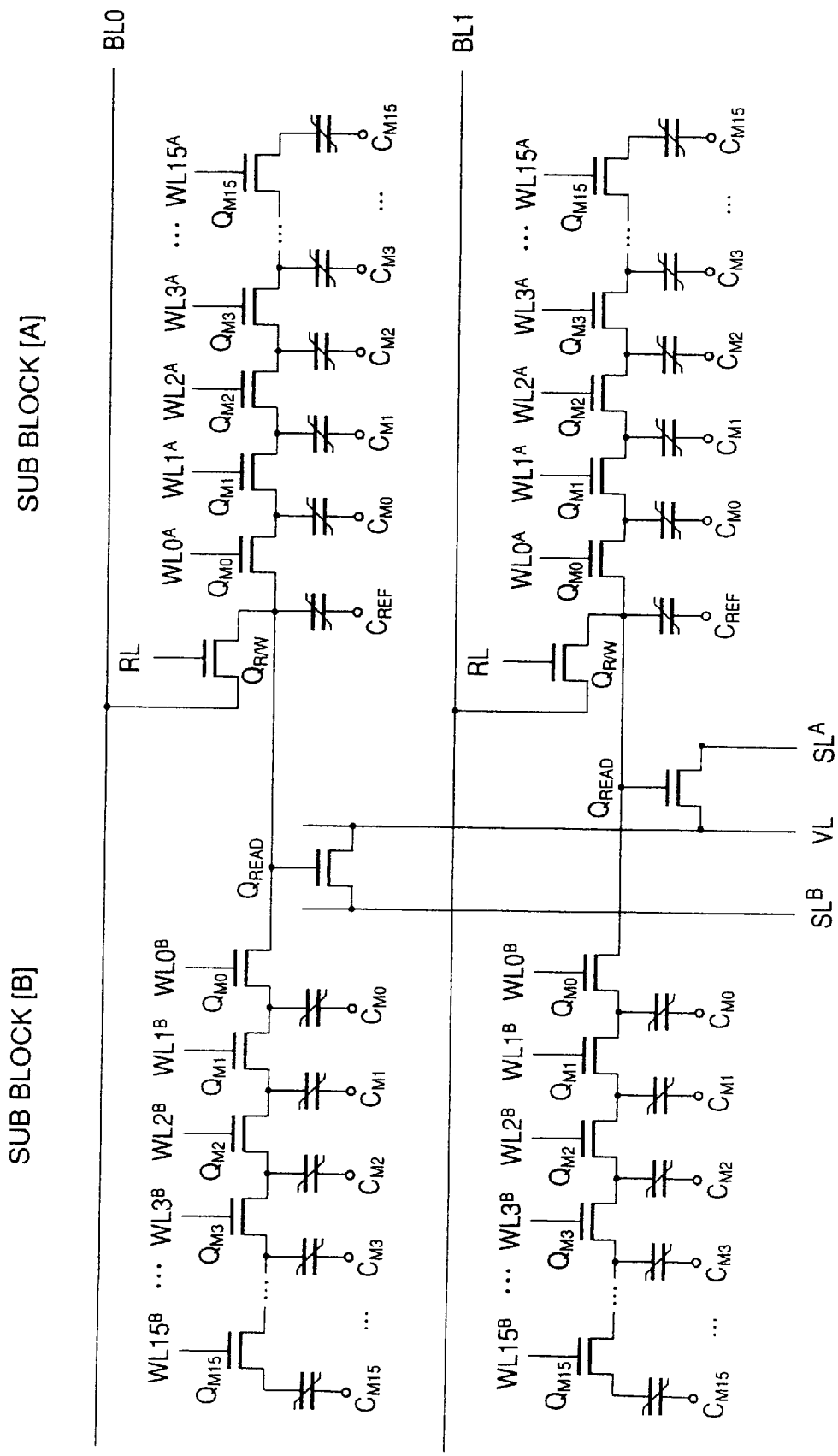
FIG. 28 is a circuit diagram showing a principal part of the fourth preferred embodiment of a semiconductor integrated memory device according to the present invention.

FIG. 28 is a circuit diagram of a principal part of the fourth preferred embodiment of a semiconductor integrated memory device according to the present invention, which uses a ferroelectric capacitor for memory. As shown in FIG. 28, the fourth preferred embodiment of a semiconductor integrated memory device according to the present invention has, as a basic unit, a memory cell block comprising: a NAND type memory cell column, which comprises a plurality of selecting MOS transistors $Q_{M0}$, $Q_{M1}$, $Q_{M2}$, $Q_{M3}$, ..., $Q_{M15}$ connected in series, and a plurality of ferroelectric memory capacitors $C_{M0}$, $C_{M1}$, $C_{M2}$, $C_{M3}$, ..., $C_{M15}$, each of which is connected to a common main electrode of the selecting transistors; a reference capacitor $C_{REF}$ connected to the main electrode of the selecting transistor $Q_{M0}$ arranged at one end of the memory cell column; a read transistor $Q_{READ}$ having a gate electrode connected to a storage node $N_S$ serving as a connection point between the selecting transistor $Q_{M0}$ and the reference capacitor $C_{REF}$; and an R/W control transistor $Q_{R/W}$ connected to the storage node $N_S$.

Each of the memory capacitors $C_{M0}$, $C_{M1}$, $C_{M2}$, $C_{M3}$, ..., $C_{M15}$ has at least a first electrode connected to the common main electrode of the selecting transistors, a second electrode which faces the first electrode and which is connected to a plate electrode, and a ferroelectric thin-film sandwiched between the first and second electrodes. The reference capacitor $C_{REF}$ has at least a third electrode connected to the storage node $N_S$, a fourth electrode which faces the third electrode and which is connected to a plate electrode PE, and a dielectric thin-film sandwiched between the third and fourth electrodes. One of the main electrodes of the first R/W control transistor $Q_{R/W}$ is connected to the storage node $N_S$, and the other main electrode is connected to the bit line BL.

A plurality of NAND type memory cell blocks, each of which is the same as the aforementioned memory block, are arranged in the form of a matrix, and divided into two sub-blocks, a sub-block [A] on the right side and a sub-block [B] on the left side, with respect to one reference capacitor $C_{REF}$, the read transistor $Q_{READ}$ and an R/W control transistor $Q_{R/W}$. FIG. 28 shows only four sub-blocks in total, two sub-blocks [A] and two sub-blocks [B].

The gate electrodes of the selecting transistors $Q_{M0}$, $Q_{M1}$, $Q_{M2}$, $Q_{M3}$, ..., $Q_{M15}$ of the sub-block [A] are connected to word lines WL0$^A$, WL1$^A$, WL2$^A$, WL3$^A$, ..., WL15$^A$, respectively. Similarly, the gate electrodes of the selecting transistors $Q_{M0}$, $Q_{M1}$, $Q_{M2}$, $Q_{M3}$, ..., $Q_{M15}$ of the sub-block [B] are connected to word lines WL0$^B$, WL1$^B$, WL2$^B$, WL3$^B$, ..., WL15$^B$, respectively. One of main electrodes of read transistors $Q_{READ}$ of each memory block is connected to a read power source line VL, and the other main electrode is connected to a read output line SL. The gate electrode of the R/W control transistor $Q_{R/W}$ of each memory block is connected to the word line RL of the R/W control transistor.

Figure 29:
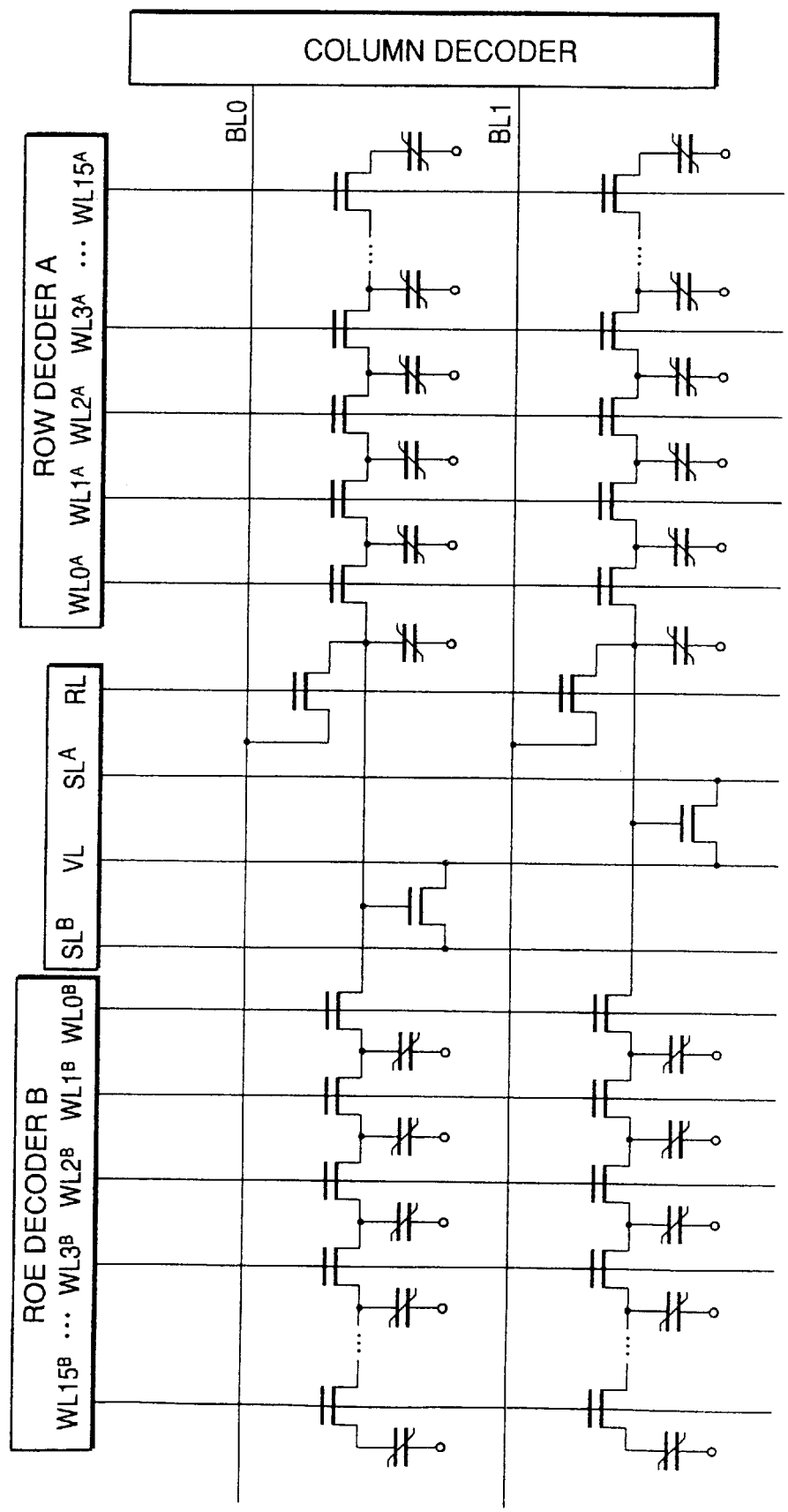
FIG. 29 is a circuit diagram showing a principal part of the fourth preferred embodiment of a semiconductor integrated memory device according to the present invention, which includes peripheral circuits.

FIG. 29 is a connection diagram of peripheral circuits. Each of the word lines WL0A, WL1A, WL2A, WL3A, ..., WL15A of the sub-block [A] is connected to a row decoder A, and each of the word lines WL0B, WL1B, WL2B, WL3B, ..., WL15B of the sub-block [B] is connected to a row decoder B. Each of the bit lines BL0, BL1, ... is connected to a column decoder.

In the circuit constructions of FIGS. 28 and 29, in order to select a desired memory cell shown by the intersection between BLx (x=0, 1) and WLy$^A$ (y=0, 1, 2, ..., 15) in the sub-block [A], all of the word lines WL0A through WLyA are set to be "1" (high level) to cause all of the selecting transistor QM0 through QMy to be turned on, and the word line WLy+1A is set to be "0" (low level) to cause the selecting transistor Qmy+1 to be turned off. In addition, a potential is applied to BLx for the plate line PL having a constant potential (e.g., 1/VCC). Thus, the desired memory cell can be selected. Similarly, in order to select a desired memory cell shown by the intersection between BLx (x=0, 1) and WLyB (y=0, 1, 2, ..., 15) in the sub-block [B], all of the word lines WL0B through WLyB are set to be "1" (high level) to cause all of the selecting transistors $Q_{M0}$ through $Q_{My}$ to be turned on, and the word line WLy+1B is set to be "0" (low level) to cause the selecting transistor Qmy+1 to be turned off. In addition, a potential is applied to BLx for the plate line PL having a constant potential (e.g., ½ VCC). Thus, the desired memory cell can be selected.

Figure 30:
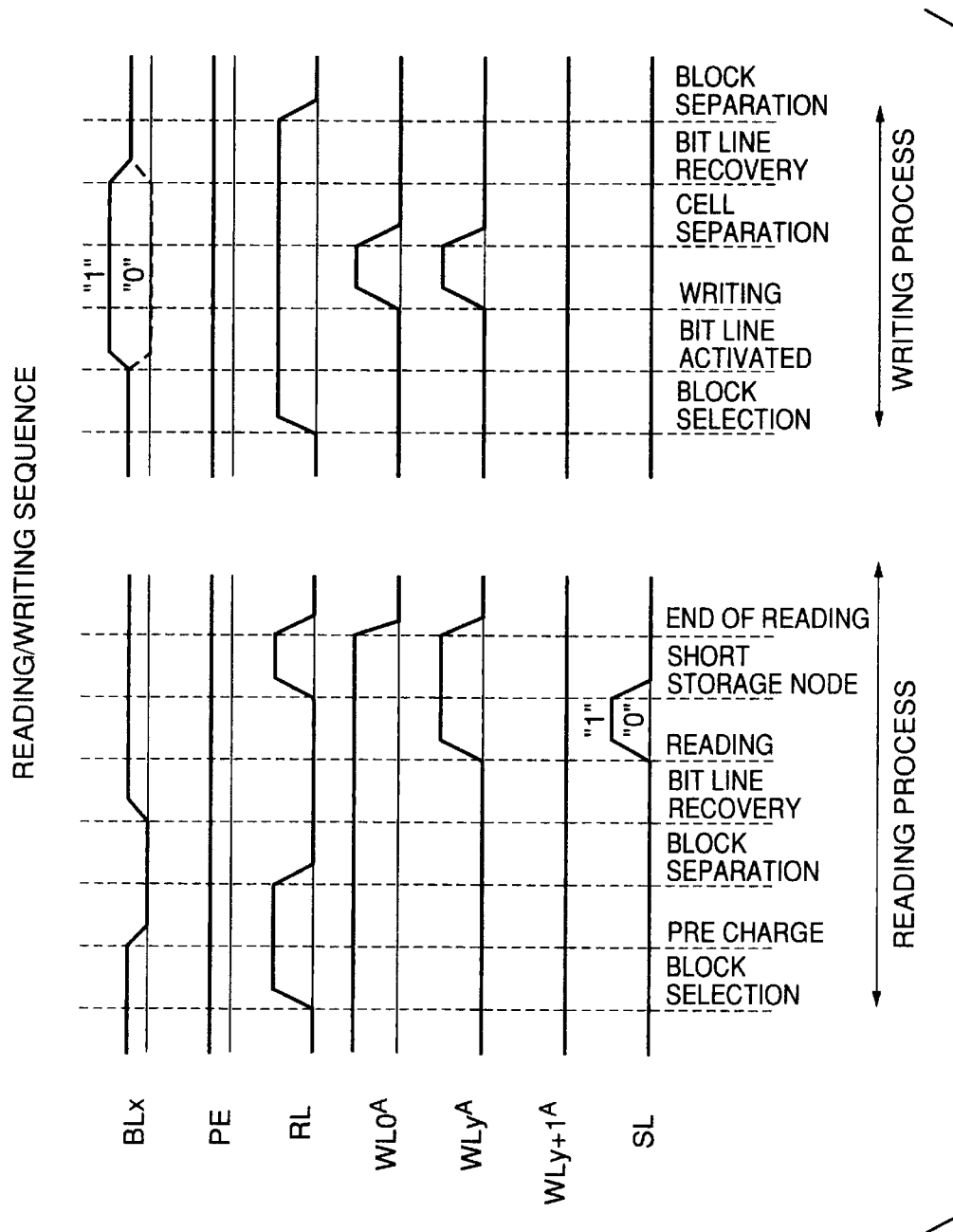
FIG. 30 is a timing chart showing a read/write sequence in the fourth preferred embodiment of a semiconductor integrated memory device according to the present invention.

FIG. 30 shows a read/write sequence when "a pre-charge combining read/direct write system" is adopted. First, in the pre-charge combining read system, before WL0$^A$ through WLy$^A$ or WL0$^B$ through WLy$^B$ are selected, the R/W control transistor $Q_{R/W}$ is turned on, and a reverse voltage is applied to the reference capacitor $C_{REF}$ for the plate line PL having a constant potential to pre-charge the reference capacitor $C_{REF}$. Thereafter, the R/W control transistor $Q_{R/W}$ is turned on, and WL$^A$ through WLy$^A$ or WL0$^B$ through WLy$^B$ are selected. Then, a positive voltage is applied thereto, so that a voltage substantially about twice is applied to the memory capacitor $C_{My}$ to be inverted.

In the case of write in the memory capacitor $C_{My}$, the R/W control transistor $Q_{R/W}$ is turned on to apply a write voltage to the bit line BL, and WL0$^A$ through WLy$^A$ or WL0$^B$ through WLy$^B$ are selected, so that the voltage is applied directly to the memory capacitor $C_{My}$ to be inverted.

Figure 31A:
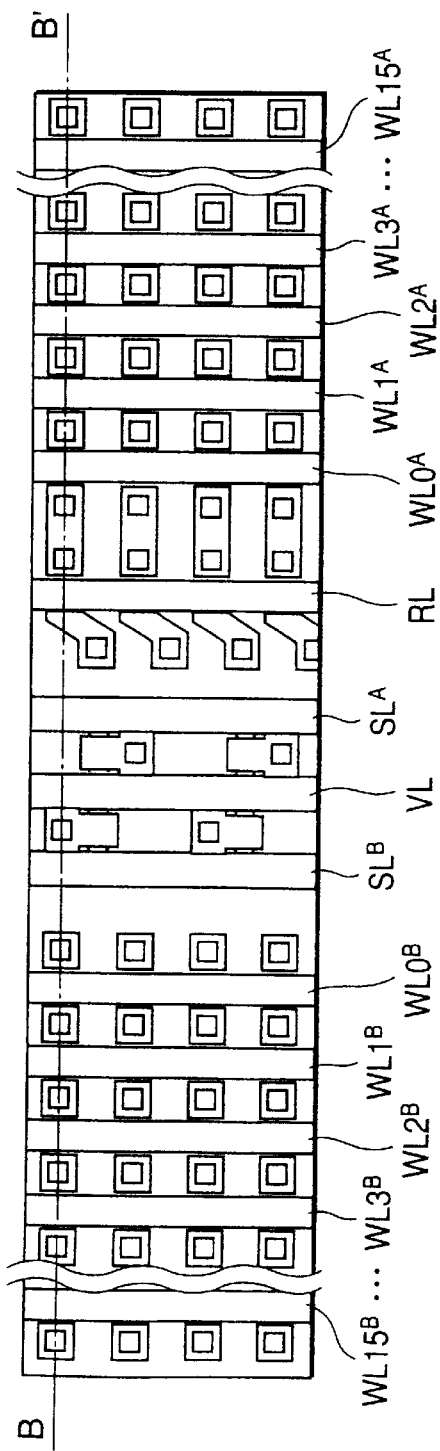
FIG. 31A is a plan view of a modification of the fourth preferred embodiment of a semiconductor integrated memory device according to the present invention.
Figure 31B:
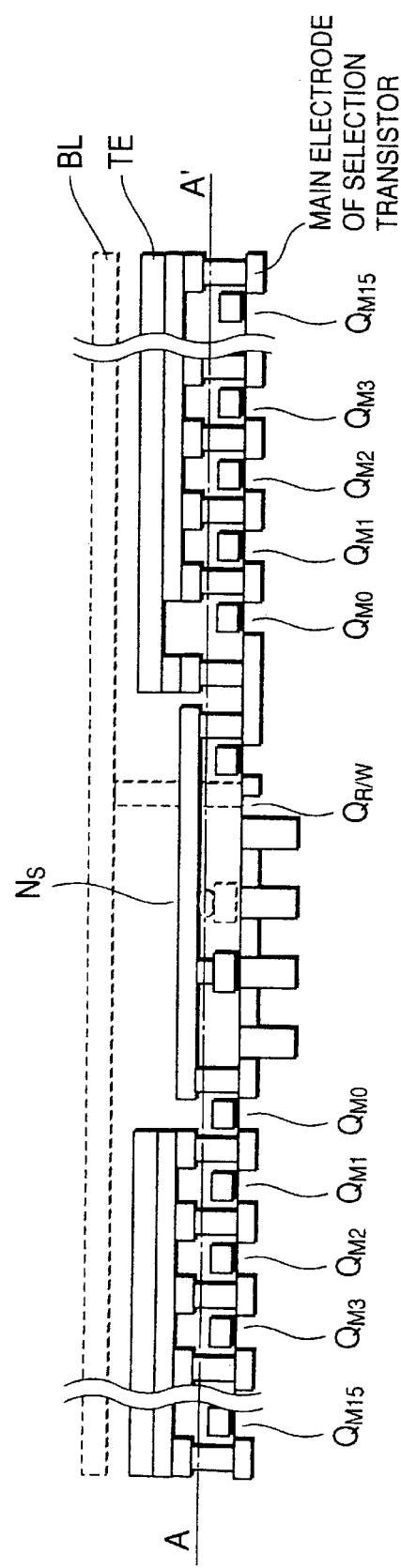
FIG. 31B is a sectional view thereof.

FIG. 31A is a plan view of the fourth preferred embodiment according to the present invention, which shows only an underlayer lower than the level of A–A' in the sectional view of FIG. 31B, in order to easy to see the plan view.

One block connected to a bit line includes two sub-blocks, each of which has 16 memory cells, a read transistor $Q_{READ}$, and a R/W control transistors $Q_{R/W}$. Since the dimension of the memory cell is 4F$^2$ and the dimension of a region other than the memory cell per block is 26F$^2$, the dimension of one memory cell is (4+26/32)F$^2$. Since the ferroelectric capacitor has a remnant polarization of 20 $\mu$C/cm$^2$ in this preferred embodiment, it was found that the device is stably operated even if 32 memory cells are connected in series. Therefore, the dimension of one memory cell was 4.8 F$^2$.

In addition, FIG. 31B is a sectional view taken along line B–B' in the plan view of FIG. 31A. On a silicon substrate, nMOS type transistors are formed. The bottom electrode LE, the top electrode TE and the capacitors $C_{M0}$, $C_{M1}$, $C_{M2}$, $C_{M3}$, ..., $C_{M15}$ of ferroelectric thin-films are formed in the main electrode regions of each of the selecting transistors $Q_{M0}$, $Q_{M1}$, $Q_{M2}$, $Q_{M3}$, ..., $Q_{M15}$. Similarly, the reference capacitor $C_{REF}$ is formed on another main electrode of the selecting transistor $Q_{M0}$ at one end of the NAND cell memory column.

With the circuit construction, the operation of a very high density integrated non-volatile memory could be confirmed.

(Fifth Preferred Embodiment)

Figure 32:
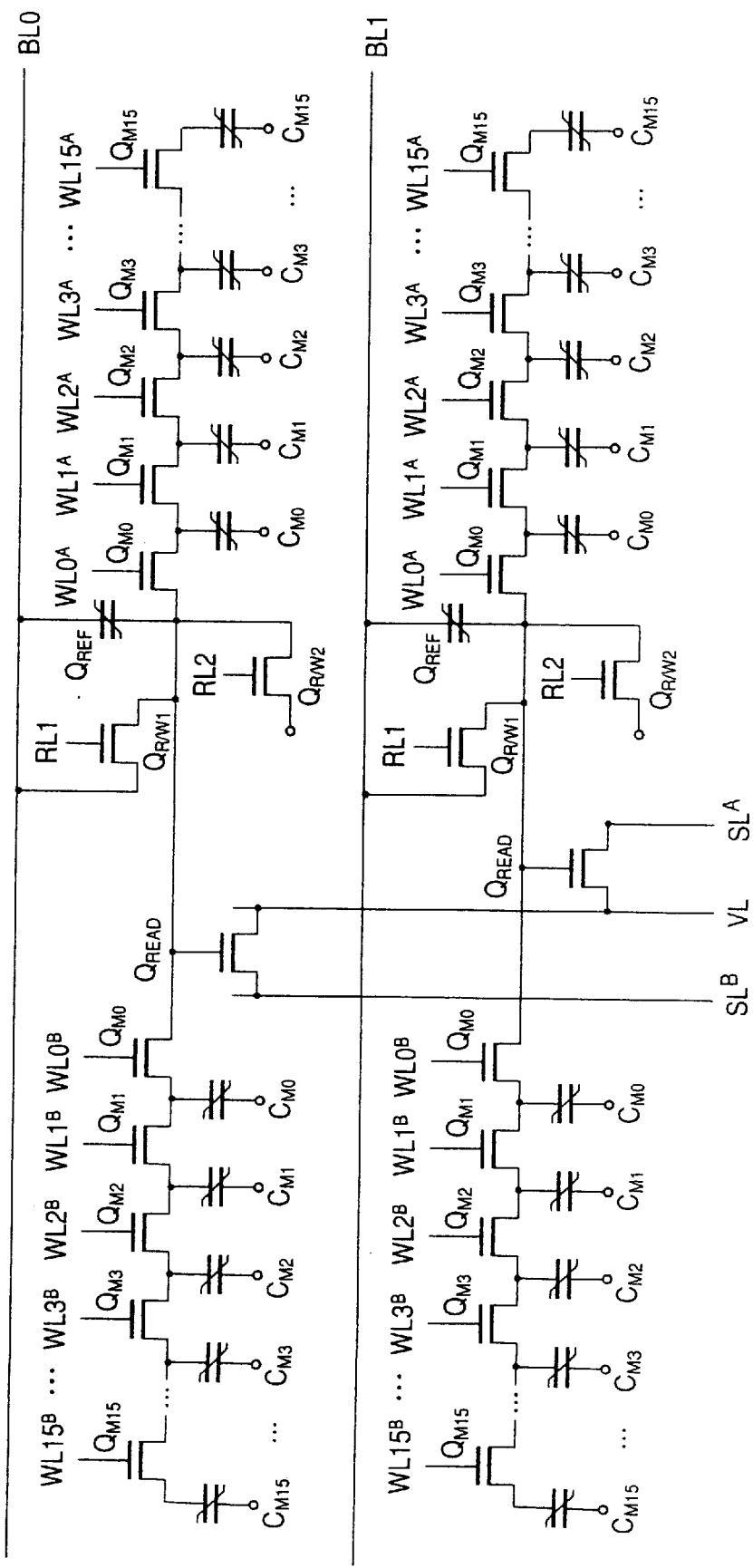
FIG. 32 is a circuit diagram showing a principal part of the fifth preferred embodiment of a semiconductor integrated memory device according to the present invention.
Figure 33:
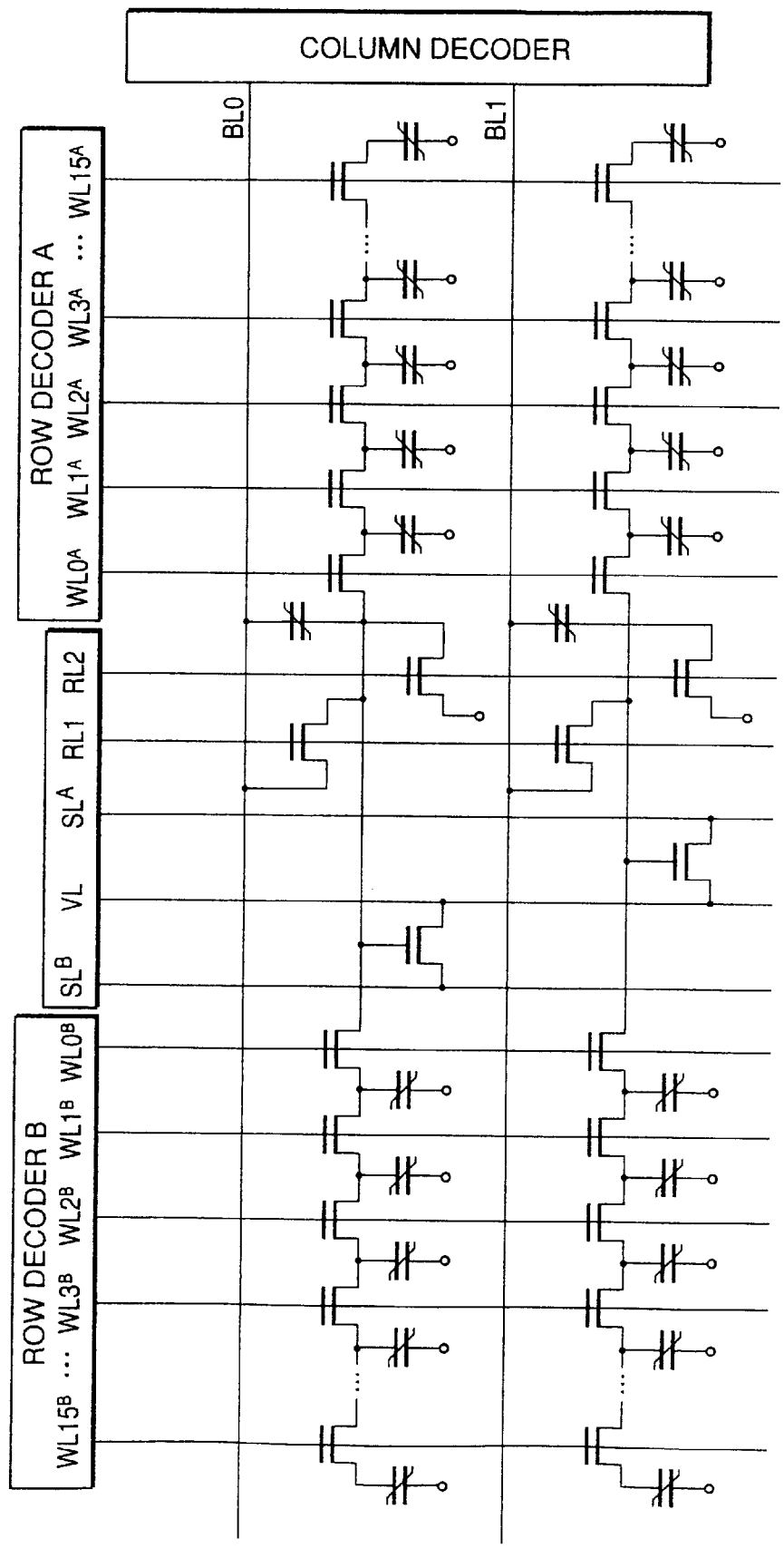
FIG. 33 is a circuit diagram showing the detail of the principal part of the fifth preferred embodiment of a semiconductor integrated memory device according to the present invention, which includes peripheral circuits.

FIG. 32 is a circuit diagram of a principal part of the fifth preferred embodiment of a semiconductor integrated memory device according to the present invention, which uses a paraelectric memory capacitor. FIG. 33 is a detailed circuit diagram of the principal part of the semiconductor integrated memory device, which includes peripheral circuits. As shown in FIG. 32, the fifth preferred embodiment of a semiconductor integrated memory device according to the present invention has, as a basic unit, a memory cell block comprising: a NAND type memory cell column, which comprises a plurality of selecting MOS transistors $Q_{M0}, Q_{M1}, Q_{M2}, Q_{M3}, \ldots, Q_{M15}$ connected in series, and a plurality of ferroelectric memory capacitors $C_{M0}, C_{M1}, C_{M2}, C_{M3}, \ldots, C_{M15}$, each of which is connected to a common main electrode of the selecting transistors; a reference capacitor $C_{REF}$ connected to the main electrode of the selecting transistor $Q_{M0}$ arranged at one end of the memory cell column; a read transistor $Q_{READ}$ having a gate electrode connected to a storage node $N_S$ serving as a connection point between the selecting transistor $Q_{M0}$ and the reference capacitor $C_{REF}$; and two R/W control transistors $Q_{R/W1}$ and $Q_{R/W2}$ connected to the storage node $N_S$.

Each of the memory capacitors $C_{M0}, C_{M1}, C_{M2}, C_{M3}, \ldots, C_{M15}$ has at least a first electrode connected to the common main electrode of the selecting transistors, a second electrode which faces the first electrode and which is connected to a plate electrode, and a ferroelectric thin-film sandwiched between the first and second electrodes. The reference capacitor $C_{REF}$ has at least a third electrode connected to the storage node $N_S$, a fourth electrode which faces the third electrode and which is connected to the bit line BL, and a dielectric thin-film sandwiched between the third and fourth electrodes. One of the main electrodes of the first R/W control transistor $Q_{R/W1}$ is connected to the storage node $N_S$, and the other main electrode is connected to the bit line BL. One of the main electrodes of the second R/W control transistor $Q_{R/W2}$ is connected to the storage node $N_S$, and the other main electrode is connected to the plate electrode PE.

A plurality of NAND type memory cell blocks, each of which is the same as the aforementioned memory block, are arranged in the form of a matrix, and divided into two sub-blocks, a sub-block [A] on the right side and a sub-block [B] on the left side, with respect to one reference capacitor $C_{REF}$, the read transistor $Q_{READ}$ and two R/W control transistors $Q_{R/W1}$ and $Q_{R/W2}$. FIG. 32 shows only four sub-blocks in total, two sub-blocks [A] and two sub-blocks [B].

The gate electrodes of the selecting transistors $Q_{M0}, Q_{M1}, Q_{M2}, Q_{M3}, \ldots, Q_{M15}$ of the sub-block [A] are connected to word lines $WL0^A, WL1^A, WL2^A, WL3^A, \ldots, WL15^A$, respectively. Similarly, the gate electrodes of the selecting transistors $Q_{M0}, Q_{M1}, Q_{M2}, Q_{M3}, \ldots, Q_{M15}$ of the sub-block [B] are connected to word lines $WL0^B, WL1^B, WL2^B, WL3^B, \ldots, WL15^B$, respectively. One of main electrodes of the read transistor $Q_{READ}$ of each memory block is connected to a read power source line VL, and the other main electrode is connected to a read output line $SL^A$ or $SL^B$. The gate electrodes of two R/W control transistor $Q_{R/W1}$ and $Q_{R/W2}$ of each memory block are connected to the word line RL1 and RL2 of the R/W control transistor. In FIG. 32, while the selecting transistors $Q_{M0}, Q_{M1}, Q_{M2}, Q_{M3}, \ldots, Q_{M15}$, the read transistor $Q_{READ}$ and two R/W control transistors $Q_{R/W1}$ and $Q_{R/W2}$ are shown as nMOSFETs, these transistors may be formed of pMOSFETs.

FIG. 33 is a connection diagram of peripheral circuits. Each of the word lines $WL0^A, WL1^A, WL2^A, WL3^A, \ldots, WL15^A$ of the sub-block [A] is connected to a row decoder A, and each of the word lines $WL0^B, WL1^B, WL2^B, WL3^B, \ldots, WL15^B$ of the sub-block [B] is connected to a row decoder B. Each of the bit lines BL0, BL1, . . . is connected to a column decoder.

In the circuit constructions of FIGS. 32 and 33, in order to select a desired memory cell shown by the intersection between BLx (x=0, 1) and $WLy^A$ (y=0, 1, 2, . . . , 15) in the sub-block [A], all of the word lines WL0A through WLyA are set to be "1" (high level) to cause all of the selecting transistor $Q_{M0}$ through $Q_{My}$ to be turned on, and the word line WLy+1A is set to be "0" (low level) to cause the selecting transistor Qmy+1 to be turned off. In addition, a potential is applied to BLx for the plate line PL having a constant potential (e.g., ½ VCC). Thus, the desired memory cell can be selected.

Figure 34:
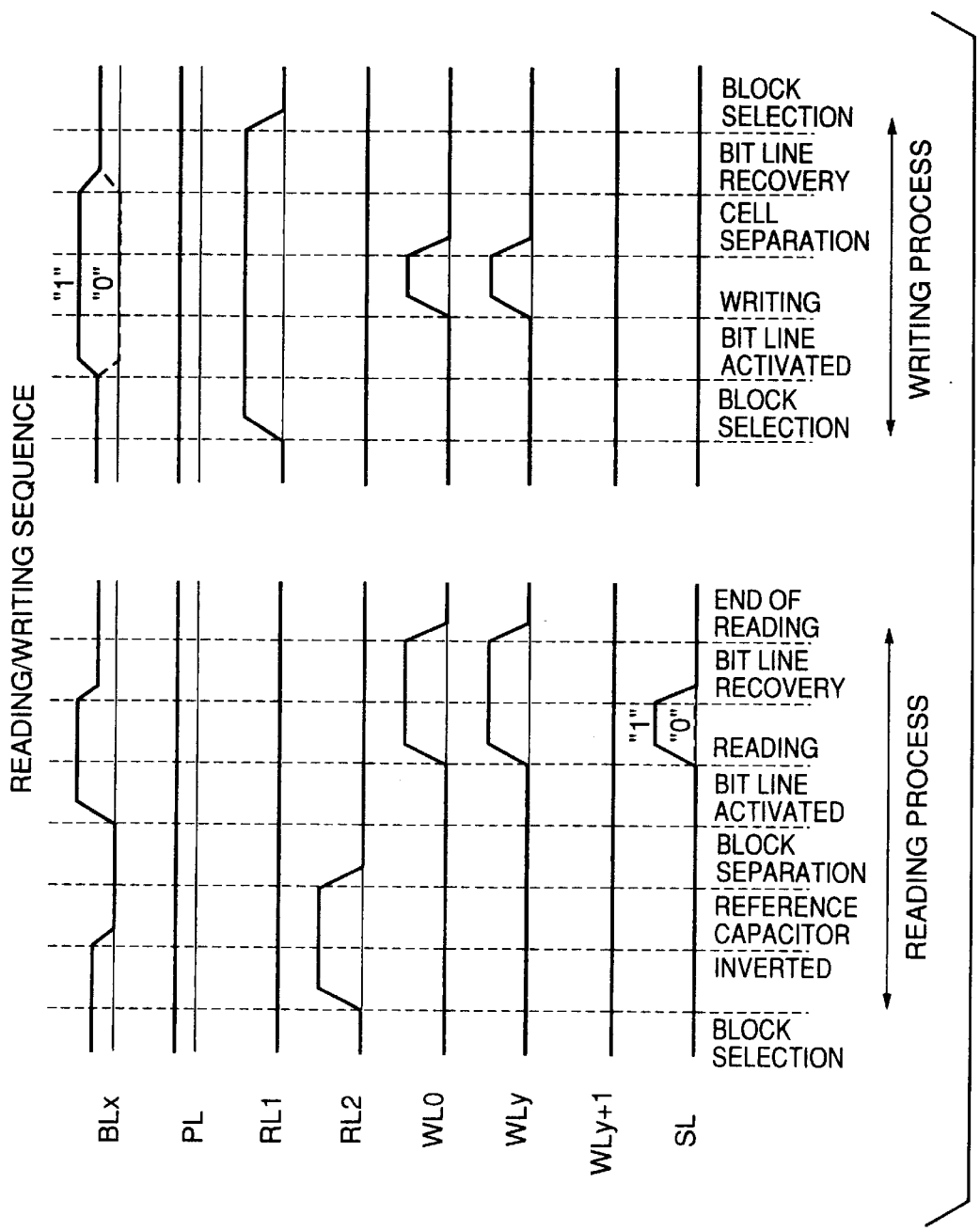
FIG. 34 is a timing chart showing a read/write sequence in the fifth preferred embodiment of a semiconductor integrated memory device according to the present invention.

FIG. 34 shows a read/write sequence when "a pre-charge read/direct write system" is adopted. First, in the pre-charge read system, before $WLy^A$ or $WLy^B$ is selected, the second R/W control transistor $Q_{R/W2}$ is turned on, and a voltage is applied to the reference capacitor $C_{REF}$ for the plate line PL having a constant potential and to $WL0^A$ through $Wly01^A$ before the cell to be selected, or $WL0^B$ through $Wly-^B$ to pre-charge them. Thereafter, the R/W control transistor $Q_{R/W}$ is turned off, and $WL0^A$ through $WLy^A$ or $WL0^B$ through $WLy^B$ is selected to read the charge of the memory capacitor $C_{My}$.

Writing to the memory capacitor $C_{my}$ is performed below. At first, the first R/W control transistor $Q_{R,W1}$ is turned on to supply a write voltage to the bit line BL so as to select word lines $WL0^A$ through $WLy^A$ or word lines $WL0^A$ through $Wly^B$. Accordingly, the memory capacitor $C_{my}$ is inverted by directly adding the voltage.

Figure 35A:
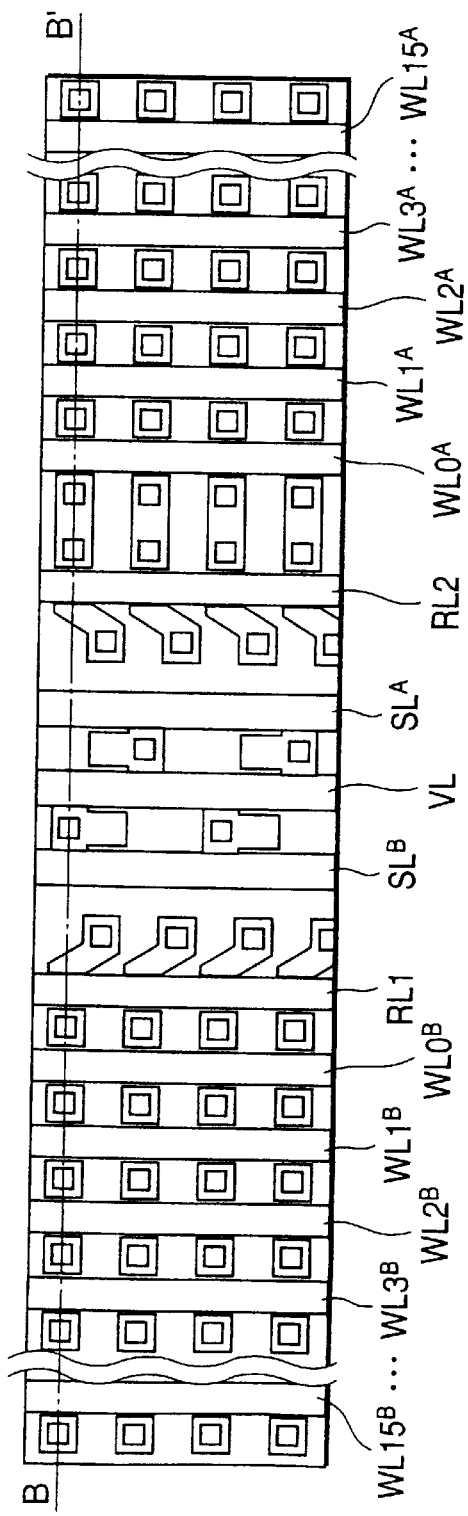
FIG. 35A is a plan view of a modification of the fifth preferred embodiment of a semiconductor integrated memory device according to the present invention.
Figure 35B:
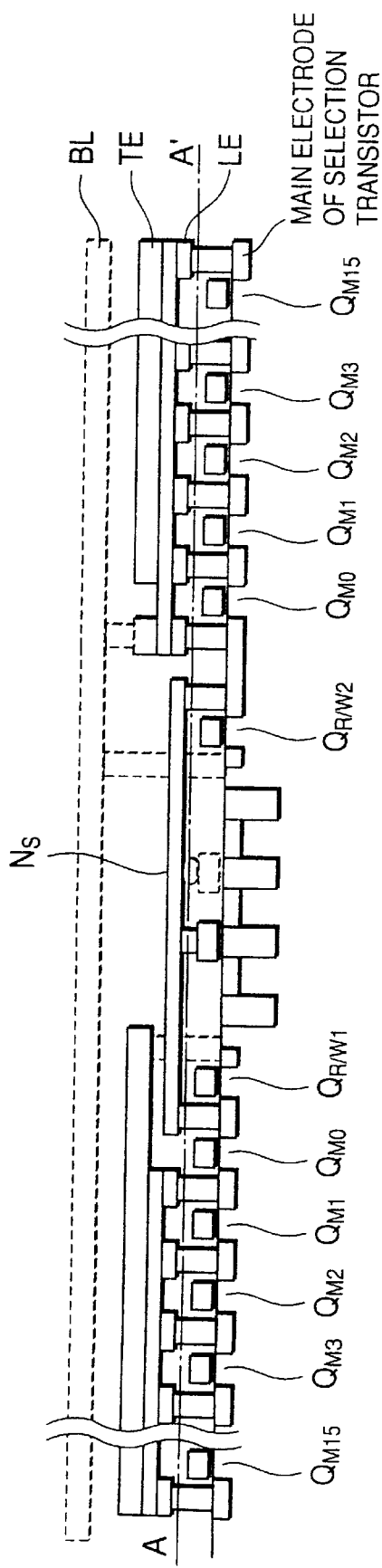
FIG. 35B is a sectional view thereof.

FIG. 35A is a plan view of the fifth preferred embodiment according to the present invention, which shows only an underlayer lower than the level of A–A' in the sectional view of FIG. 35B, in order to easy to see the plan view. One block connected to a bit line includes two sub-blocks, each of which has 8 memory cells, a read transistor $Q_{READ}$, and two R/W control transistors $Q_{R/W1}$ and $Q_{R/W2}$. Since the dimension of the memory cell is $4F^2$ and the dimension of a region other than the memory cell per block is $22F^2$, the dimension of one memory cell is $(4+22/16)F^2$. Since the paraelectric capacitor has a capacity of 20 mF/cm$^2$ and a strong non-linearity in this preferred embodiment, it was found that the device is stably operated even if 16 memory cells are connected in series. Therefore, the dimension of one memory cell was 5.4 $F^2$.

In addition, FIG. 35B is a sectional view taken along line B–B' in the plan view of FIG. 35A. On a silicon substrate, nMOS type transistors are formed. The bottom electrode LE, the top electrode TE and the capacitors $C_{M0}, C_{M1}, C_{M2}, C_{M3}, \ldots, C_{M15}$ of ferroelectric thin-films are formed in the main electrode region of each of the selecting transistors $Q_{M0}, Q_{M1}, Q_{M2}, Q_{M3}, \ldots, Q_{M15}$. Similarly, the reference capacitor $C_{REF}$ is formed on another main electrode of the selecting transistor $Q_{M0}$ at one end of the NAND cell memory column.

With the circuit construction, the operation of a very high density integrated non-volatile memory could be confirmed.

(Sixth Preferred Embodiment)

FIGS. 36A through 36D are schematic sectional views showing the sixth preferred embodiment of a process for producing a Chain type semiconductor integrated memory device according to the present invention. In the drawings, reference number 1 denotes a first impurity type semiconductor substrate, 2 denotes a second impurity type impurity diffusion layer, 3 denotes an element isolating insulator film, 4 denotes a gate oxide film, 5 denotes a word line, 6 denotes a mono-crystalline Si epitaxial growth layer, 7, 8 and 9 denote insulator films, 11 and 15 denote barrier metal layers, 12 denotes a bottom electrode, 13 denotes a dielectric thin-film, 14 denotes a top electrode, 23 denotes an internal wiring, and 24 denotes a via plug.

Figure 36A:
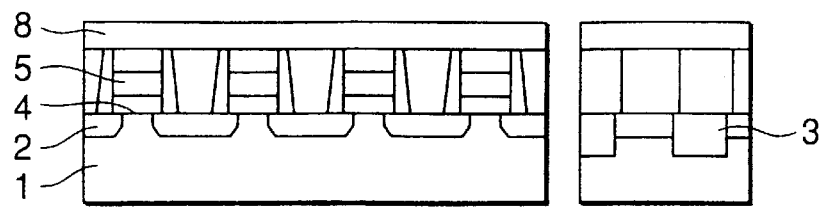
FIGS. 36A through 36D are schematic sectional views showing the sixth preferred embodiment of a process for producing memory cells of a semiconductor integrated memory device according to the present invention.

As shown FIG. 36A, after a transistor part of memory cells was formed by a known process, the selective epitaxial growth of the mono-crystalline Si layer 6 was carried out, and planarization was carried out by the chemical mechanical polishing (CMP) method. At this time, an silicon oxide film was used as the insulator film for the word line 5. In order to remove the damaged layer produced on the surface of the Si substrate by the RIE process, after etching was carried out using hydrogen fluoride vapor, the substrate was transported into a CVD chamber in vacuum, and the selective epitaxial growth was carried out at 750° C. using $SiH_4$ gas having a pressure of 1 mTorr and $AsH_3$ gas having a pressure of 0.1 mTorr, which was added as a donor.

Figure 36B:
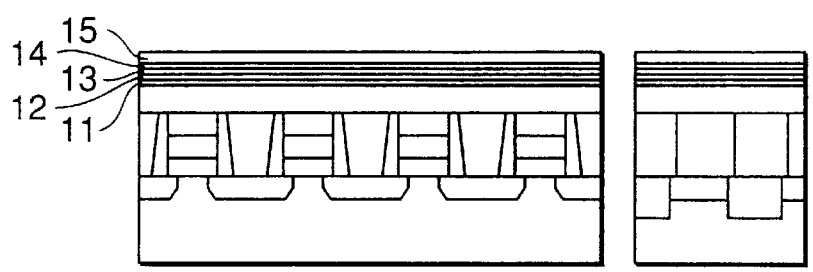

Then, as shown in FIG. 36B, in order to remove the damaged layer produced on the surface of the mono-crystalline Si layer 6 by the CMP process, etching was carried out using hydrogen fluoride, and then, a TiN layer serving as the barrier metal layer 11 was deposited at 600° C. by the reactive sputtering method. Subsequently, the $BaTiO_3$ (which will be hereinafter referred to as "BTO") ferroelectric thin-film 13 was deposited at 600° C. by the sputtering method so as to have a thickness of 40 nm. Then, an $SrTiO_3$ (which will be hereinafter referred to as "SRO") film serving as the top electrode 14 was deposited at 600° C. by the sputtering method. Subsequently, a TiN layer serving as the barrier metal layer 15 was deposited at 600° C. by the reactive sputtering method. At this time, all of the barrier metal layer 11, the bottom electrode 12, the ferroelectric thin-film 13 and the top electrode 14 were epitaxial-grown on the mono-crystalline Si layer 6 to produce a single crystal.

Figure 36C:
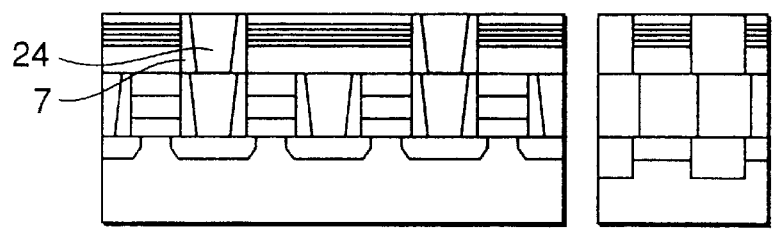

Then, as shown in FIG. 36C, the barrier metal layer 11, the bottom electrode 12, the ferroelectric film 13, the top electrode 14, the barrier metal layer 15 and the mono-crystalline Si layer 6 were patterned by known lithography and RIE methods. Then, the silicon oxide insulator film 7 was conformally deposited by the plasma CVD method using TEOS as a material gas, and the insulator film wide wall of the capacitor was formed by the anisotropic etching. Then, the via plug 24 of W was buried by the CVD method, and planarization was carried out by the CMP method using the barrier metal layer 15 as a stopper.

Figure 36D:
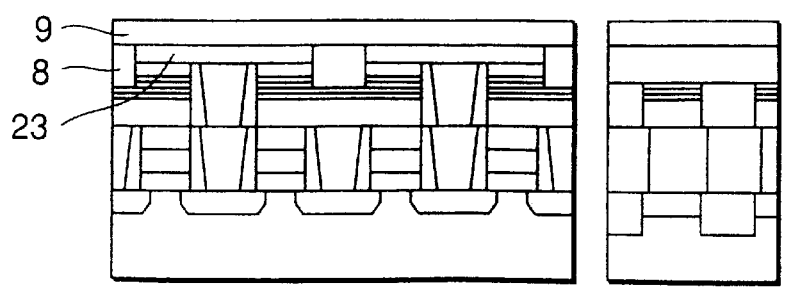

Then, as shown in FIG. 36D, the internal wiring 23 of W was formed by the sputtering method. Then, the ferroelectric film 13, the top electrode 14, the barrier metal layer 15 and the internal wiring 23 were patterned by known lithography and RIE methods. Then, the silicon oxide insulator film 8 was buried by the plasma CVD method using TEOS as a material gas, and planarization was carried out by the CMP method using the internal wiring 23 as a stopper. Moreover, the interlayer insulator film 9 was formed.

After the device was produced by such processes, the orientation of film was measured by the X-ray diffractometer. As a result, it was confirmed that all of the TiN barrier film, the SRO electrode film and the BTO dielectric film were epitaxial-grown in orientation (001). In addition, the lattice constant of the BTO film in a direction of film thickness was 0.434 nm, which increased greatly. In addition, after the dielectric characteristic of the formed ferroelectric thin-film capacitor was measured, the amount of remnant polarization was a great value of 0.42 $C/M^2$, so that it was confirmed that the formed capacitor served as a ferroelectric capacitor.

(Seventh Preferred Embodiment)

FIGS. 37A through 37E are schematic sectional views showing the seventh preferred embodiment of a process for producing a Chain type semiconductor integrated memory device according to the present invention. In the drawings, reference number 1 denotes a first impurity type semiconductor substrate, 2 denotes a second impurity type impurity diffusion layer, 5 denotes a word line, 6 denotes a mono-crystalline Si epitaxial growth layer, 7, 8, 9 and 10 denote insulator films, 11 denotes a bottom barrier metal film, 12 denotes a bottom electrode, 13 denotes a dielectric thin-film, 14 denotes a top electrode, 15 denotes a top barrier metal film, 20 denotes a plate electrode, 21 denotes a mono-crystalline Si growing node, 22 denotes a capacitor contact part, and 23 denotes an internal wiring.

Figure 37A:
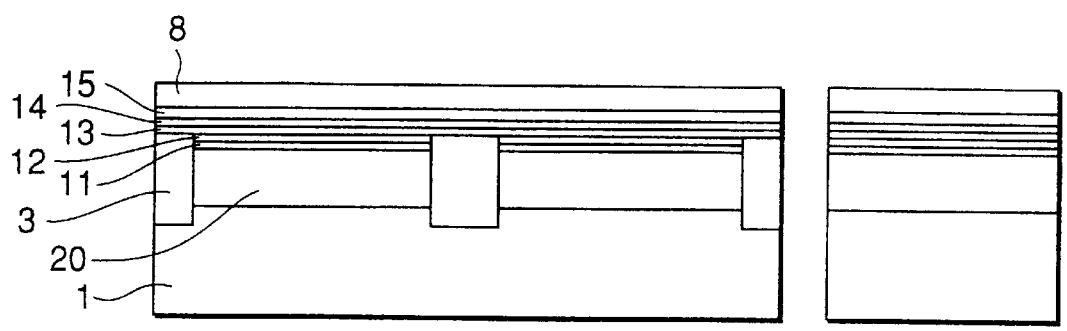
FIGS. 37A through 37E are schematic sectional views showing the seventh preferred embodiment of a process for producing memory cells of a semiconductor integrated memory device according to the present invention.

First, as FIG. 37A, after the plate electrode 20 of a second impurity type impurity diffusion layer having a depth of about 0.1 /μm was formed on the surface of the first conductive type Si (100) substrate 1, a (Ti, Al) N layer serving as the bottom-barrier metal layer 11 and having a thickness of 10 nm and an SRO layer serving as the bottom electrode 12 and having a thickness of 20 nm were sequentially epitaxial-grown by the RF or DC sputtering method at a substrate temperature of 600° C. without the exposure to the atmosphere. Then, patterning was carried out to reach the substrate 1 by etching by the lithography and RIE methods. Then, the element isolating insulator film 3 was buried by the plasma CVD method or the like using TEOS gas as a raw material, and planarization was carried out by the CMP method using the bottom electrode as a stopper.

Then, after the damaged layer produced by the planarization on the surface of the bottom electrode was removed by the wet etching or the like, a BaTiO3 thin-film serving as the dielectric film 13 and having a thickness of 20 nm, an SRO film serving as the top electrode 14 and having a thickness of 20 nm, and a (Ti, Al) N film serving as the top barrier metal layer 15 and having a thickness of 10 nm were sequentially epitaxial-grown by the RE or CD sputtering method at a substrate temperature of 600° C. without the exposure to the atmosphere. Then, the first insulator film 7 was deposited by the plasma CVD method or the like using TEOS gas as a raw material.

Figure 37B:
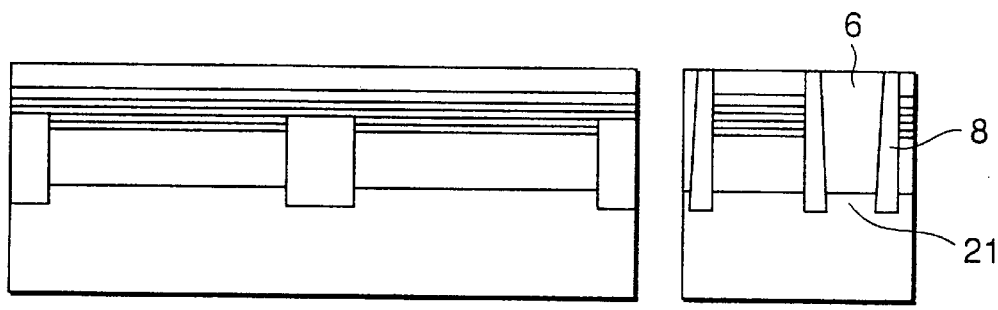

Then, as shown in FIG. 37B, the mono-crystalline Si growing node 21 was formed by the lithography and the etching, such as RIE. Then, the second insulator film 8 was conformally formed. Then, the second insulator film 8 was removed by the anisotropic RIE while allowing the first insulator film 7 to remain, so that the insulator film remained in the side wall portion of the mono-crystalline Si growing node by the self-aligning. Then, in order to remove the damaged layer on the Si surface, after etching was carried out using hydrogen fluoride, the substrate was transported into a CVD chamber in vacuum, and the selective epitaxial growth of the mono-crystalline Si growing node 21 was carried out at 750° C. using $SiH_4$ gas having a pressure of 1 mTorr and $AsH_3$ gas having a pressure of 0.1 mTorr, which was added as a donor, to form the mono-crystalline Si layer 6. Then, the first insulator film 7 was used as a stop layer, and planarization was carried out by the CMP method (chemical mechanical polishing method).

Figure 37C:
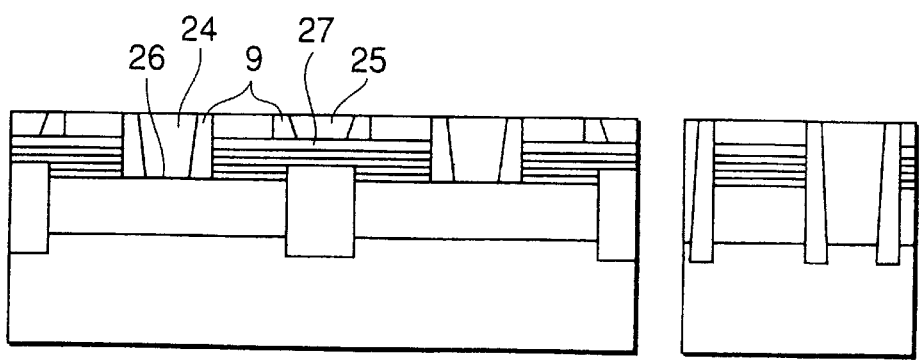

Then, as shown in FIG. 37C, the capacitor was patterned by the photolithography and the plasma etching, such as the RIE method, to form a contact hole 26 in the bottom electrode, and the capacitor was patterned by the photolithography and the plasma etching, such as the RIE method, to form a contact hole 27 in the upper electrode, and to conformally form the insulator film 9. Then, the insulator film 9 was removed by the anisotropic RIE while allowing the first insulator film 7 to remain, so as to allow the insulator film in the sidewall portion to remain. Then, via plugs 24 and 25 of W were buried by the CVD method, and planarization was carried out by the CMP method using the first insulator film 7 as a stopper.

Figure 37D:
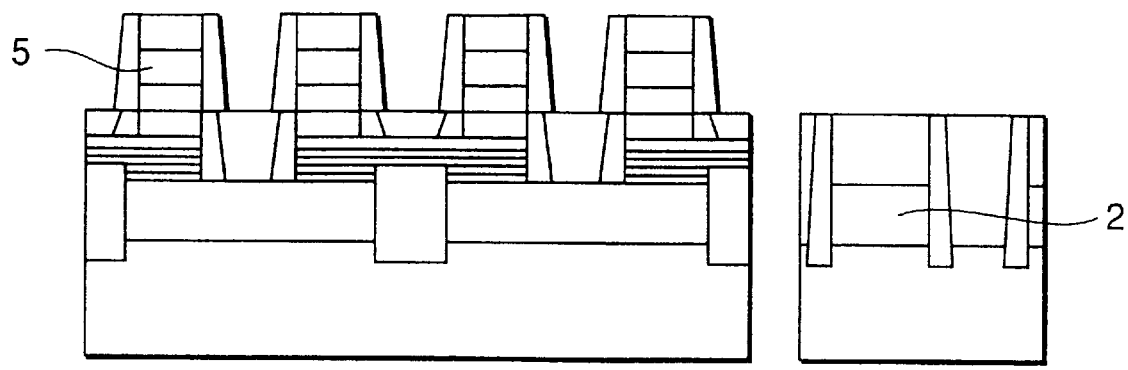

Then, as shown in FIG. 37D, a transistor comprising the impurity diffusion layer 2, a gate oxide film (not shown) and the word line 5 was formed by a publicly known process.

Figure 37E:
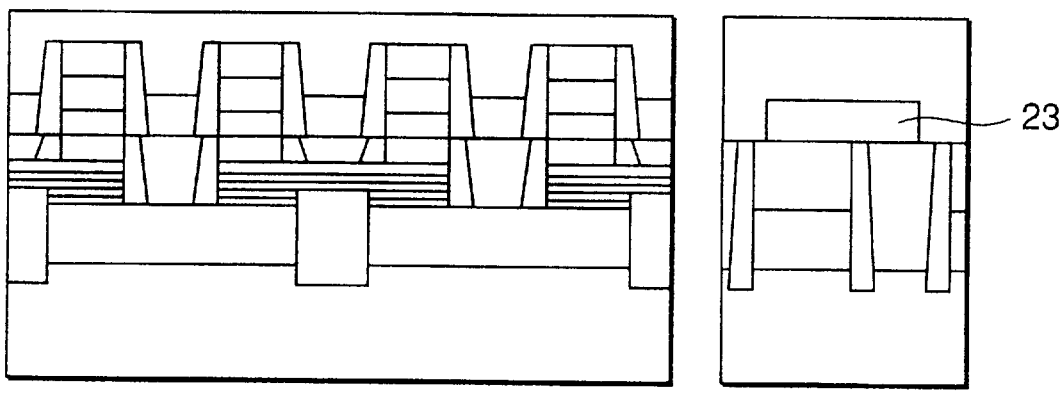
Figure 37E:
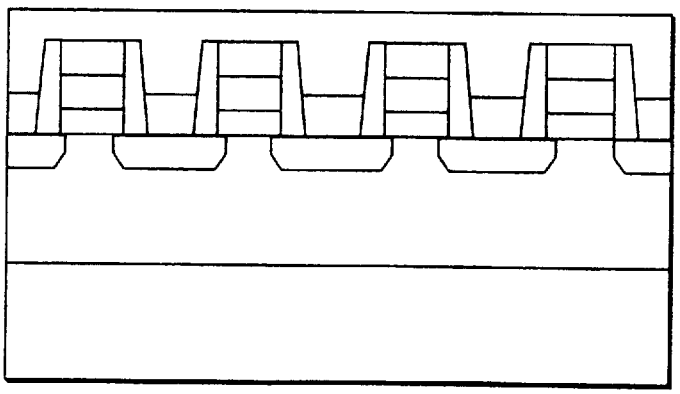

Then, as shown in FIG. 37E, a polycrystalline Si film containing, e.g., N+ type impurity, having a thickness of about 200 nm was deposited, and patterning was carried out using the photolithography and the plasma etching, such as the RIE method, to form the internal wiring 23 for connecting the via plugs 24 and 25 to the main electrode.

By such processes, it was possible to produce a Chain type memory cell which uses a ferroelectric film and which comprises a capacitor and a transistor, and the operation of the memory cell serving as a FRAM was confirmed.

(Eighth Preferred Embodiment)

Referring to the schematic process sectional views of FIGS. 38A through 38E, the eighth preferred embodiment of a semiconductor integrated memory device according to the present invention will be described below. In the drawings, reference number 1 denotes a first impurity type semiconductor substrate, 2 denotes a second impurity type impurity diffusion layer, 3 denotes an element isolating insulator film, 4 denotes a gate oxide film, 5 denotes a word line, 6 denotes a mono-crystalline Si epitaxial growth layer, 7 and 8 denote insulator films, 11 and 15 denote barrier metal layers, 12 denotes a bottom electrode, 13 denotes a dielectric thin-film, 14 denotes a top electrode, denotes a contact plug, 31 denotes a first bonding layer, 32 denotes a second Si (100) substrate, and 33 denotes a bonding layer.

Figure 38A:
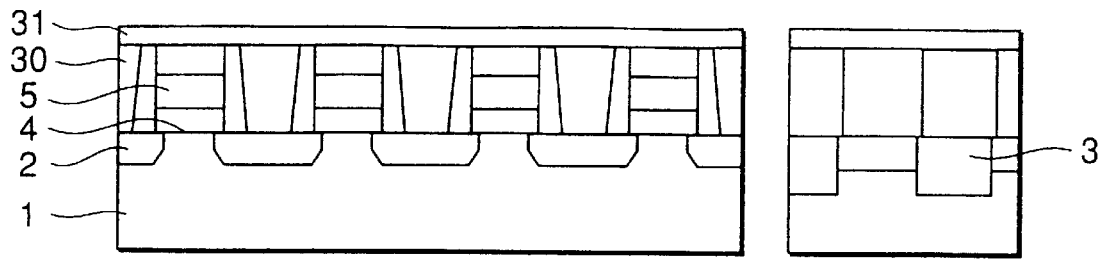
FIGS. 38A through 38E are schematic sectional views showing the eighth preferred embodiment of a process for producing memory cells of a semiconductor integrated memory device according to the present invention.

First, as shown FIG. 38A, a transistor comprising the impurity diffusion layer 2, the gate oxide film 4 and the word line 5, the element isolating insulator film 3, and the contact plug 30 the capacitor were formed on the first Si (100) substrate 1 by a publicly known process, and planarization was carried out by the chemical mechanical polishing (CMP) method or the like.

Figure 38B:
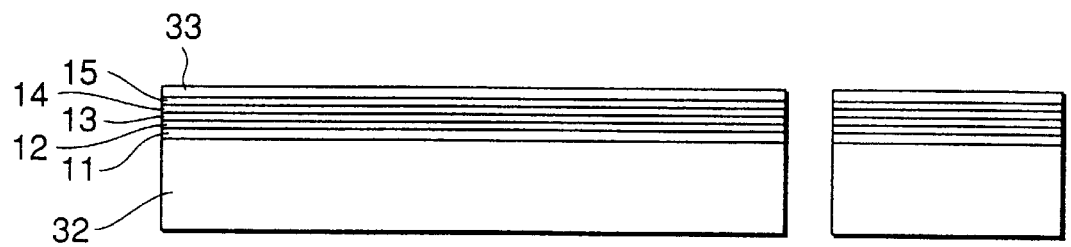

Then, as shown in FIG. 38B, a (Ti, Al) N layer serving as the bottom barrier metal layer 11 and having a thickness of 10 nm, an $SrRuO_3$ layer serving as the bottom electrode 12 and having a thickness of 20 nm, a BSTO thin-film serving as the dielectric film 13 and having a molar fraction of Ba of 70% and a thickness of 20 nm, an $SrRuO_3$ film serving as the top electrode 14 and having a thickness of 20 nm, and a (Ti, Al) N film serving as the top barrier metal layer 15 and having a thickness of 10 nm were sequentially epitaxial-grown on the second Si (100) substrate 32 at a substrate temperature of 600° C. by the RF or DC sputtering method without the exposure to the atmosphere. Then, the second bonding layer 33 of an Al film was formed on the whole surface.

Figure 38C:
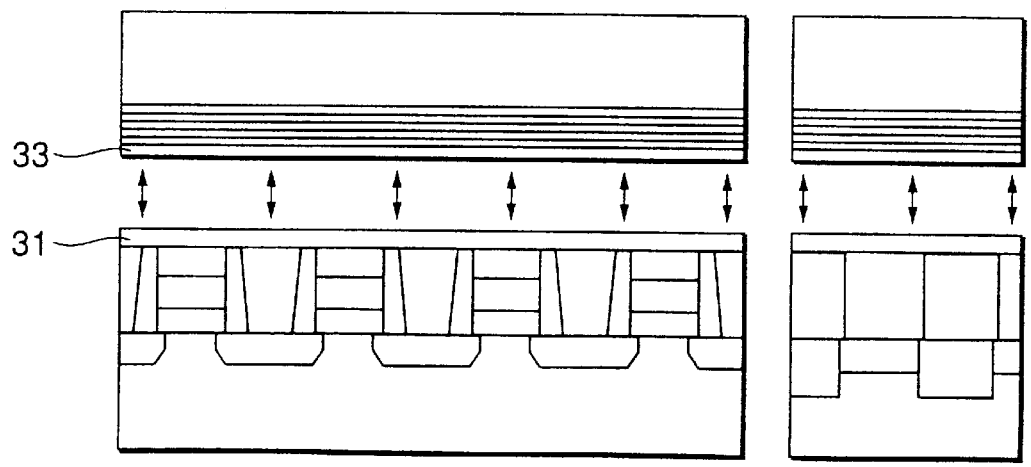

Then, as shown in FIG. 38C, the first and second bonding layers were sputtered with Ar gas in very high vacuum at a degree of vacuum of $3 \times 10^{-8}$ Torr or more to remove an oxide layer, which was produced on the surface, to expose a new surface of Al. In this state, the first and second bonding layers were in contact with each other without the exposure to the atmosphere, to be pressed at 400° C. for 30 minutes to be bonded.

Figure 38D:
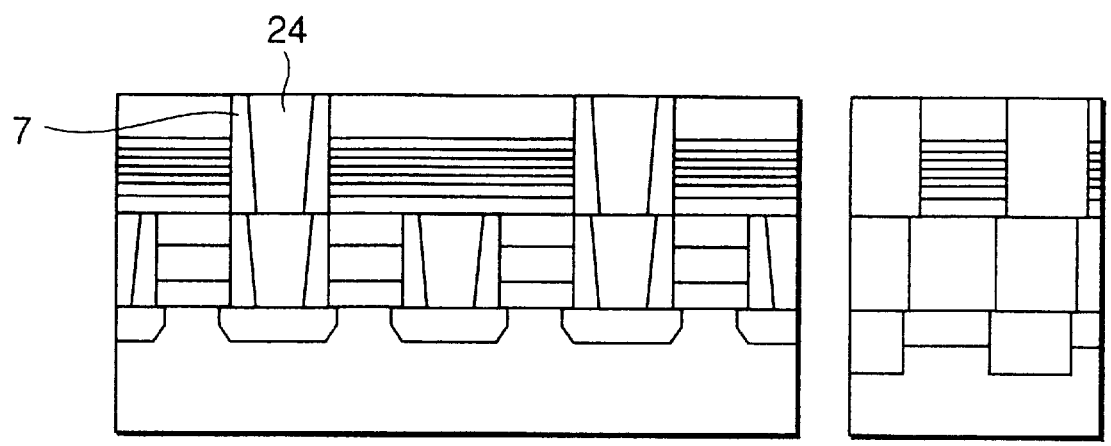

Then, as shown in FIG. 38D, the reverse surface of the bonded second substrate was polished by the CMP or the like to allow the capacitor layer and the Si layer to remain by about 0.2 μm. Thereafter, alignment to the first substrate was carried out, and capacitors were patterned for each memory cell. At this time, an oxide layer may be used as an etching stop layer. Then, the insulator layer 7 was confor-mally formed. Then, the insulator film 7 was removed by the anisotropic RIE to allow a portion of the insulator film on the side wall of the capacitor to remain. Then, a polycrystalline silicon film containing, e.g., N+ type impurity, having a thickness of about 200 nm was buried, and planarization was carried out by the CMP method using the Si layer 32 as a stopper to form a via plug 24.

Figure 38E:
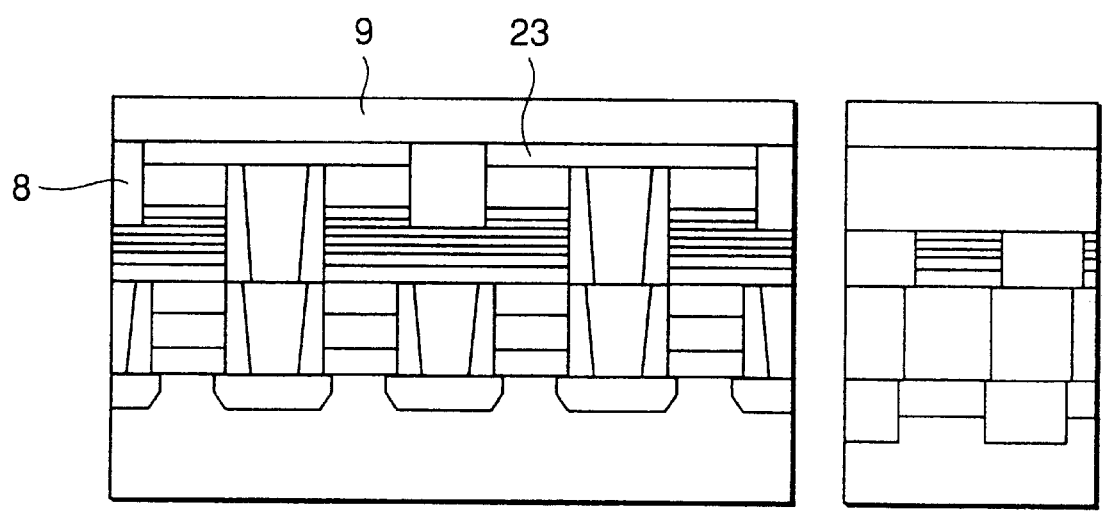

Then, as shown in FIG. 38E, an internal wiring 23 of TiN was formed by the sputtering method. Then, the ferroelectric film 13, the top electrode 14, the barrier metal layer 15 and the internal wiring 23 were patterned by known lithography and RIE methods. Then, the silicon oxide insulator film 8 was buried by the CVD method using TEOS as a raw material gas, and planarization was carried out by the CMP method using the internal wiring 23 as a stopper to form an interlayer insulator film 9.

By such processes, it was possible to produce a memory cell which uses a ferroelectric film and which comprises a capacitor and a transistor, in good yield, and the operation of the memory cell serving as a FRAM was confirmed.

(Ninth Preferred Embodiment)

Figure 39A:
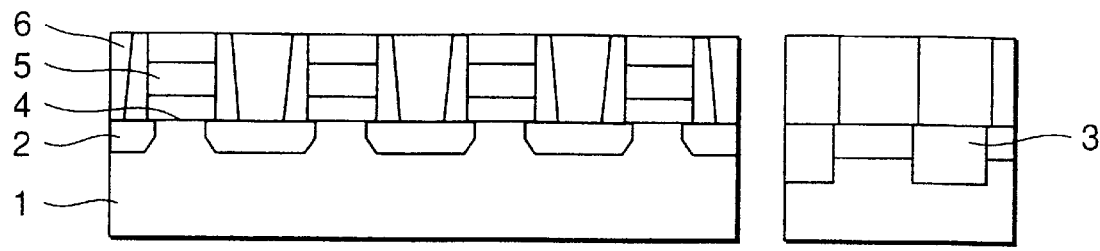
FIGS. 39A through 39C are schematic sectional views showing the ninth preferred embodiment of a process for producing memory cells of a semiconductor integrated memory device according to the present invention.
Figure 39B:
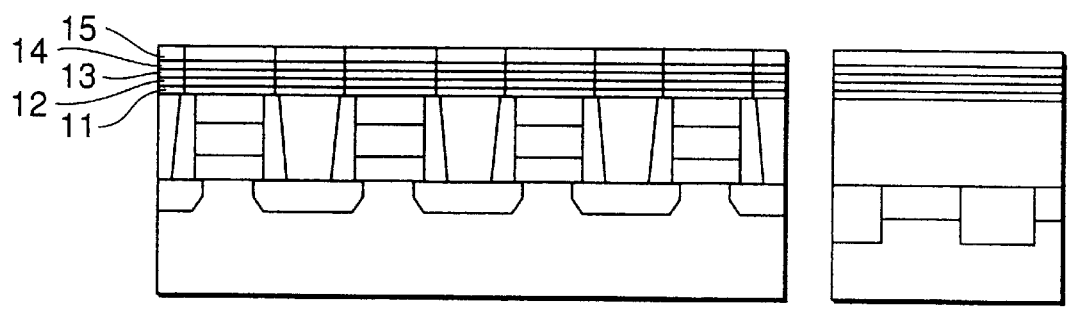
Figure 39C:
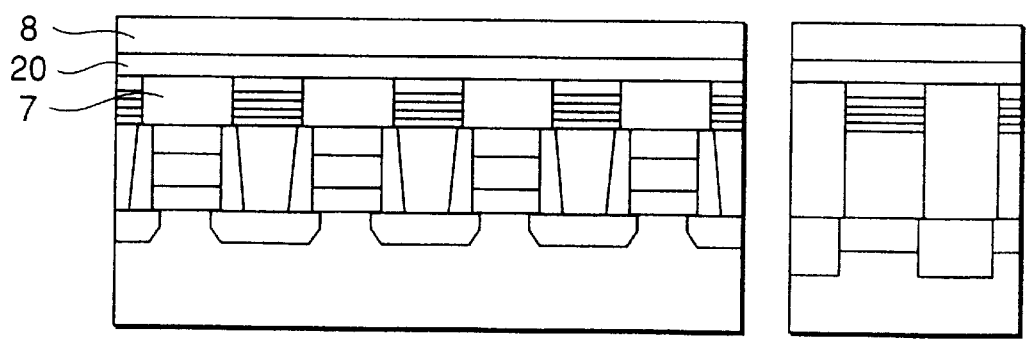

FIGS. 39A through 39C are schematic sectional views showing the ninth preferred embodiment of a process for producing a NAND cell of a semiconductor integrated memory device according to the present invention. In the drawings, reference number 1 denotes a first impurity type semiconductor substrate, 2 denotes a second impurity type impurity diffusion layer, 3 denotes an element isolating insulator film, 4 denotes a gate oxide film, denotes a word line, 6 denotes a mono-crystalline Si epitaxial growth layer, 7, 8 and 9 denote insulator films, 11 and 14 denote barrier metal layers, 12 denotes a bottom electrode, 13 denotes a dielectric thin-film, 14 denotes a top electrode, and 20 denotes a plate electrode.

As shown FIG. 39A, after a transistor part of memory cells was formed by a known process, the selective epitaxial growth of the mono-crystalline Si layer 6 was carried out, and planarization was carried out by the chemical mechanical polishing (CMP) method. At this time, an silicon oxide film was used as the insulator film for the word line 5. In order to remove the damaged layer produced on the surface of the Si substrate by the RIE process, after etching was carried out using hydrogen fluoride vapor, the substrate was transported into a CVD chamber in vacuum, and the selective epitaxial growth was carried out at 750° C. using $SiH_4$ gas having a pressure of 1 mTorr and $AsH_3$ gas having a pressure of 0.1 mTorr, which was added as a donor.

Then, as shown in FIG. 39B, in order to remove the damaged layer produced on the surface of the mono-crystalline Si layer 6 by the CMP process, etching was carried out using hydrogen fluoride, and then, a TiN layer serving as the barrier metal layer 11 was deposited at 600° C. by the reactive sputtering method. Subsequently, a $SrTiO_3$ (which will be hereinafter referred to as "SRO") serving as the bottom electrode 12 was deposited at 600° C. by the sputtering method, and then, the $BaTiO_3$ (which will be hereinafter referred to as "BTO") ferroelectric thin-film 13 was deposited at 600° C. by the sputtering method so as to have a thickness of 40 nm. Subsequently, an $SrTiO_3$ (which will be hereinafter referred to as "SRO") film serving as the top electrode 14 was deposited at 600° C. by the sputtering method. Subsequently, a TiN layer serving as the barrier metal layer 15 was deposited at 600° C. by the reactive sputtering method. At this time, although all of the barrier metal layer 11, the bottom electrode 12, the ferroelectric thin-film 13 and the top electrode 14 were epitaxial-grown as a single crystal on the mono-crystalline Si layer 6, all of them were grown as a polycrystal on the insulator film for the word line 5.

Then, as shown in FIG. 39C, the barrier metal layer 11, the bottom electrode 12, the ferroelectric film 13, the top electrode 14, the barrier metal layer 15 and the mono-crystalline Si layer 6 were patterned by known lithography and RIE methods. At this time, an insulator film was used as a stopper. Then, the silicon oxide insulator film 7 was buried into a patterned hole by the plasma CVD method using TEOS as a material gas, and planarization was carried out by the CMP method using the barrier metal layer 15 as a stopper. Thereafter, a TiN layer serving as the plate electrode 20 was deposited by the sputtering method, and the interlayer insulator film 8 was formed.

After the device was produced by such processes, the orientation of film was measured by the X-ray diffractometer. As a result, it was confirmed that all of the TiN barrier film, the SRO electrode film and the BTO dielectric film were epitaxial-grown in orientation (001). In addition, the lattice constant of the BTO film in a direction of film thickness was 0.434 nm, which increased greatly. In addition, after the dielectric characteristic of the formed ferroelectric thin-film capacitor was measured, the amount of remnant polarization was a great value of 0.42 $C/m^2$, so that it was confirmed that the formed capacitor served as a ferroelectric capacitor.

(Tenth Preferred Embodiment)

FIGS. 40A through 40E are schematic sectional views showing the tenth preferred embodiment of a process for producing a NAND cell of a semiconductor integrated memory device according to the present invention. A paraelectric capacitor was prepared as a memory capacitor. In the drawings, reference number 1 denotes a first impurity type semiconductor substrate, 2 denotes a second impurity type impurity diffusion layer, 5 denotes a word line, 6 denotes a mono-crystalline Si epitaxial growth layer, 7, 8, 9 and 10 denote insulator films, 1 denotes a bottom barrier metal film, 12 denotes a bottom electrode, 13 denotes a dielectric thin-film, 14 denotes a top electrode, 15 denotes a top barrier metal film, 20 denotes a plate electrode, 21 denotes a mono-crystalline Si growing node, 22 denotes a capacitor contact part, and 23 denotes an internal wiring.

Figure 40A:
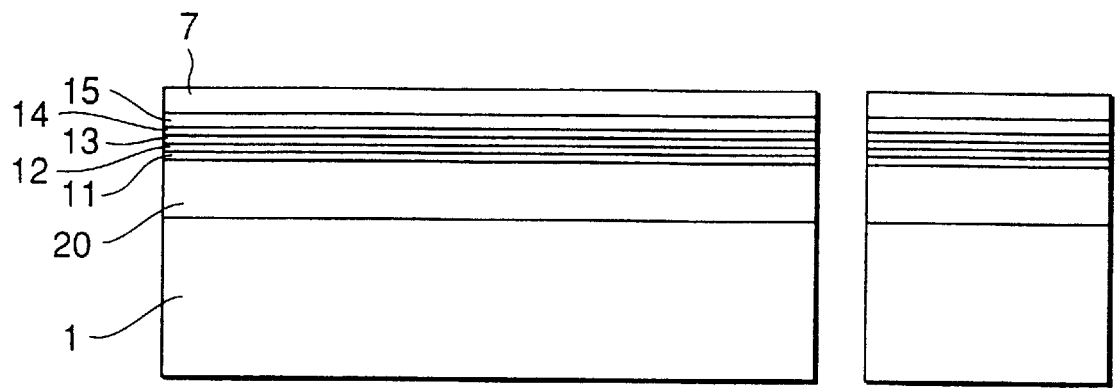
FIGS. 40A through 40F are schematic sectional views showing the tenth preferred embodiment of a process for producing memory cells of a semiconductor integrated memory device according to the present invention.

First, as FIG. 40A, after the plate electrode 20 of a second impurity type impurity diffusion layer having a depth of about 0.1 μm was formed on the surface of the first conductive type Si (100) substrate 1, a (Ti, Al) N layer serving as the bottom barrier metal layer 11 and having a thickness of 10 nm, an SRO layer serving as the bottom electrode 12 and having a thickness of 20 nm, a $(Ba_{0.2}Sr_{0.8})TiO_3$ thin-film serving as the dielectric film 13 and having a thickness of 20 nm, an SRO film serving as the top electrode 14 and having a thickness of 20 nm, and a (Ti, Al) N film serving as the top barrier metal layer 15 and having a thickness of 10 nm were sequentially epitaxial-grown by the RF or DC sputtering method at a substrate temperature of 600° C. without the exposure to the atmosphere. Then, the first insulator film 7 was deposited by the plasma CVD method or the like using TEOS gas as a raw material.

Figure 40B:
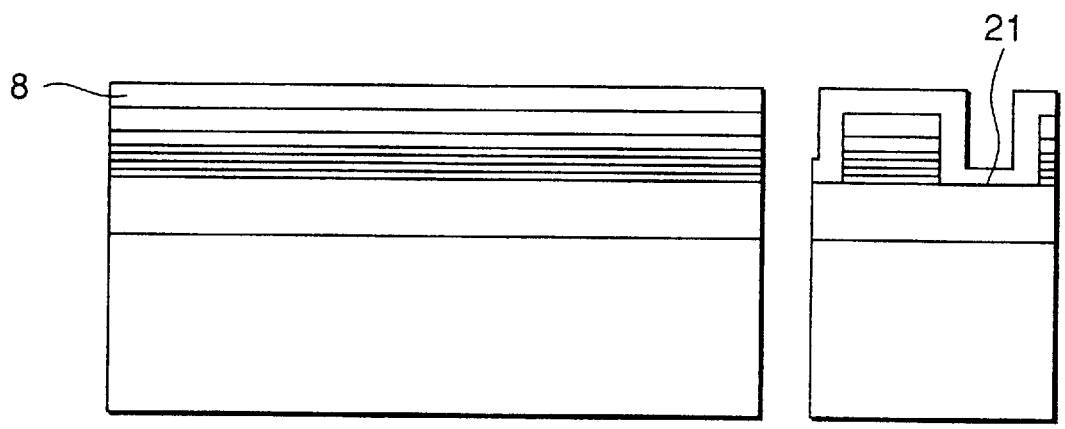

Then, as shown in FIG. 40B, the mono-crystalline Si growing node 21 was formed by the lithography and the etching, such as RIE. Then, the second insulator film 8 was conformally formed.

Figure 40C:
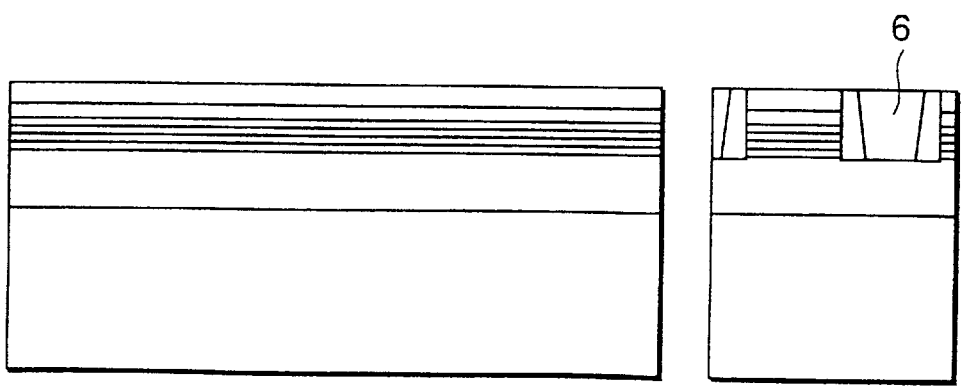

Then, as shown in FIG. 40C, the second insulator film 8 was removed by the anisotropic RIE while allowing the first insulator film 7 to remain, so that the insulator film remained in the side wall portion of the mono-crystalline Si growing node by the self-aligning. Then, in order to remove the damaged layer on the Si surface, after etching was carried out using hydrogen fluoride, the substrate was transported into a CVD chamber in vacuum, and the selective epitaxial growth of the mono-crystalline Si growing node 11 was carried out at 750° C. using $SiH_4$ gas having a pressure of 1 mTorr and $AsH_3$ gas having a pressure of 0.1 mTorr, which was added as a donor, to form the mono-crystalline Si layer 6. Then, planarization was carried out by the CMP method (chemical mechanical polishing method) using the insulator film as a stop layer.

Figure 40D:
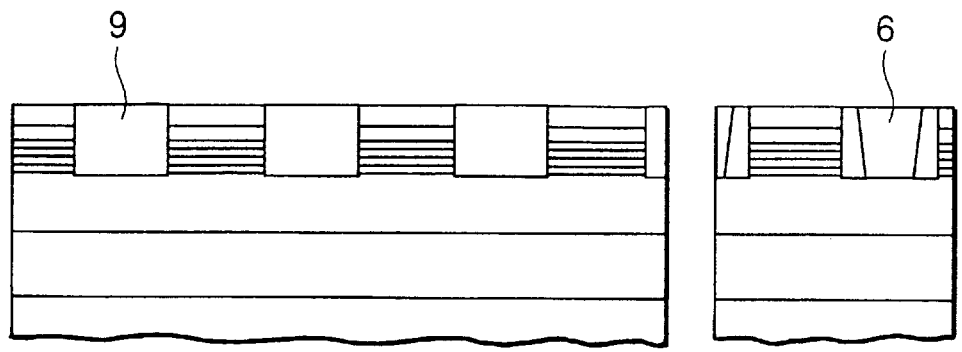

Then, as shown in FIG. 40D, a transistor comprising the impurity diffusion layer 2, a gate oxide film (not shown) and the word line 5 was formed by a publicly known process.

Figure 40E:
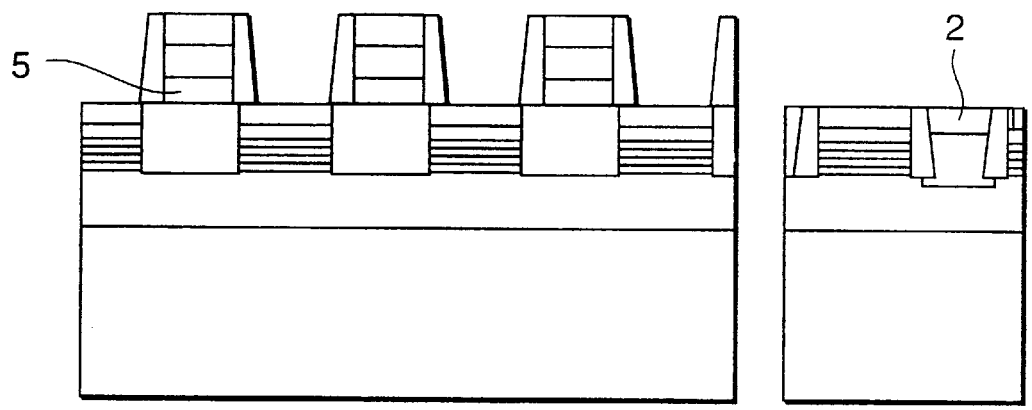
Figure 40F:
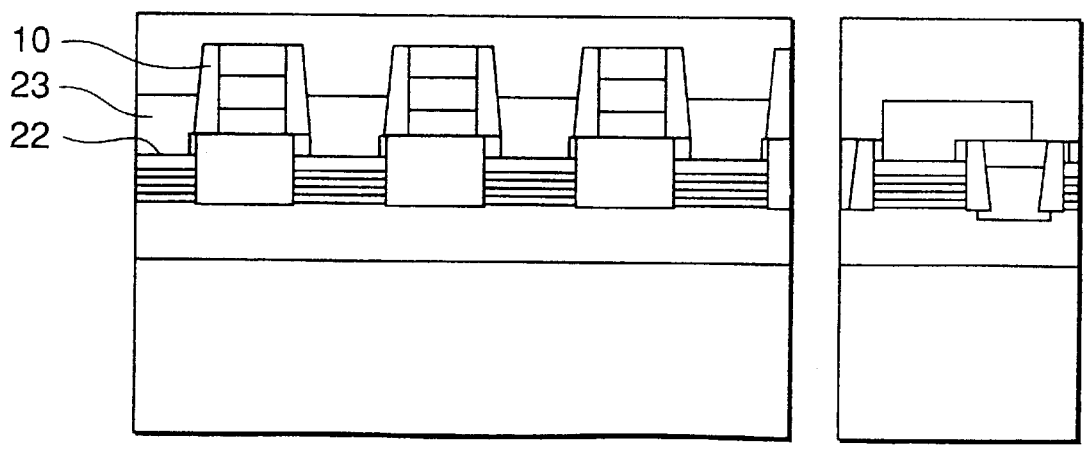

Then, as shown in FIG. 40E, the capacitor contact part 22 was formed by the photolithography method and the plasma etching, such as the RIE method. As an etching condition at this time, the top barrier metal layer 15 or the top electrode 14 may be used as a stopper to selectively stop the etching. Then, a polycrystalline Si film containing, e.g., $N^+$ type impurity, having a thickness of about 200 nm was deposited on the whole surface, and etching was carried out on the whole surface by the CMP and RIE methods, to form the internal wiring 23 for connecting the contact part 22 to the main electrode. Moreover, the interlayer insulator film 10 was formed.

By such processes, it was possible to produce a NAND type memory cell which uses a ferroelectric film and which comprises a capacitor and a transistor, and the operation of the memory cell serving as a NAND type DRAM was confirmed.

(Eleventh Preferred Embodiment)

Referring to the schematic process sectional views of FIGS. 41A through 41E, the eleventh preferred embodiment of a semiconductor integrated memory device according to the present invention will be described below. In the drawings, reference number 1 denotes a first impurity type semiconductor substrate, 2 denotes a second impurity type impurity diffusion layer, 3 denotes an element isolating insulator film, 4 denotes a gate oxide film, 5 denotes a word line, 6 denotes a mono-crystalline Si epitaxial growth layer, 7 and 8 denote insulator films, 11 and 14 denote barrier metal layers, 12 denotes a bottom electrode, 13 denotes a dielectric thin-film, 14 denotes a top electrode, denotes a plate electrode, 30 denotes a contact plug, 31 denotes a first bonding layer, 32 denotes a second Si (100) substrate, and 33 denotes a second bonding layer.

Figure 41A:
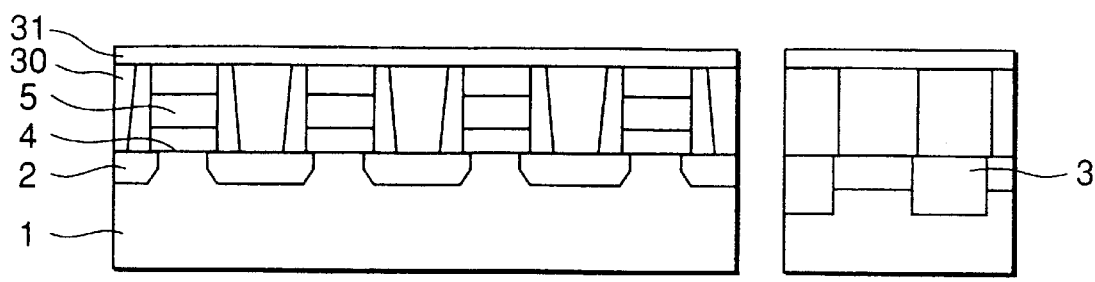
FIGS. 41A through 41E are schematic sectional views showing the eleventh preferred embodiment of a process for producing memory cells of a semiconductor integrated memory device according to the present invention.

First, as shown FIG. 41A, a transistor comprising the impurity diffusion layer 2, the gate oxide film 4 and the word line 5, the element isolating insulator film 3, and the contact hole 30 the capacitor were formed on the first Si (100) substrate 1 by a publicly known process, and planarization was carried out by the chemical mechanical polishing (CMP) method or the like. Then, the first bonding film of an Al film was formed on the whole surface.

Figure 41B:
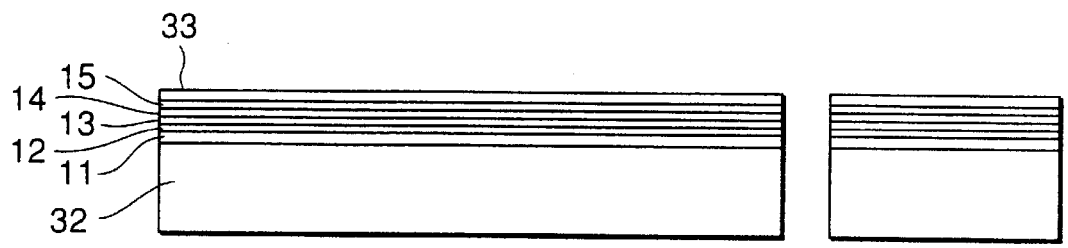

Then, as shown in FIG. 41B, an (Ti, Al) N layer serving as the bottom barrier metal layer 11 and having a thickness of 10 nm, an $SrRuO_3$ layer serving as the bottom electrode 12 and having a thickness of 20 nm, a BSTO thin-film serving as the dielectric film 13 and having a molar fraction of Ba of 70% and a thickness of 20 nm, an $SrRuO_3$ film serving as the top electrode 14 and having a thickness of 20 nm, and an (Ti, Al) N film serving as the top barrier metal layer 15 and having a thickness of 10 nm were sequentially epitaxial-grown on the second Si (100) substrate 32 at a substrate temperature of 600° C. by the RF or DC sputtering method without the exposure to the atmosphere. Then, the second bonding layer 33 of an Al film was formed on the whole surface.

Figure 41C:
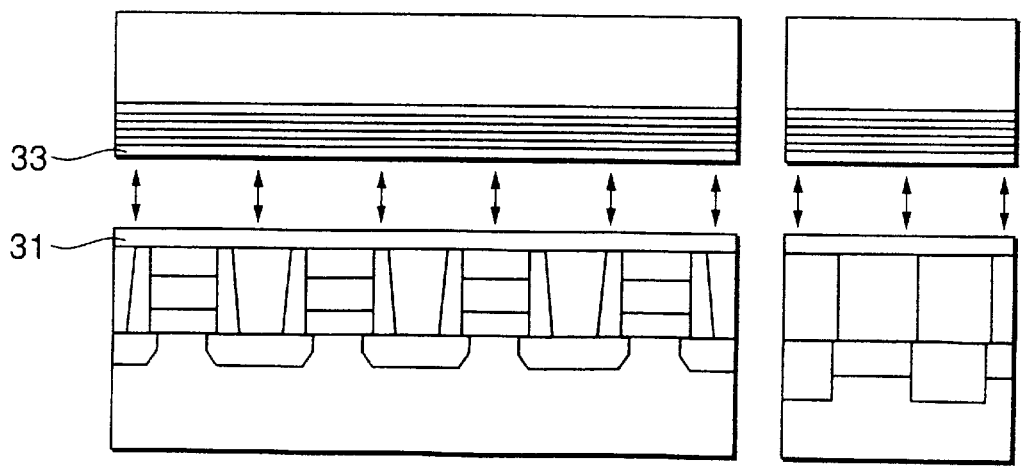

Then, as shown in FIG. 41C, the first and second bonding layers were sputtered with Ar gas in very high vacuum at a degree of vacuum of $3 \times 10^{-8}$ Torr or more to remove an oxide layer, which was produced on the surface, to expose a new surface of Al. In this state, the first and second bonding layers were in contact with each other without the exposure to the atmosphere, to be pressed at 400° C. for 30 minutes to be bonded.

Figure 41D:
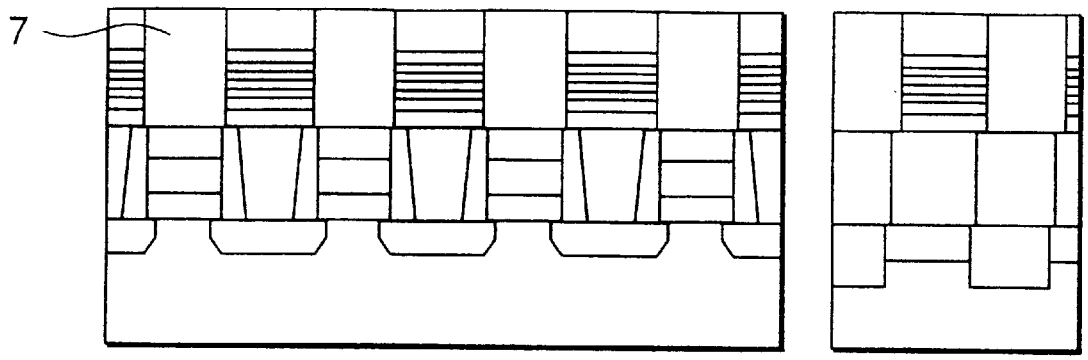

Then, as shown in FIG. 41D, the reverse surface of the bonded second substrate was polished by the CMP or the like to allow the capacitor layer and the Si layer to remain by about 0.2 $\mu$m. Thereafter, alignment to the first substrate was carried out, and capacitors were patterned for each memory cell. As an etching condition at this time, an oxide layer may be used as an etching stop layer. Then, after the insulator layer 7 was buried by the plasma CVD using TEOS gas as a raw material, planarization was carried out by the CMP method or the like again.

Figure 41E:
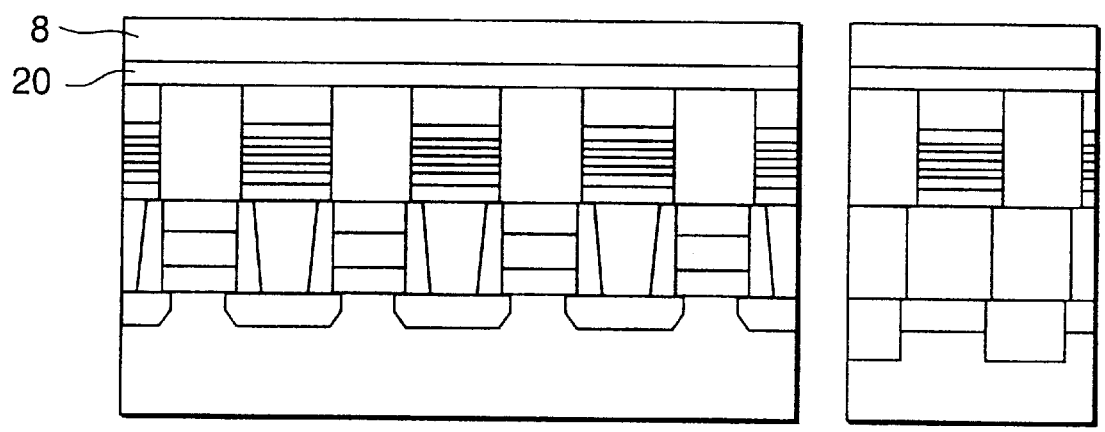

Then, as shown in FIG. 41E, a Ti/TiN/Al layer serving as the plate electrode 20 was formed and covered with the insulator layer 8.

By such processes, it was possible to produce a memory cell which uses a ferroelectric film and which comprises a capacitor and a transistor, in good yield, and the operation of the memory cell serving as a FRAM was confirmed.

(Twelfth Preferred Embodiment)

FIGS. 42A through 42D are schematic sectional views showing the twelfth preferred embodiment of a process for producing a NAND cell of a semiconductor integrated memory device according to the present invention. In the drawings, reference number 1 denotes a first impurity type semiconductor substrate, 2 denotes a second impurity type impurity diffusion layer, 3 denotes an element isolating insulator film, 4 denotes a gate oxide film, denotes a word line, 6 denotes a mono-crystalline Si layer, 7, 8 and 9 denote insulator films, 11 denotes a first barrier metal layer, 12 denotes a first electrode, 13 denotes a dielectric thin-film, 14 denotes a second electrode, 15 denotes a second barrier metal layer, 20 denotes a plate electrode, 30 denotes a contact plug, 31 denotes a first bonding layer, 32 denotes a second Si (100) substrate, and 33 denotes a second bonding layer.

Figure 42A:
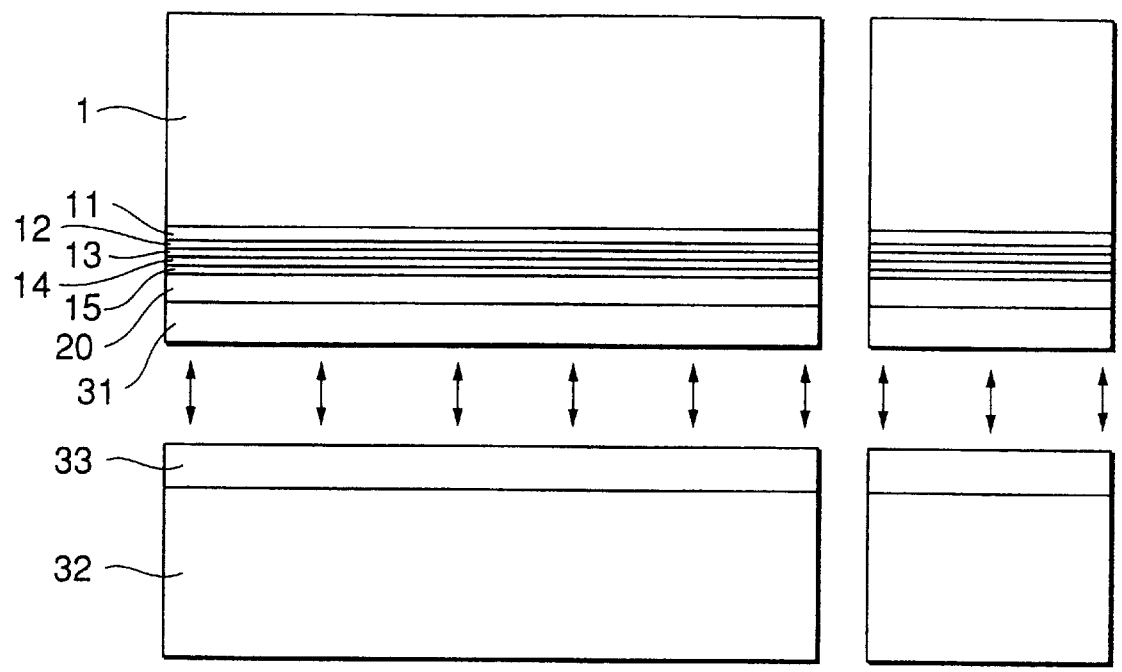
FIGS. 42A through 42D are schematic sectional views showing the twelfth preferred embodiment of a process for producing memory cells of a semiconductor integrated memory device according to the present invention.

First, as shown FIG. 42A, a (Ti, Al) N layer serving as the first barrier metal layer 11 and having a thickness of 10 nm, an SRO layer serving as the first electrode 12 and having a thickness of 20 nm, a BSTO thin-film serving as the ferroelectric film 13 and having a molar fraction of Ba of 70% and a thickness of 20 nm, an SRO film serving as the second electrode 14 and having a thickness of 20 nm, and a TiN film serving as the second barrier metal layer 15 and having a thickness of 10 nm were epitaxial-grown on the first impurity type Si (100) substrate 1 at a substrate temperature of 600° C. by the RF or DC sputtering method. Moreover, a TiN film serving as the plate electrode 20 and having a thickness of 200 nm was formed at room temperature. Then, after a BPSG serving as the first bonding insulator film 31 and having a thickness of, e.g., 500 nm, was deposited, planarization was carried out by, e.g., the CMP method.

Then, the second Si substrate 32 was prepared, and a BPSG layer serving as the second bonding layer 33 was formed thereon to be flattened. Then, the first bonding insulator film 31 was in contact with and the second bonding layer 33 to be bonded thereto by a publicly known method, e.g., the heat treatment at about 900° C.

Figure 42B:
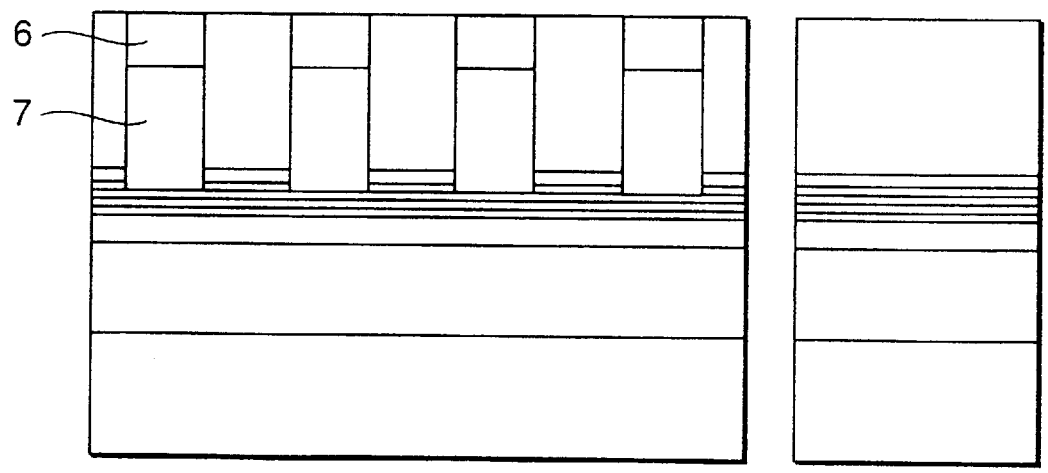

Then, as shown in FIG. 42B, the second surface of the first Si substrate 1 was polished. Further explanation with the figures is omitted. Then, a polishing stop layer or the like was utilized around a cell region to form a thin-film silicon layer having a thickness of, e.g., 10 nm. Alternatively, the SOI forming method using bonding, such as the smart cut, and polishing may be used.

Then, an element isolating groove was formed by the usual photolithography method and the plasma etching, such as the RIE method. As an etching condition at this time, the etching may be selectively stopped using the dielectric film 13 of the capacitor as a stopper. Then, the buried insulator film 7 was deposited, and planarization was carried out by the CMP. Moreover, after the buried insulator film 7 was selectively slightly etched by the RIE or the like, the second impurity type mono-crystalline silicon layer 6 was formed, and planarization was carried out again. In this case, the methods for forming the mono-crystalline silicon layer include a method for conformally forming an amorphous silicon layer to crystallize the amorphous silicon layer from the wide wall portion by the heat treatment, such as the RTP, to form a single crystal, and a method for selectively burying a mono-crystalline silicon by the selective growth CVD method or the like.

Figure 42C:
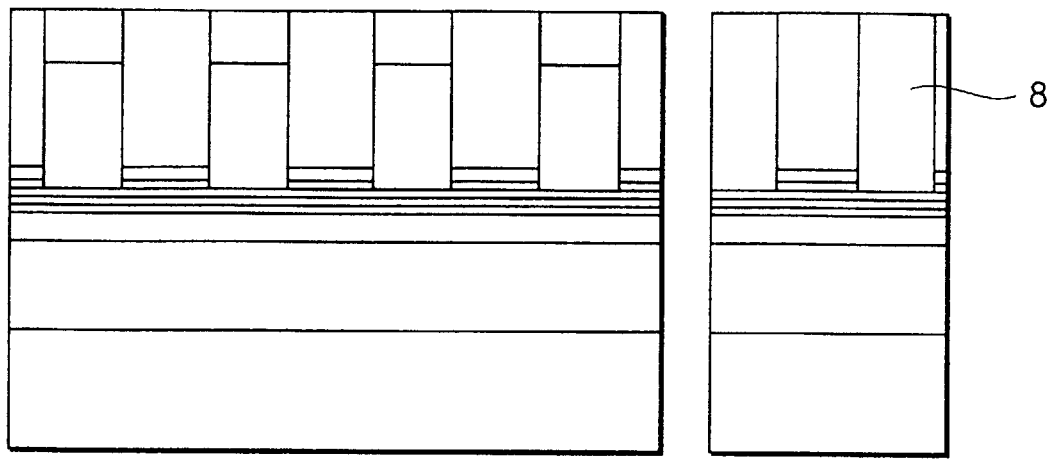

Then, as shown in FIG. 42C, an element isolating groove was formed by the lithography and the etching, such as the RIE. At this time, the dielectric layer 5 of the capacitor may be used as an etching stop layer. Then, the buried insulator film 8 was deposited, and planarization was carried out by the CMP or the like.

Figure 42D:
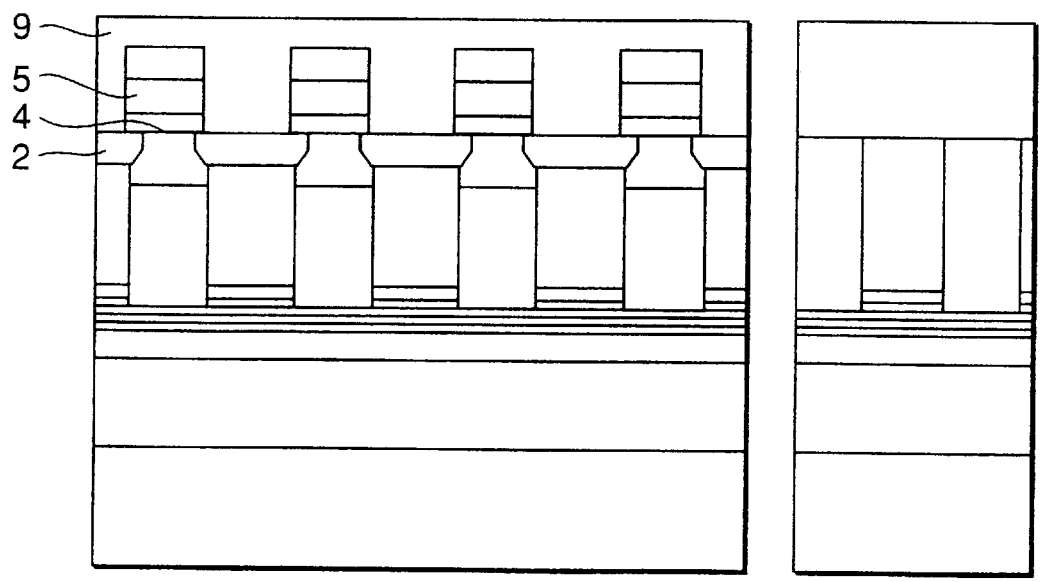

Then, as shown in FIG. 42D, a transistor comprising the second impurity type impurity diffusion layer 2, the gate oxide film 4 and the word line 5, and the interlayer insulator film 9 were formed.

By such processes, it was possible to produce a memory cell which uses a ferroelectric film and which comprises a capacitor and a transistor, in good yield, and the operation of the memory cell serving as an FRAM was confirmed.

(Other Preferred Embodiments)

While the present invention has been disclosed in terms of the first preferred embodiments, it should not be understood that the present invention should be limited to the descriptions and drawings serving as a part of the disclosure. From the disclosure, it should be appreciated by those skilled in the art that the invention can be embodied in various ways.

While the nMOSFET has been formed in the p-well in the first through third preferred embodiments, the nMOSFET may be formed in a p substrate. In place of the nMOSFET, a pMOSFET may be used. When the pMOSFET is used, the polarity may be suitably inverted in the read/write sequence shown in FIGS. 18, 22 or 26.

In addition, the first through third preferred embodiments of a semiconductor integrated memory device according to the present invention may be formed on an SOI substrate.

Moreover, while the bit line has not been shown in FIG. 27B since it has not been exposed to the cross section taken along line B–B', a plan layout, wherein a bit line is exposed to the cross section taken along line B–B', may be adopted. on the other hand, a plane layout, wherein a bit line is not exposed to the cross section in FIGS. 19B and 23B, may be adopted.

Thus, the present invention should be understood to include various embodiments, which are not described herein. Therefore, the present invention should be limited only to the invention as set forth in the appended claims appropriate for the disclosure.

As described above, according to the present invention, it is possible to provide a semiconductor integrated memory device which is scaleable by the minimum dimension f and which has small memory cells.

In particular, according to the present invention, it is possible to provide a semiconductor integrated memory device which can stably retain a ferroelectric polarization and which is very highly integrated.

In addition, according to the present invention, it is possible to provide a semiconductor integrated memory device which can be easily produced by a simple producing process and which is very highly integrated.

Therefore, the present invention is very valuable for industrial use.

What is claimed is:

1. A semiconductor integrated memory device comprising a plurality of memory cells, which are arranged in the form of a matrix and each of which comprises:

a memory capacitor having at least a first electrode, a second electrode facing said first electrode, and a ferroelectric thin-film sandwiched between said first and second electrodes;

a reference capacitor having at least a third electrode connected to said first electrode, a fourth electrode facing said third electrode, and a dielectric thin-film sandwiched between said third and fourth electrodes;

a read transistor having a gate electrode connected to said first and third electrodes; and a control transistor for adjusting potentials of storage node which is a connection point of said first electrode of said memory capacitor, said third electrode of said reference capacitor and said gate electrode of said read transistor.

2. A semiconductor integrated memory device as set forth in claim 1, wherein said control transistor is connected to between said first and second electrodes of said memory capacitor.

3. A semiconductor integrated memory device as set forth in claim 2, wherein said control transistor is connected to between said third and fourth electrodes of said reference capacitor.

4. A semiconductor integrated memory device as set forth in claim 1, wherein said control transistor is connected to between said third and fourth electrodes of said reference capacitor.

5. A semiconductor integrated memory device as set forth in claim 1, the amount of charges, which include a polarization inverting component obtained when a voltage corresponding to a read voltage is applied to said reference capacitor, is greater than or equal to one-fourth and less than or equal to four times as large as the amount of charges, which include a polarization inverting component obtained when a voltage corresponding to the read voltage is applied to said memory capacitor.

6. A semiconductor integrated memory device comprising a plurality of memory cell blocks, which are arranged in the form of a matrix and each of which comprises:

a memory cell column having a plurality of memory cells connected in series, each memory cell comprising a memory capacitor, which has at least a first electrode, a second electrode facing said first electrode, and a ferroelectric thin-film sandwiched between said first and second electrodes, and a control transistor connected to between said first and second electrodes;

a reference capacitor having at least a third electrode, which electrically connected to said first electrode of said memory capacitor arranged at one end of said memory cell column, a fourth electrode facing said third electrode, and a dielectric thin-film sandwiched between said third and fourth electrodes; and a read transistor having a gate electrode electrically connected to said first and third electrodes.

7. A semiconductor integrated memory device as set forth in claim 6, wherein said control transistor connected to between said first and second electrodes of said memory cell serves as a first control transistor, and which further comprises a second control transistor provided between said third and fourth electrodes of said reference capacitor.

8. A semiconductor integrated memory device as set forth in claim 6, the amount of charges, which include a polarization inverting component obtained when a voltage corresponding to a read voltage is applied to said reference capacitor, is greater than or equal to one-fourth and less than or equal to four times as large as the amount of charges, which include a polarization inverting component obtained when a voltage corresponding to the read voltage is applied to said memory capacitor.

9. A semiconductor integrated memory device as set forth in claim 6, wherein said dielectric thin-film of said reference capacitor is a paraelectric thin-film.

10. A semiconductor integrated memory device as set forth in claim 6, wherein said dielectric thin-film of said reference capacitor is a ferroelectric thin-film.

11. A semiconductor integrated memory device comprising a plurality of memory cell blocks, which are arranged in the form of a matrix and each of which comprises:

a NAND type memory cell column comprising a plurality of selecting MOS transistors connected in series, and a plurality of memory capacitors of dielectric films, each of which is sandwiched between a storage electrode connected to a common main electrode of each of said selecting MOS transistors, and a plate electrode facing said storage electrode;

a reference capacitor electrically connected to a main electrode of said selecting transistor arranged at one end of said memory cell column; and a read transistor having a gate electrode electrically connected to a connection part between a main electrode of said selecting MOS transistor and a main electrode of said reference capacitor.

12. A semiconductor integrated memory device as set forth in claim 11, further comprising a control transistor for adjusting potentials of storage nodes, which are all of connection points between said first electrode of said memory capacitor, said third electrode of said reference capacitor and said read transistor.

13. A semiconductor integrated memory device as set forth in claim 11, the amount of charges, which include a polarization inverting component obtained when a voltage corresponding to a read voltage is applied to said reference capacitor, is greater than or equal to one-fourth and less than or equal to four times as large as the amount of charges, which include a polarization inverting component obtained when a voltage corresponding to the read voltage is applied to said memory capacitor.

14. A semiconductor integrated memory device as set forth in claim 11, wherein said dielectric film of said memory capacitor is a ferroelectric film.

15. A semiconductor integrated memory device as set forth in claim 11, wherein said dielectric film of said memory capacitor is a paraelectric film, which is a non-linear capacitor that the maximum capacity value of said memory capacitor within an operating voltage range is greater than or equal to twice as large as the minimum capacity value thereof.

16. A semiconductor integrated memory device as set forth in claim 11, wherein said dielectric film of said reference capacitor is a ferroelectric film.

17. A semiconductor integrated memory device as set forth in claim 11, wherein said dielectric film of said reference capacitor is a paraelectric film.

* * * * *